United States Patent
Han et al.

(10) Patent No.: US 12,525,194 B2
(45) Date of Patent: Jan. 13, 2026

(54) GATE DRIVING CIRCUIT, DISPLAY PANEL, AND DISPLAY DEVICE INCLUDING THE SAME

(71) Applicant: LG DISPLAY CO., LTD., Seoul (KR)

(72) Inventors: Ingu Han, Paju-si (KR); SooHong Choi, Paju-si (KR); HongJae Shin, Paju-si (KR)

(73) Assignee: LG Display Co., Ltd (KR)

( * ) Notice: Subject to any disclaimer, the term of this patent is extended or adjusted under 35 U.S.C. 154(b) by 0 days.

(21) Appl. No.: 18/433,784

(22) Filed: Feb. 6, 2024

(65) Prior Publication Data

US 2024/0290276 A1 Aug. 29, 2024

(30) Foreign Application Priority Data

Feb. 28, 2023 (KR) .......................... 10-2023-0027330

(51) Int. Cl.

| | |
|---|---|
| *G06F 3/038* | (2013.01) |
| *G09G 3/3233* | (2016.01) |
| *G09G 3/3266* | (2016.01) |
| *H10K 59/126* | (2023.01) |
| *H10K 59/131* | (2023.01) |
| *H10K 59/80* | (2023.01) |

(52) U.S. Cl.
CPC ......... *G09G 3/3266* (2013.01); *G09G 3/3233* (2013.01); *H10K 59/126* (2023.02); *H10K 59/131* (2023.02); *H10K 59/873* (2023.02); *G09G 2300/0408* (2013.01); *G09G 2300/0842* (2013.01)

(58) Field of Classification Search
CPC ............... G09G 3/3266; H10K 59/131; H10K 59/873; H10K 59/126
USPC ........................................................ 345/205
See application file for complete search history.

(56) References Cited

U.S. PATENT DOCUMENTS

| | | | |
|---|---|---|---|
| 2019/0165079 A1* | 5/2019 | Cho ...................... | H10K 59/131 |
| 2020/0343326 A1* | 10/2020 | Park ...................... | H10D 89/931 |
| 2021/0217835 A1* | 7/2021 | Park ...................... | H10K 50/844 |
| 2022/0013509 A1* | 1/2022 | Lee ...................... | H10D 86/441 |
| 2022/0236825 A1* | 7/2022 | Lee ...................... | H10K 59/873 |
| 2022/0335899 A1* | 10/2022 | Park ...................... | G09G 3/3291 |

(Continued)

*Primary Examiner* — Jonathan M Blancha
(74) *Attorney, Agent, or Firm* — Fish & Richardson P.C.

(57) ABSTRACT

A display panel and a display device which may remove load deviation between clock signal lines. More specifically, the display device includes a substrate including a display area capable of displaying an image and a non-display area disposed around the display area, the display area including a subpixel and a gate line for driving the subpixel; a gate driving panel circuit disposed in the non-display area and configured to output a gate signal to the gate line; a plurality of clock signal lines disposed in the non-display area and positioned to be farther from the display area than the gate driving panel circuit to supply a plurality of clock signals to the gate driving panel circuit; an overcoat layer disposed on the plurality of clock signal lines and the gate driving panel circuit; and a light emitting element included in the subpixel, comprising a cathode electrode disposed on the overcoat layer and extending from the display area to the non-display area, wherein the cathode electrode is disposed not to overlap the plurality of clock signal lines.

25 Claims, 29 Drawing Sheets

(56) References Cited

U.S. PATENT DOCUMENTS

2022/0336568 A1\* 10/2022 Jin ...................... H10K 59/131
2023/0112543 A1\* 4/2023 Okabe ...................... G09F 9/00
                                                            257/72

\* cited by examiner

GATE DRIVING CIRCUIT, DISPLAY PANEL, AND DISPLAY DEVICE INCLUDING THE SAME

CROSS-REFERENCE TO RELATED APPLICATION

This application claims the priority of Korean Patent Application No. 10-2023-0027330, filed on Feb. 28, 2023, which is hereby incorporated by reference in its entirety.

BACKGROUND

Field of the Disclosure

The present disclosure relates to a display device and a display panel.

Description of the Background

A display device may include a display panel where a plurality of data lines and a plurality of gate lines are disposed, a data driving circuit outputting data signals to the plurality of data lines, and a gate driving circuit outputting gate signals to the plurality of gate lines.

To normally display an image on the display device, gate signals for driving a plurality of gate lines need to be normally supplied. In other words, normal image implementation absolutely requires normal gate driving. However, failure in normal gate driving may result in image quality degradation. For example, some of a plurality of signal lines related to the gate driving operation may overlap a metal layer, e.g., a portion of a cathode electrode of a light emitting element when the gate driving circuit is disposed in a display panel, and the others may not overlap the metal layer. Accordingly, capacitance deviation may occur between the plurality of signal lines. Thus, load deviation may occur between the plurality of signal lines during the gate driving operation, and an image abnormality may occur due to the load deviation between the plurality of signal lines.

SUMMARY

Accordingly, the present disclosure is directed to a display device and a display panel that substantially obviate one or more of problems due to limitations and disadvantages described above.

More specifically, the present disclosure is to provide a display device in which a gate driving circuit is disposed in a display panel in a gate in panel (GIP) type.

The present disclosure is also to provide a display panel that does not cause a screen abnormality although a gate driving circuit is embedded therein and a display device including the display panel.

The present disclosure is also to provide a display panel capable of normal operation of a gate driving circuit although the gate driving circuit is embedded therein and a display device including the display panel.

The present disclosure is also to provide a display panel capable of reducing or removing load deviation between clock signal lines related to the gate driving operation and a display device including the display panel.

The present disclosure is also to provide a display panel having a line structure for stably supplying various signals or power to the gate driving circuit and a display device including the display panel.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes a substrate including a display area capable of displaying an image and a non-display area disposed around the display area, the display area including a subpixel and a gate line for driving the subpixel, a gate driving panel circuit disposed on the substrate, positioned in the non-display area, and configured to output a gate signal to the gate line, a plurality of clock signal lines disposed on the substrate, positioned to be farther from the display area than the gate driving panel circuit in the non-display area to supply a plurality of clock signals to the gate driving panel circuit, an overcoat layer disposed on the plurality of clock signal lines and the gate driving panel circuit, and a light emitting element included in the subpixel, comprising a cathode electrode disposed on the overcoat layer and extending from the display area to the non-display area.

In the display device according to aspects of the disclosure, a portion of the cathode electrode, extending to the non-display area, does not overlap the plurality of clock signal lines.

In the display device according to aspects of the disclosure, a portion of the cathode electrode extending from the display area to the non-display area may overlap at least a portion of the gate driving panel circuit.

In another aspect of the present disclosure, a display panel includes a substrate including a display area capable of displaying an image and a non-display area disposed around the display area, the display area including a subpixel and a gate line for driving the subpixel, a gate driving panel circuit disposed on the substrate, positioned in the non-display area, and configured to output a gate signal to the gate line, a plurality of first signal lines disposed in the non-display area, positioned to be farther from the display area than the gate driving panel circuit in the non-display area to supply a plurality of first signals to the gate driving panel circuit, at least one second signal line disposed in the non-display area and positioned to be closer to the display area than the gate driving panel circuit in the non-display area to supply a plurality of second signals to the gate driving panel circuit, an overcoat layer disposed on the plurality of first signal lines, the gate driving panel circuit, and the at least one second signal line, and a light emitting element included in the subpixel, comprising a cathode electrode disposed on the overcoat layer and extending from the display area to the non-display area.

In the display panel according to various aspects of the disclosure, a portion of the cathode electrode, extending to the non-display area, overlaps at least one second signal line but does not overlap the plurality of first signal lines.

According to various aspects of the disclosure, there may be provided a display device in which a gate driving circuit is disposed on the display panel in a gate in panel (GIP) type.

According to various aspects of the disclosure, there may be provided a display panel that does not cause a screen abnormality although a gate driving circuit is embedded therein and a display device including the display panel.

According to various aspects of the disclosure, there may be provided a display panel capable of normal operation of a gate driving circuit although the gate driving circuit is embedded therein and a display device including the display panel.

According to various aspects of the disclosure, there may be provided a display panel capable of reducing or removing load deviation between clock signal lines related to the gate driving operation and a display device including the display panel.

According to various aspects of the disclosure, there may be provided a display panel having a line structure for stably supplying various signals or power to the gate driving circuit and a display device including the display panel.

According to various aspects of the disclosure, it is possible to achieve process optimization for the display device by including a gate driving panel circuit disposed on the substrate of the display panel to be formed during the process of manufacturing the display panel.

It is to be understood that both the foregoing general description and the following detailed description are exemplary and explanatory and are intended to provide further explanation of the disclosure as claimed.

BRIEF DESCRIPTION OF THE DRAWINGS

The above and other features and advantages of the disclosure will be more clearly understood from the following detailed description, taken in conjunction with the accompanying drawings, in which.

DETAILED DESCRIPTION

Figure 1:
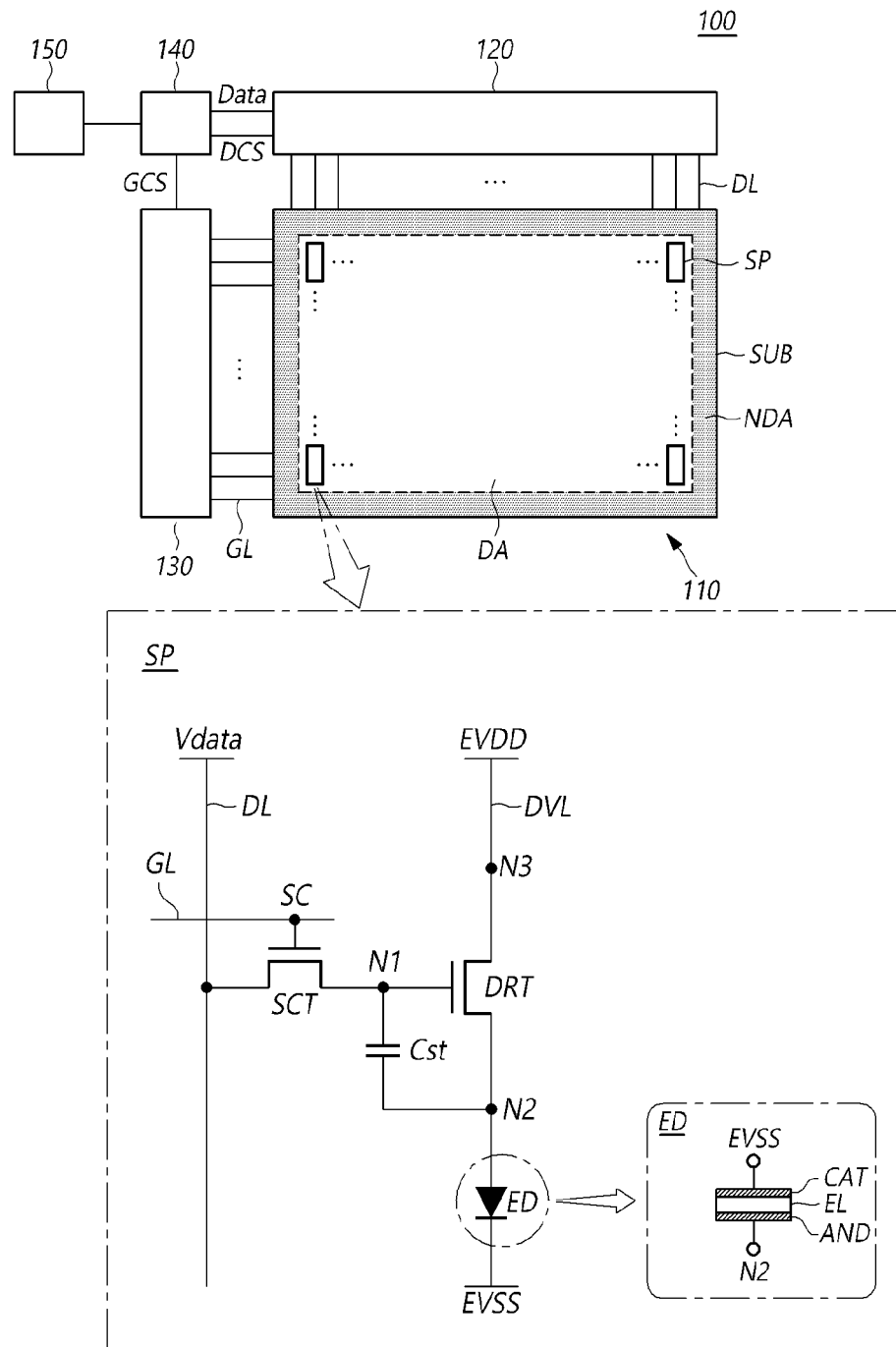
FIG. 1 is a view illustrating a system configuration of a display device according to aspects of the disclosure.

Hereinafter, aspects of the disclosure are described in detail with reference to the accompanying drawings. In assigning reference numerals to components of each drawing, the same components may be assigned the same numerals even when they are shown on different drawings. When determined to make the subject matter of the disclosure unclear, the detailed of the known art or functions may be skipped. As used herein, when a component "includes," "has," or "is composed of" another component, the component may add other components unless the component "only" includes, has, or is composed of" the other component. As used herein, the singular forms "a," "an" and "the" are intended to include the plural forms as well, unless the context clearly indicates otherwise.

Such denotations as "first," "second," "A," "B," "(a)," and "(b)," may be used in describing the components of the disclosure. These denotations are provided merely to distinguish a component from another, and the essence, order, or number of the components are not limited by the denotations.

In describing the positional relationship between components, when two or more components are described as "connected", "coupled" or "linked", the two or more components may be directly "connected", "coupled" or "linked", or another component may intervene. Here, the other component may be included in one or more of the two or more components that are "connected," "coupled" or "linked" to each other.

When such terms as, e.g., "after," "next to," "after," and "before," are used to describe the temporal flow relationship related to components, operation methods, and fabricating methods, it may include a non-continuous relationship unless the term "immediately" or "directly" is used.

When a component is designated with a value or its corresponding information (e.g., level), the value or the corresponding information may be interpreted as including a tolerance that may arise due to various factors (e.g., process factors, internal or external impacts, or noise).

Hereinafter, various aspects of the disclosure are described in detail with reference to the accompanying drawings.

FIG. 1 is a view illustrating a system configuration of a display device 100 according to aspects of the disclosure;

Referring to FIG. 1, a display device 100 according to aspects of the disclosure may include a display panel 110 including a plurality of subpixels SP and driving circuits for driving the plurality of subpixels SP included in the display panel 110.

The driving circuits may include a data driving circuit 120 and a gate driving circuit 130. The display device 100 may further include a controller 140 controlling the data driving circuit 120 and the gate driving circuit 130.

The display panel 110 may include a substrate SUB and a plurality of signal lines, such as a plurality of data lines DL and a plurality of gate lines GL disposed on the substrate SUB. The plurality of data lines DL and the plurality of gate lines GL may be connected to the plurality of subpixels SP.

The display panel 110 may include a display area DA in which images are displayed and a non-display area NDA in which no image is displayed. In the display panel 110, a plurality of subpixels SP for displaying images may be disposed in the display area DA, and the driving circuits 120, 130, and 140 may be electrically connected or disposed in the non-display area NDA. Further, pad units for connection of integrated circuits or a printed circuit may be disposed in the non-display area NDA.

The data driving circuit 120 is a circuit for driving the plurality of data lines DL, and may supply data signals to the plurality of data lines DL.

The gate driving circuit 130 is a circuit for driving the plurality of gate lines GL, and may supply gate signals to the plurality of gate lines GL.

The controller 140 may supply a data control signal DCS to the data driving circuit 120 to control the operation timing of the data driving circuit 120 and may supply a gate control signal GCS to the gate driving circuit 130 to control the operation timing of the gate driving circuit 130.

The controller 140 may start scanning according to a timing implemented in each frame, convert input image data input from the outside into image data Data suited for the data signal format used in the data driving circuit 120, supply the image data Data to the data driving circuit 120, and control data driving at an appropriate time suited for scanning.

The controller 140 receives, from the outside (e.g., a host system 150), various timing signals including a vertical synchronization signal VSYNC, a horizontal synchronization signal HSYNC, an input data enable signal DE, and a clock signal, along with the input image data.

To control the data driving circuit 120 and the gate driving circuit 130, the controller 140 receives timing signals, such as the vertical synchronization signal VSYNC, horizontal synchronization signal HSYNC, input data enable signal DE, and clock signal CLK, generates various control signals DCS and GCS, and outputs the control signals to the data driving circuit 120 and the gate driving circuit 130.

As an example, to control the gate driving circuit 130, the controller 140 outputs various gate control signals GCS including a gate start pulse GSP, a gate shift clock GSC, and a gate output enable signal (Gate Output Enable, GOE).

To control the data driving circuit 120, the controller 140 outputs various data control signals DCS including, e.g., a source start pulse SSP, a source sampling clock SSC, and a source output enable signal (or source output enable SOE).

The controller 140 may be implemented as a separate component from the data driving circuit 120, or the controller 140, along with the data driving circuit 120, may be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a 'source driving circuit.'

The data driving circuit 120 may include one or more source driver integrated circuit SDIC.

Each source driver integrated circuit SDIC may include a shift register, a latch circuit, a digital-to-analog converter (DAC), and an output buffer. In some cases, each source driver integrated circuit SDIC may further include an analog-digital converter (ADC).

For example, each source driver integrated circuit SDIC may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by a TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate SUB or may be connected to the substrate SUB. In other words, the gate driving circuit 130 that is of a GIP type may be disposed in the non-display area NDA of the substrate SUB. The gate driving circuit 130 that is of a chip-on-glass (COG) type or chip-on-film (COF) type may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the subpixels SP or to overlap all or some of the subpixels SP.

When a selected gate line GL is driven by the gate driving circuit 130, the data driving circuit 120 may convert the image data Data received from the controller 140 into an analog data voltage and supply it to the plurality of data lines DL.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the gate driving scheme and the panel design scheme, gate driving circuits 130 may be connected with both the sides (e.g., both the left and right sides) of the display panel 110, or two or more of the four sides of the display panel 110.

The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit.

The controller 140 may transmit/receive signals to/from the data driving circuit 120 according to one or more predetermined interfaces. The interface may include, e.g., a low voltage differential signaling (LVDS) interface, an embedded clock point to point interface (EPI), and a serial peripheral interface (SPI).

The controller 140 may include a storage medium, such as one or more registers.

The display device 100 according to aspects of the disclosure may be a display device including a backlight unit, such as a liquid crystal display device, or may be a self-emission display device, such as an organic light emitting display device, a quantum dot display device, or an inorganic light emitting display device. When the display device 100 according to aspects of the disclosure is an organic light emitting display device, each subpixel SP may include an organic light emitting diode (OLED), which is self-emissive, as the light emitting element.

If the display device 100 according to aspects of the disclosure is a quantum dot display device, each subpixel SP may include a light emitting element formed of a quantum dot, which is a self-emission semiconductor crystal.

If the display device 100 according to aspects of the disclosure is an inorganic light emitting display device, each subpixel SP may include an inorganic light emitting element, which is self-emissive and formed of an inorganic material, as the light emitting element. For example, the inorganic light emitting element is also called a micro light emitting diode (LED), and the inorganic light emitting display device is also called a micro LED display device.

Referring to FIG. 1, when the display device 100 according to aspects of the disclosure is a self-emission display device, each of the plurality of subpixels SP disposed on the display panel 110 of the display device 100 according to aspects of the disclosure may include a light emitting element ED and a subpixel circuit SPC for driving the light emitting element ED.

Referring to FIG. 1, the subpixel circuit SPC of each subpixel SP may include a driving transistor DRT, a scan transistor SCT, and a storage capacitor Cst. In this case, as the subpixel circuit SPC of each subpixel SP includes two transistors DRT and SCT and one capacitor Cst, it may be referred to as having a 2T (transistor) 1C (capacitor) structure.

The light emitting element ED may include an anode electrode AND and a cathode electrode CAT and may include a light emitting layer EL positioned between the anode electrode AND and the cathode electrode CAT.

One of the anode electrode AND and the cathode electrode CAT may be a pixel electrode connected to a transistor, such as the driving transistor DRT, and the other may be a common electrode to which the common voltage is applied. Here, the pixel electrode is an electrode disposed in each subpixel SP, and the common electrode is an electrode commonly disposed in all subpixels SP. For example, the common voltage may be a high-potential voltage EVDD which is a high-level common voltage or a low-potential voltage EVSS which is a low-level common voltage. Here, the high-potential voltage EVDD is also referred to as a driving voltage, and the low-potential voltage EVSS is also referred to as a base voltage.

The anode electrode AND may be a pixel electrode connected to a transistor, such as the driving transistor DRT, and the cathode electrode CAT may be a common electrode to which the low-potential voltage EVSS is applied.

For example, the light emitting element ED may be an organic light emitting diode OLED, an inorganic material-based light emitting diode LED, or a quantum dot light emitting element.

The driving transistor DRT is a transistor for driving the light emitting element ED, and may include a first node N1, a second node N2, and a third node N3.

The first node N1 of the driving transistor DRT may be a gate node of the driving transistor DRT, and may be electrically connected with a source node or a drain node of the scan transistor SCT. The second node N2 of the driving transistor DRT may be a source node or a drain node of the driving transistor DRT, and may be electrically connected to the anode electrode AND of the light emitting element ED. The third node N3 of the driving transistor DRT may be electrically connected with a high-potential voltage line DVL supplying a high-potential voltage EVDD.

The scan transistor SCT may be controlled by a scan signal SC, which is a type of gate signal, and may be connected between the first node N1 of the driving transistor DRT and the data line DL. In other words, the scan transistor SCT may be turned on or off according to the scan signal SC supplied from the scan signal line SCL, which is a type of the gate line GL, controlling the connection between the data line DL and the first node N1 of the driving transistor DRT.

The scan transistor SCT may be turned on by the scan signal SC having a turn-on level voltage and transfer the data voltage Vdata supplied from the data line DL to the first node N1 of the driving transistor DRT.

If the scan transistor SCT is an n-type transistor, the turn-on level voltage of the scan signal SC may be a high level voltage. If the scan transistor SCT is a p-type transistor, the turn-on level voltage of the scan signal SC may be a low level voltage. Hereinafter, the scan transistor SCT is exemplified as an n-type transistor. Accordingly, the turn-on level voltage is exemplified as a high-level voltage.

The storage capacitor Cst may be electrically connected between the first node N1 and second node N2 of the driving transistor DRT. The storage capacitor Cst may be charged with the quantity of electric charge corresponding to the voltage difference between both ends thereof and may serve to maintain the voltage difference between both ends for a predetermined frame time. Accordingly, during the predetermined frame time, the corresponding subpixel SP may emit light.

Each of the driving transistor DRT and the scan transistor SCT may be an n-type transistor or a p-type transistor. In the disclosure, for convenience of description, each of the driving transistor DRT and the scan transistor SCT is an n-type transistor.

The storage capacitor Cst is not a parasitic capacitor which is an internal capacitor existing between the gate node and the source node or drain node (Cgs or Cgd) of the driving transistor DRT, but may be an external capacitor intentionally designed outside the driving transistor DRT.

The subpixel SP illustrated in FIG. 1 is merely an example, and various changes may be made thereto, e.g., such as further including one or more transistors or one or more capacitors.

Figure 2:
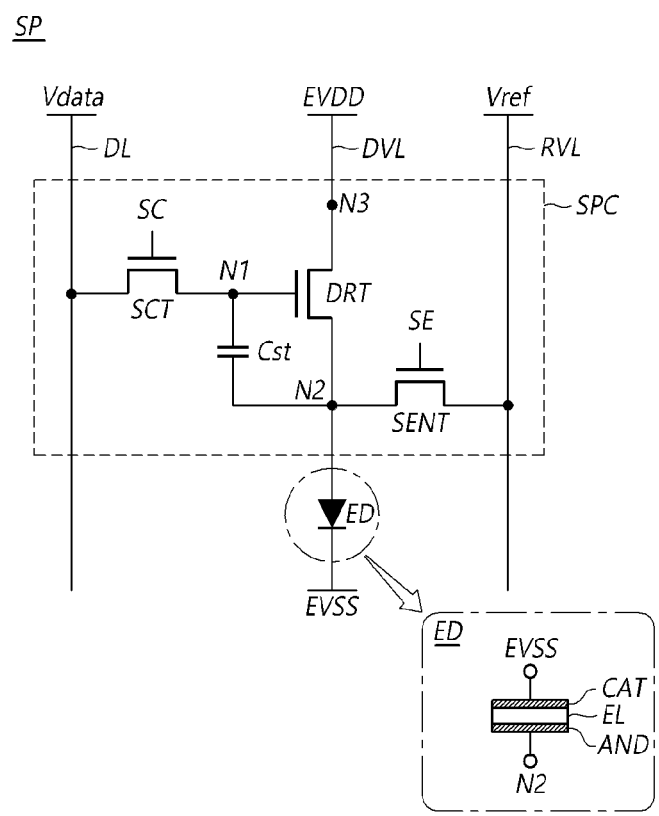
FIG. 2 illustrates an equivalent circuit diagram of a subpixel in a display panel according to aspects of the disclosure.

FIG. 2 is an equivalent circuit diagram of a subpixel SP in a display panel 110 according to aspects of the disclosure.

Referring to FIG. 2, each of the plurality of subpixels SP disposed on the display panel 110 according to aspects of the disclosure may include a light emitting element ED and a subpixel circuit SPC for driving the light emitting element ED. The subpixel circuit SPC of each subpixel SP may include a driving transistor DRT, a scan transistor SCT, a sensing transistor SENT, and a storage capacitor Cst. In this case, as the subpixel circuit SPC of each subpixel SP includes three transistors DRT, SCT, and SENT, and one capacitor Cst, it may be referred to as having a 3T (transistor) 1C (capacitor) structure.

The subpixel SP of FIG. 2 is different from the subpixel SP of FIG. 1 in that it further includes the sensing transistor SENT unlike the subpixel SP of FIG. 1. Therefore, the following description focuses primarily on differences from the subpixel SP of FIG. 1.

Referring to FIG. 2, the light emitting element ED may include an anode electrode AND and a cathode electrode CAT and may include a light emitting layer EL positioned between the anode electrode AND and the cathode electrode CAT. For example, the light emitting element ED may be an organic light emitting diode OLED, an inorganic material-based light emitting diode LED, or a quantum dot light emitting element.

Referring to FIG. 2, the driving transistor DRT is a transistor for driving the light emitting element ED, and may include a first node N1, a second node N2, and a third node N3. The first node N1 of the driving transistor DRT may be a gate node of the driving transistor DRT, and may be electrically connected with a source node or a drain node of the scan transistor SCT. The second node N2 of the driving transistor DRT may be a source node or a drain node of the driving transistor DRT, and may be electrically connected with a source node or a drain node of the sensing transistor SENT and may also be electrically connected with the anode electrode AND of the light emitting element ED. The third node N3 of the driving transistor DRT may be electrically connected with a high-potential voltage line DVL supplying a high-potential voltage EVDD.

Referring to FIG. 2, the scan transistor SCT may be controlled by a scan signal SC, which is a type of gate signal, and may be connected between the first node N1 of the driving transistor DRT and the data line DL. In other words, the scan transistor SCT may be turned on or off according to the scan signal SC supplied from the scan signal line SCL, which is a type of the gate line GL, controlling the connection between the data line DL and the first node N1 of the driving transistor DRT.

The scan transistor SCT may be turned on by the scan signal SC having a turn-on level voltage and transfer the data voltage Vdata supplied from the data line DL to the first node N1 of the driving transistor DRT.

Referring to FIG. 2, the sensing transistor SENT may be controlled by a sensing signal SE, which is a type of gate signal, and may be connected between the second node N2 of the driving transistor DRT and the reference voltage line RVL. In other words, the sensing transistor SENT may be turned on or off according to the sensing signal SE supplied from the sensing signal line SENL, which is another type of the gate line GL, controlling the connection between the reference voltage line RVL and the second node N2 of the driving transistor DRT.

The sensing transistor SENT may be turned on by the sensing signal SE having a turn-on level voltage and transfer a reference voltage Vref supplied from the reference voltage line RVL to the second node N2 of the driving transistor DRT. Here, the sensing signal SE may be viewed as a second scan signal that is different from the scan signal SC.

The sensing transistor SENT may be turned on by the sensing signal SE having a turn-on level voltage, transferring the voltage of the second node N2 of the driving transistor DRT to the reference voltage line RVL.

If the sensing transistor SENT is an n-type transistor, the turn-on level voltage of the sensing signal SE may be a high level voltage. If the sensing transistor SENT is a p-type transistor, the turn-on level voltage of the sensing signal SE may be a low level voltage. Hereinafter, the sensing transistor SENT is exemplified as an n-type transistor. Accordingly, the turn-on level voltage is exemplified as a high-level voltage.

The function in which the sensing transistor SENT transfers the voltage of the second node N2 of the driving transistor DRT to the reference voltage line RVL may be used upon driving to sense the characteristic value of the subpixel SP. In this case, the voltage transferred to the reference voltage line RVL may be a voltage for calculating the characteristic value of the subpixel SP or a voltage reflecting the characteristic value of the subpixel SP.

In the disclosure, the characteristic value of the subpixel SP may be a characteristic value of the driving transistor DRT or the light emitting element ED. For example, the characteristic value of the driving transistor DRT may include a threshold voltage and mobility of the driving transistor DRT. The characteristic value of the light emitting element ED may include a threshold voltage of the light emitting element ED.

Referring to FIG. 2, the storage capacitor Cst may be connected between the first node N1 and second node N2 of the driving transistor DRT.

Referring to FIG. 2, each of the driving transistor DRT, the scan transistor SCT, and the sensing transistor SENT may be an n-type transistor or a p-type transistor. In the disclosure, for convenience of description, each of the driving transistor DRT, the scan transistor SCT, and the sensing transistor SENT is an n-type transistor.

The storage capacitor Cst is not a parasitic capacitor which is an internal capacitor existing between the gate node and the source node or drain node (Cgs or Cgd) of the driving transistor DRT, but may be an external capacitor intentionally designed outside the driving transistor DRT.

The subpixel SP illustrated in FIG. 2 is merely an example, and various changes may be made thereto, e.g., such as further including one or more transistors or one or more capacitors.

Figure 3A:
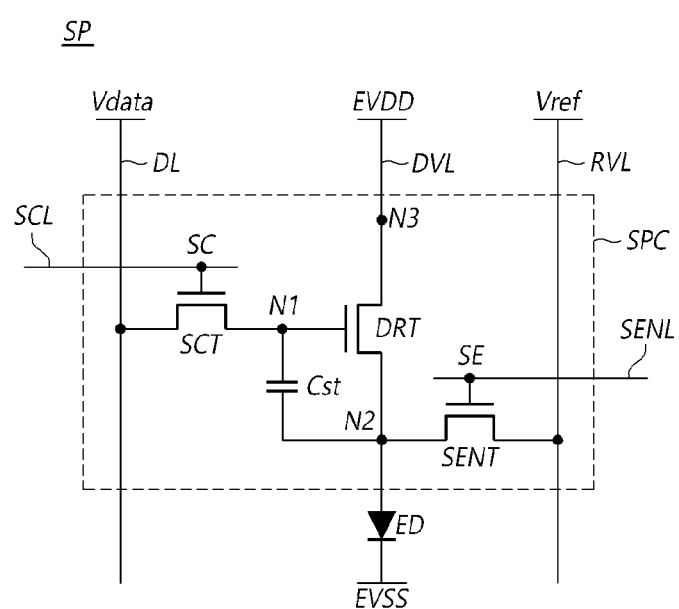
FIGS. 3A and 3B illustrate an equivalent circuit diagram of a subpixel having a 2-gate driven structure and an equivalent circuit diagram of a subpixel having a 1-gate driven structure in a display panel according to aspects of the disclosure, respectively.
Figure 3B:
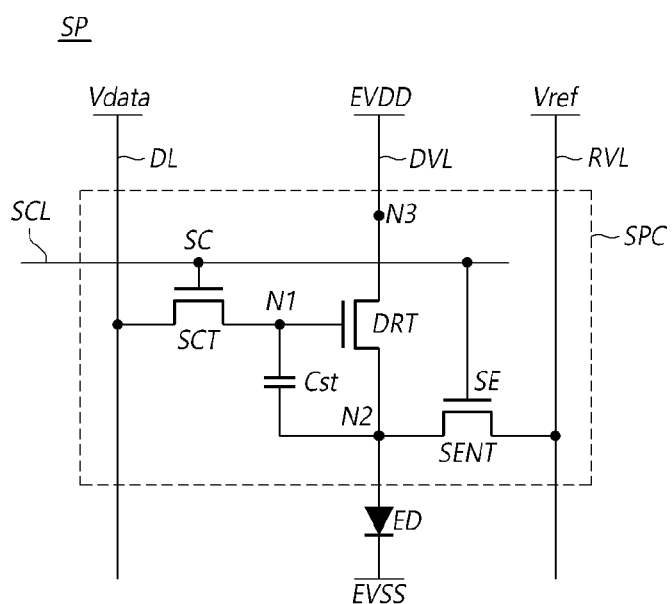

FIGS. 3A and 3B illustrate an equivalent circuit diagram of a subpixel SP having a 2-gate driven structure and an equivalent circuit diagram of a subpixel SP having a 1-gate driven structure in a display panel 110 according to aspects of the disclosure, respectively.

The subpixel circuit SPC of the subpixel SP of FIG. 3A and the subpixel circuit SPC of the subpixel SP of FIG. 3B have the same 3T1C structure as that of FIG. 2.

The subpixel SP of FIG. 3A and the subpixel SP of FIG. 3B may have different gate driven structures. The subpixel SP of FIG. 3A may have a 2-gate driven structure. The subpixel SP of FIG. 3B may have a 1-gate driven structure.

As shown in FIG. 3A, when the subpixel SP has a 2-gate driven structure, the subpixel SP may be connected to two gate lines GL including the scan signal line SCL and the sensing signal line SENL.

Referring to FIG. 3A, in the subpixel circuit SPC of the subpixel SP having the 2-gate driven structure, the gate node of the scan transistor SCT may be connected to the scan signal line SCL, and the gate node of the sensing transistor SENT may be connected to the sensing signal line SENL. Accordingly, the scan transistor SCT and sensing transistor SENT may operate independently of each other.

Referring to FIG. 3A, the subpixel circuit SPC of the subpixel SP having 2-gate driven structure may receive the scan signal SC through the scan signal line SCL and receive the sensing signal SE through the sensing signal line SENL. In the subpixel circuit SPC of the subpixel SP having the 2-gate driven structure, the gate node of the scan transistor SCT may receive the scan signal SC through the scan signal line SCL, and the gate node of the sensing transistor SENT may receive the sensing signal SE through the sensing signal line SENL.

As shown in FIG. 3A, when the subpixel SP has the 2-gate driven structure, the on-off timings of the scan transistor SCT and the on-off timings of the sensing transistor SENT in one subpixel SP may be independent. In other words, when the subpixel SP has the 2-gate driven structure, the on-off timings of the scan transistor SCT and the on-off timings of the sensing transistor SENT in one subpixel SP may be different or identical.

As shown in FIG. 3B, when the subpixel SP has a 1-gate driven structure, the subpixel SP may be connected to the scan signal line SCL corresponding to one gate line GL.

Referring to FIG. 3B, in the subpixel circuit SPC of the subpixel SP having the 1-gate driven structure, the gate node of the scan transistor SCT and the gate node of the sensing transistor SENT both may be commonly connected to one scan signal line SCL. Accordingly, the scan transistor SCT and sensing transistor SENT may operate together.

Referring to FIG. 3B, in the subpixel circuit SPC of the subpixel SP having the 1-gate driven structure, the gate node of the scan transistor SCT and the gate node of the sensing transistor SENT both may receive the scan signal SC through one scan signal line SCL.

Referring to FIG. 3B, in the subpixel circuit SPC of the subpixel SP having the 1-gate driven structure, the scan signal SC supplied to the gate node of the sensing transistor SENT serves as the sensing signal SE.

As shown in FIG. 3B, when the subpixel SP has the 1-gate driven structure, the on-off timings of the scan transistor SCT and the on-off timings of the sensing transistor SENT in one subpixel SP may be the same.

Figure 4:
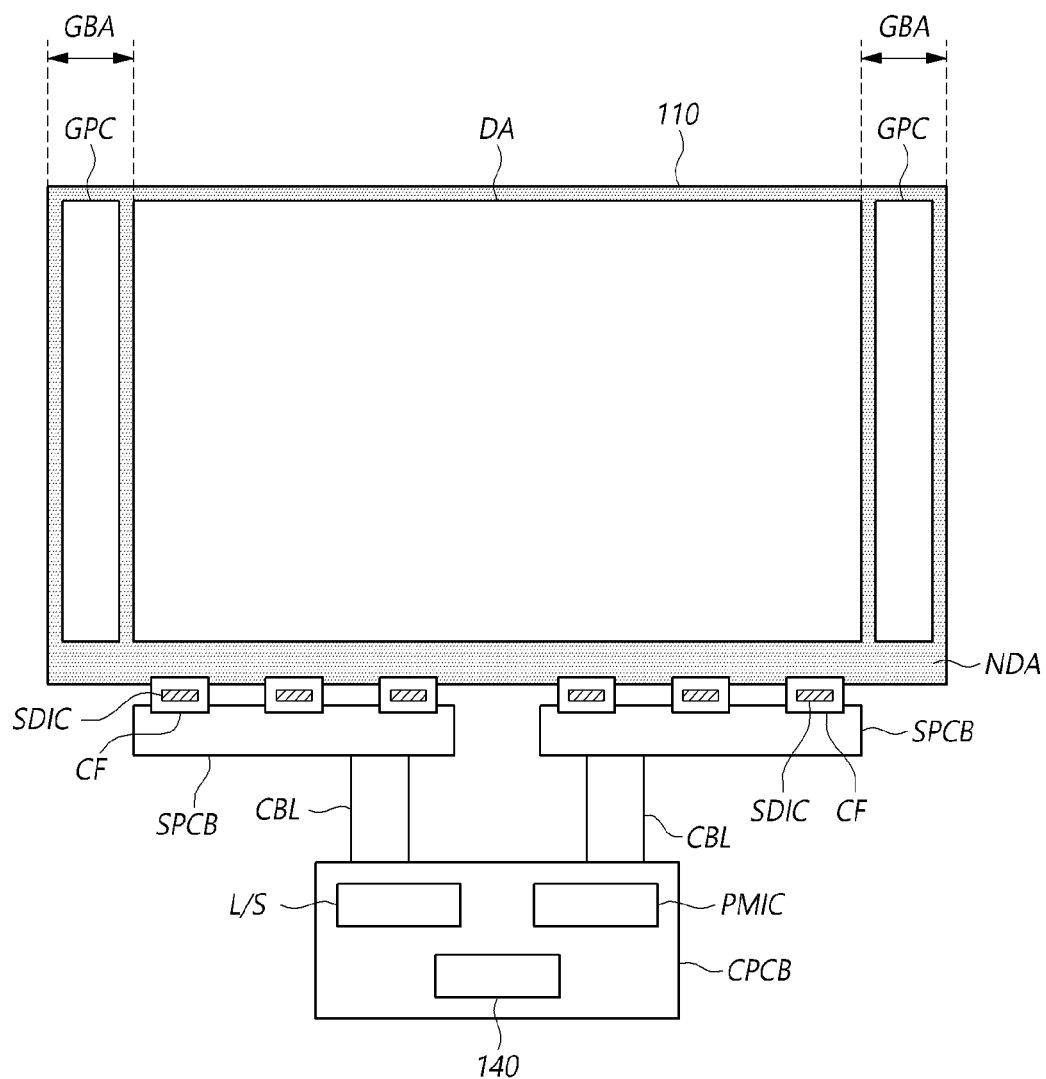
FIG. 4 is a view illustrating an example system implementation of a display device according to aspects of the disclosure.

FIG. 4 is a view illustrating an example system implementation of a display device according to aspects of the disclosure.

Referring to FIG. 4, the display panel 110 may include a display area DA in which images are displayed and a non-display area NDA in which no image is displayed.

According to the implementation example of FIG. 4, the data driving circuit 120 may include a plurality of source driver integrated circuits SDIC and may be implemented in a chip on film (COF) method. Each of the plurality of source driver integrated circuits SDIC may be mounted on the circuit film CF connected to the non-display area NDA of the display panel 110. Here, the circuit film CF is also referred to as a flexible printed circuit.

According to the implementation example of FIG. 4, the gate driving circuit 130 may be implemented in a gate in panel (GIP) type. Hereinafter, the gate driving circuit 130 implemented in the GIP type is also referred to as a "gate driving panel circuit GPC".

The gate driving panel circuit GPC may be formed in the non-display area NDA of the display panel 110. According to the implementation example of FIG. 4, the gate driving panel circuit GPC may be disposed in both the non-display area NDA positioned outside one side of the display area DA and the non-display area NDA positioned outside the other side of the display area DA.

The display device 100 may include at least one source printed circuit board SPCB for a circuit connection between the plurality of source driver integrated circuits SDIC and the other devices (e.g., the controller 140, a level shifter L/S, a power management integrated circuit PMIC, etc.), and a control printed circuit board CPCB for mounting control components and various electric devices.

The circuit film CF on which the source driver integrated circuit SDIC is mounted may be connected to at least one source printed circuit board SPCB. In other words, one side of the source driver integrated circuit SDIC-mounted circuit film CF may be electrically connected with the display panel 110, and the opposite side thereof may be electrically connected with the source printed circuit board SPCB.

The controller 140, the power management integrated circuit PMIC, and the like may be mounted on the control printed circuit board CPCB.

The controller 140 may perform an overall control function related to driving of the display panel 110, and may control operations of the plurality of source driver integrated circuits SDIC and the gate driving panel circuit GPC.

The power management integrated circuit PMIC may supply various voltages or currents to the plurality of source driver integrated circuits SDIC, gate driving panel circuit GPC, or the like, or may control various voltages or currents to be supplied.

At least one source printed circuit board SPCB and the control printed circuit board CPCB may be circuit-connected through at least one connection cable CBL. Here, the connection cable CBL may be, e.g., either a flexible printed circuit (FPC) or a flexible flat cable (FFC).

The at least one source printed circuit board SPCB and control printed circuit board CPCB may be integrated into a single printed circuit board.

The display device 100 according to aspects of the disclosure may further include a level shifter L/S for adjusting the voltage level of signal. For example, the level shifter L/S may be disposed on a control printed circuit board CPCB or a source printed circuit board SPCB.

In the display device 100 according to aspects of the disclosure, the level shifter L/S may output signals required for gate driving to the gate driving panel circuit GPC which is the GIP-type gate driving circuit 130.

For example, the power management integrated circuit PMIC may output a signal to the level shifter L/S. The level shifter L/S may adjust the voltage level of the signal input from the power management integrated circuit PMIC. The signal of which the voltage level is adjusted by the level shifter L/S may be input to the gate driving panel circuit GPC.

For example, the level shifter L/S may output a plurality of clock signals having different phases to the gate driving panel circuit GPC. The gate driving panel circuit GPC may generate a plurality of gate signals (e.g., the scan signal SC, the sensing signal SE, etc.) based on the plurality of clock signals input from the level shifter L/S and output the generated plurality of gate signals to a plurality of gate lines (e.g., the scan signal line SCL, the sensing signal line SENL, etc.).

Referring to FIG. 4, the non-display area NDA of the display panel 110 may include a gate bezel area GBA. The gate bezel area GBZ may refer to an area in which the gate driving panel circuit GPC, which is the GIP-type gate driving circuit 130, and various lines connected to the gate driving panel circuit GPC are disposed.

Referring to FIG. 4, various lines connected to the gate driving panel circuit GPC may include a plurality of clock lines, a high-level gate voltage line, and a low-level gate voltage line.

Described below is the structure of the gate driving panel circuit GPC and the gate bezel area GBA in which the gate driving panel circuit GPC is disposed according to aspects of the disclosure.

Figure 5A:
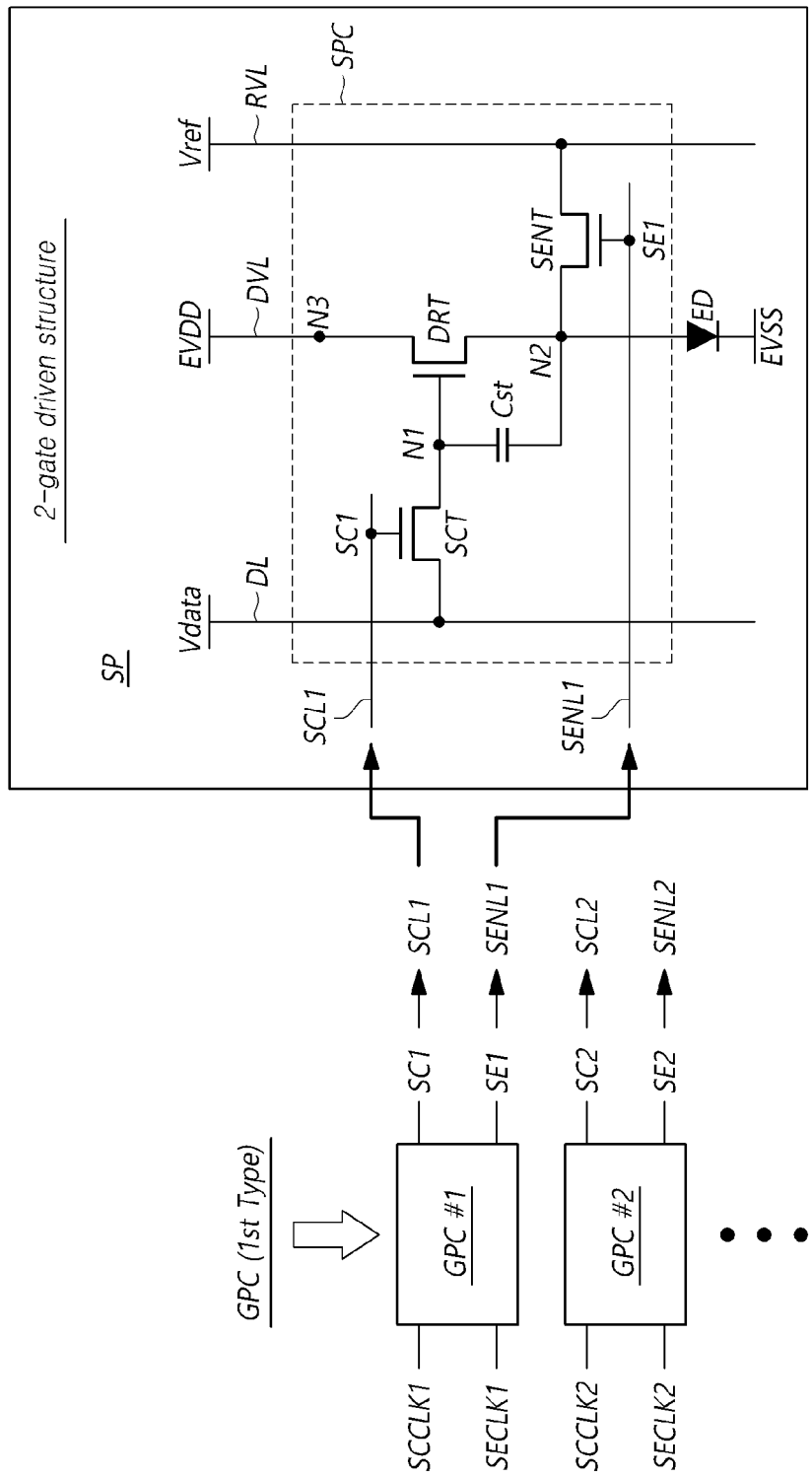
FIG. 5A illustrates an input and output of a gate driving panel circuit when the gate driving panel circuit is of a first type according to aspects of the disclosure.

FIG. 5A illustrates an input and output of a gate driving panel circuit GPC when the gate driving panel circuit GPC is of a first type according to aspects of the disclosure.

Referring to FIG. 5A, when each subpixel SP disposed on the display panel 110 has a 2-gate driven structure (see FIG. 3A), the gate driving panel circuit GPC may be of a first type.

Referring to FIG. 5A, when the gate driving panel circuit GPC is of the first type, the first gate driving panel circuit GPC #1 included in the gate driving panel circuit GPC may receive a first scan clock signal SCCLK1 and a first sensing clock signal SECLK1 and output a first scan signal SC1 and a first sensing signal SE1.

The first scan clock signal SCCLK1 and the first sensing clock signal SECLK1 may be output from the level shifter L/S.

The first scan signal SC1 and the first sensing signal SE1 may be applied to the first scan signal line SCL1 and the first sensing signal line SENL1, respectively.

Referring to FIG. 5A, when the gate driving panel circuit GPC is of the first type, the second gate driving panel circuit GPC #2 included in the gate driving panel circuit GPC may receive a second scan clock signal SCCLK2 and a second sensing clock signal SECLK2 and output a second scan signal SC2 and a second sensing signal SE2.

The second scan clock signal SCCLK2 and the second sensing clock signal SECLK2 may be output from the level shifter L/S.

The second scan signal SC2 and the second sensing signal SE2 may be applied to the second scan signal line SCL2 adjacent to the first scan signal line SCL1 and the second sensing signal line SENL2 adjacent to the first sensing signal line SENL1, respectively.

Figure 5B:
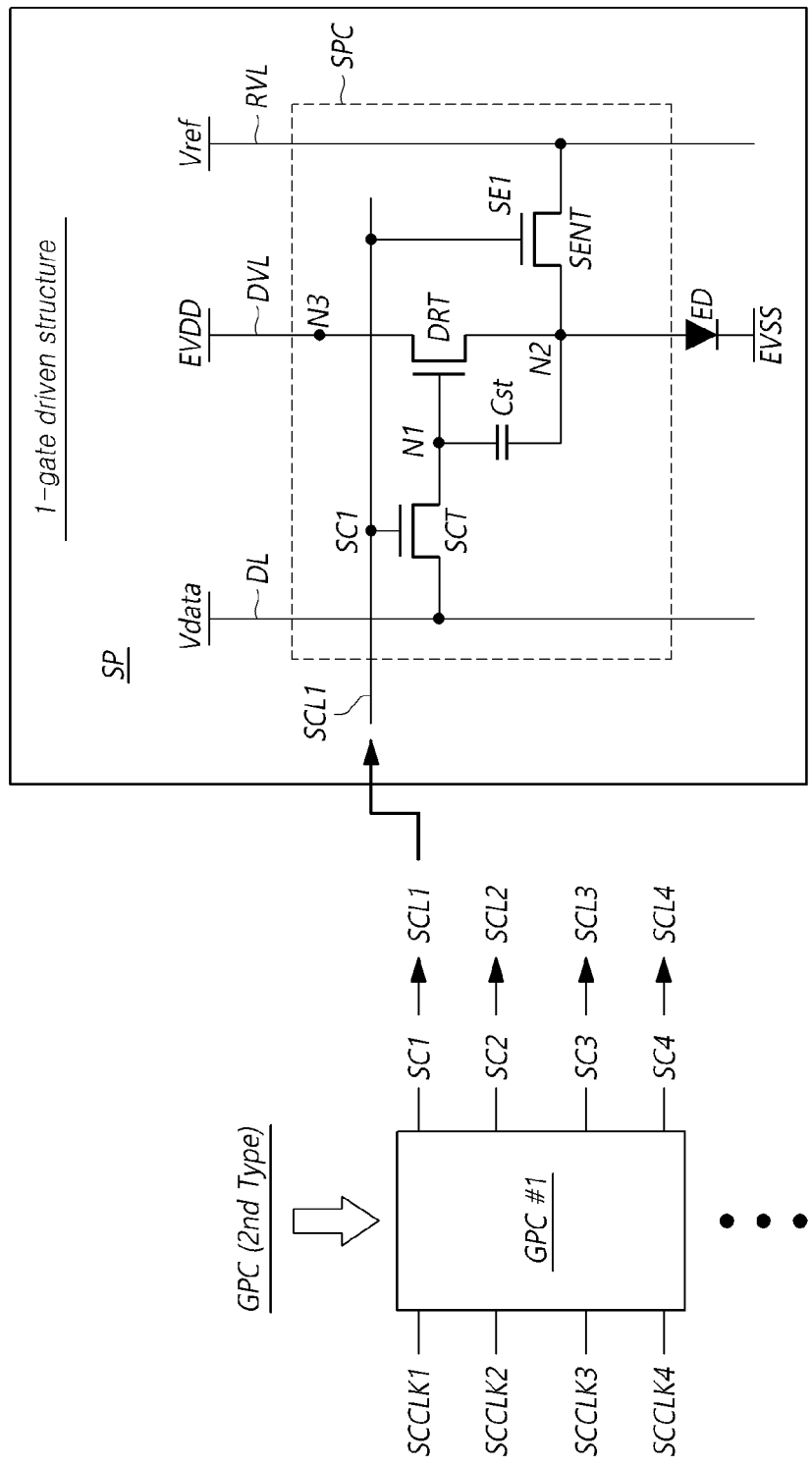
FIG. 5B illustrates an input and output of a gate driving panel circuit when the gate driving panel circuit is of a second type according to aspects of the disclosure.

FIG. 5B illustrates an input and output of a gate driving panel circuit GPC when the gate driving panel circuit GPC is of a second type according to aspects of the disclosure.

Referring to FIG. 5B, when each subpixel SP disposed on the display panel 110 has a 1-gate driven structure (see FIG. 3B), the gate driving panel circuit GPC may be of a second type.

Referring to FIG. 5B, for example, when the gate driving panel circuit GPC is of the second type, the first gate driving panel circuit GPC1 included in the gate driving panel circuit GPC may receive a first scan clock signal SCCLK1, a second scan clock signal SCCLK2, a third scan clock signal SCCLK3, and a fourth scan clock signal SCCLK4, and may output a first scan signal SC1, a second scan signal SC2, a third scan signal SC3, and a fourth scan signal SC4.

The first scan clock signal SCCLK1, the second scan clock signal SCCLK2, the third scan clock signal SCCLK3, and the fourth scan clock signal SCCLK4 may be output from the level shifter L/S.

The first scan signal SC1 may be applied to the first scan signal line SCL1, and the second scan signal SC2, the third scan signal SC3, and the fourth scan signal SC4 may be applied to the second scan signal line SCL2, the third scan signal line SCL3, and the fourth scan signal line SCL4, respectively, adjacent to the first scan signal line SCL1.

Figure 6:
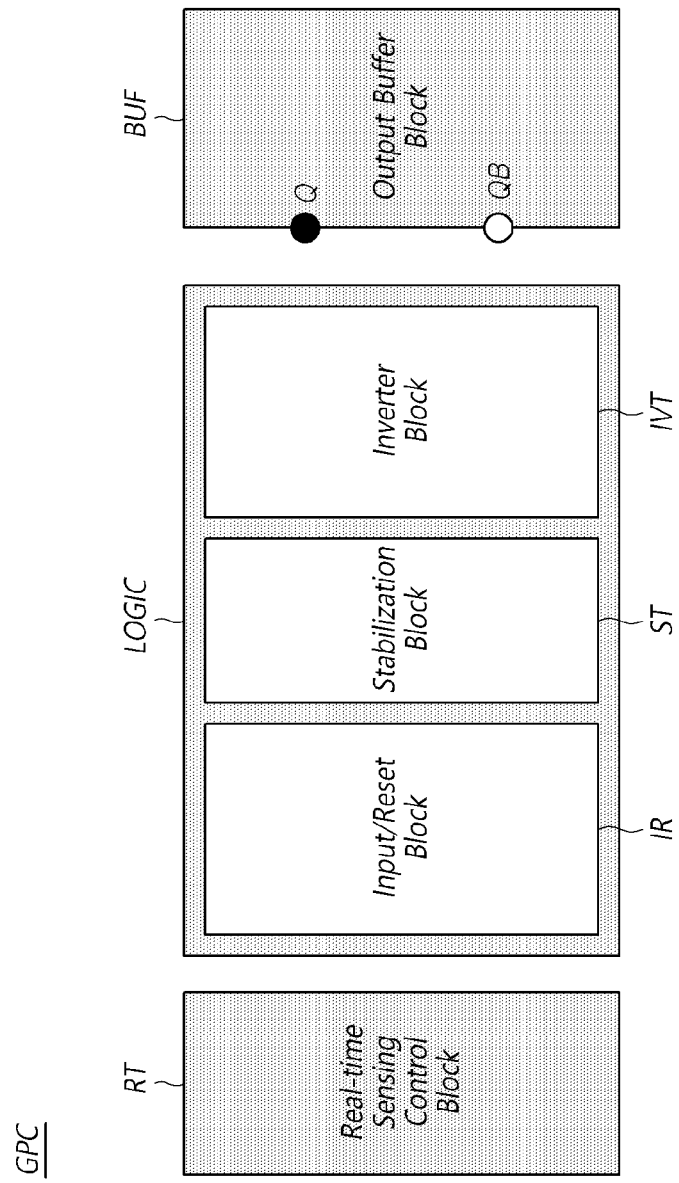
FIG. 6 is a block diagram illustrating a gate driving panel circuit according to aspects of the disclosure.

FIG. 6 is a block diagram illustrating a gate driving panel circuit GPC according to aspects of the disclosure.

Referring to FIG. 6, the gate driving panel circuit GPC may include an output buffer block BUF, a logic block LOGIC, and a real-time sensing control block RT.

Referring to FIG. 6, the output buffer block BUF may be configured to output two or more gate signals.

For example, when the gate driving panel circuit GPC is of the first type, the output buffer block BUF may output at least one scan signal SC and at least one sensing signal SE.

When the gate driving panel circuit GPC is of the first type, the subpixel SP may have a 2-gate driven structure as shown in FIG. 3A.

For example, when the gate driving panel circuit GPC is of the second type, the output buffer block BUF may output two or more scan signals SC.

When the gate driving panel circuit GPC is of the second type, the subpixel SP may have a 1-gate driven structure as shown in FIG. 3B.

Referring to FIG. 6, the output buffer block BUF may be controlled according to voltage states of a Q node and a QB node. The operation and output of the output buffer block BUF may vary according to voltage states of the Q node and the QB node.

The Q node and the QB node may have different voltage levels. For example, if the voltage of the Q node during a first period is a high-level voltage, the voltage of the QB node may be a low-level voltage. If the voltage of the Q node is a low-level voltage during a second period before or after the first period, the voltage of the QB node may be a high-level voltage.

Referring to FIG. 6, the logic block LOGIC may be a circuit block that controls the operation of the output buffer block BUF and implements an operation of a shift register. The logic block LOGIC may control the voltages of the Q node and the QB node to control the operation of the output buffer block BUF.

Referring to FIG. 6, the logic block LOGIC may include an input/reset block IR, a stabilization block ST, and an inverter block IVT.

The input/reset block IR may be a circuit block that controls charge and discharge of the Q node. The inverter block IVT may control the inverted voltage level of the voltage level of the Q node to be the voltage level of the QB node according to the voltage of the Q node. The stabilization block ST may stabilize the Q node and the output according to the voltage of the QB node during a period when the output signal of the gate driving panel circuit GPC has a turn-off level voltage.

Each of the input/reset block IR, the stabilization block ST, and the inverter block IVT may include at least one transistor.

The real-time sensing control block RT may be a circuit block for controlling the operation of the output buffer block BUF for real-time sensing driving. Here, the real-time sensing driving may be sensing driving performed in real time during display driving and sensing driving performed every blank period BLANK between active periods ACT. The real-time sensing driving may be performed in a second sensing mode corresponding to the fast sensing mode. The real-time sensing driving may be sensing driving for sensing the mobility of the driving transistor DRT of each subpixel SP.

The real-time sensing control block RT may include at least one transistor.

When the gate driving panel circuit GPC is of the first type, the real-time sensing control block RT may control the voltages of the Q node and the QB node such that the output buffer block BUF outputs the scan signal SC and the sensing signal SE to the subpixel SP where the real-time sensing driving is performed.

When the gate driving panel circuit GPC is of the second type, the real-time sensing control block RT may control the voltages of the Q node and the QB node such that the output buffer block BUF outputs the scan signal SC to the subpixel SP where the real-time sensing driving is performed.

Figure 7:
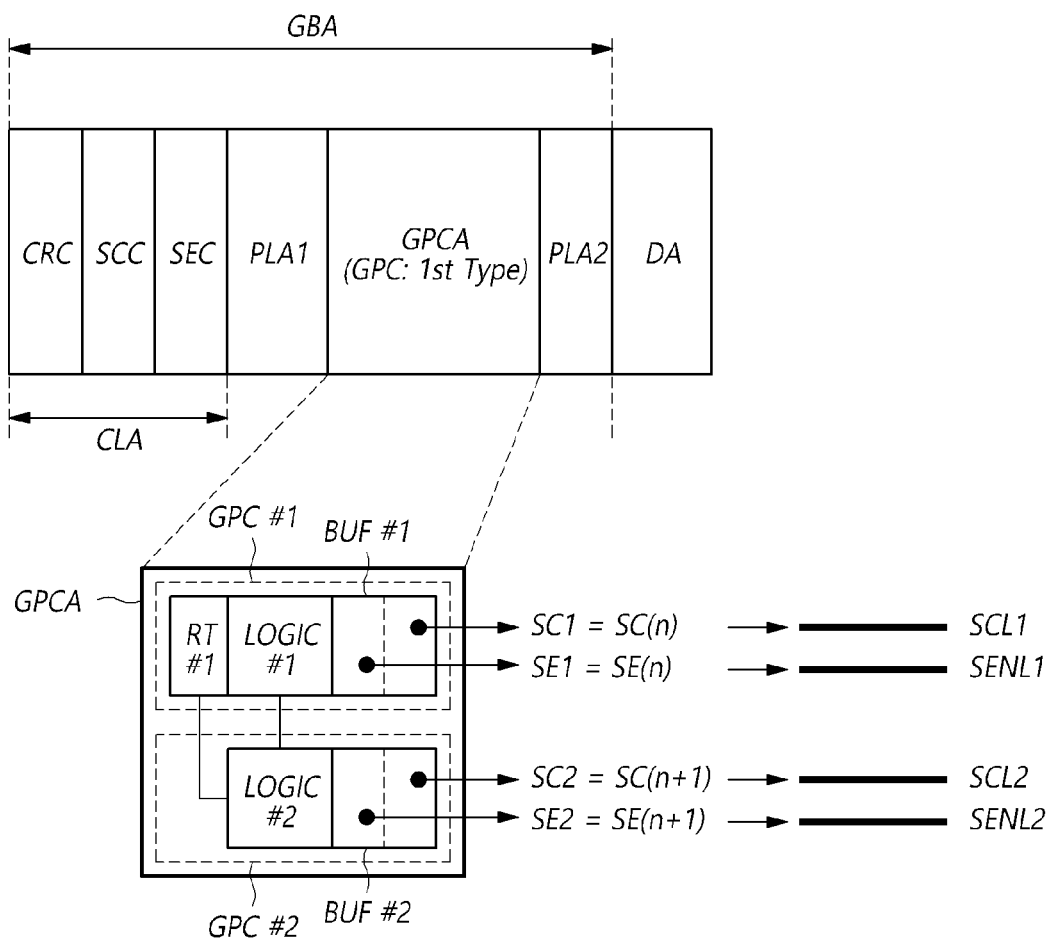
FIG. 7 is a layout view illustrating a gate bezel area in a display panel when a gate driving panel circuit is of a first type according to aspects of the disclosure.

FIG. 7 is a layout view illustrating a gate bezel area GBA in a display panel 110 when a gate driving panel circuit GPC is of a first type according to aspects of the disclosure.

Referring to FIG. 7, the gate bezel area GBA of the display panel 110 may include a clock signal line area CLA, a first power line area PLA1, a gate driving panel circuit area GPCA, and a second power line area PLA2.

The gate driving panel circuit area GPCA may be an area in which the first type of gate driving panel circuit GPC is disposed. The first type of gate driving panel circuit GPC may output scan signals SC and sensing signals SE to be supplied to the subpixel SP having a 2-gate driving structure.

Various lines for supplying power, voltage, or signals to the gate driving panel circuit GPC may be disposed around the gate driving panel circuit area GPCA. Accordingly, in the gate bezel area GBA, the clock signal line area CLA, the first power line area PLA1, and the second power line area PLA2 may be disposed around the gate driving panel circuit area GPCA.

For example, the clock signal line area CLA and the first power line area PLA1 may be positioned on one side of the gate driving panel circuit area GPCA, and the second power line area PLA2 may be positioned on the other side of the gate driving panel circuit area GPCA.

The gate driving panel circuit area GPCA may be positioned on one side of the second power line area PLA2, and the display area DA may be positioned on the other side of the second power line area PLA2.

The clock signal line area CLA may be an area in which clock signal lines for transferring various clock signals to the gate driving panel circuit GPC are disposed.

The first power line area PLA1 may be an area where a plurality of first lines are disposed.

The plurality of first lines may include at least one gate high-potential voltage line for transferring at least one gate high-potential voltage to the gate driving panel circuit GPC.

The plurality of first lines disposed in the first power line area PLA1 may further include at least one control signal line for transferring at least one control signal to the gate driving panel circuit GPC. For example, the at least one control signal may include at least one of a start signal, a reset signal, and a line selection signal.

The second power line area PLA2 may be an area where a plurality of second lines are disposed.

The plurality of second lines may include at least one gate low-potential voltage line for transferring at least one gate low-potential voltage to the gate driving panel circuit GPC.

Referring to FIG. 7, when the gate driving panel circuit GPC is of the first type, the clock signal line area CLA may include a carry clock signal line area CRC, a scan clock signal line area SCC, and a sensing clock signal line area SEC.

The carry clock signal line area CRC may be an area in which carry clock signal lines for transferring carry clock signals to the gate driving panel circuit GPC are disposed.

The scan clock signal line area SCC may be an area in which scan clock signal lines for transferring scan clock signals to the gate driving panel circuit GPC are disposed.

The sensing clock signal line area SEC may be an area in which sensing clock signal lines for transferring sensing clock signals to the gate driving panel circuit GPC are disposed.

The position order of the carry clock signal line area CRC, the scan clock signal line area SCC, and the sensing clock signal line area SEC may be variously set (e.g., CRC-SCC-SEC, SCC-CRC-SEC, SCC-SEC-CRC, or SEC-SCC-CRC, etc.).

For example, among the carry clock signal line area CRC, the scan clock signal line area SCC, and the sensing clock signal line area SEC, the scan clock signal line area SCC may be positioned between the carry clock signal line area CRC and the sensing clock signal line area SEC, and the carry clock signal line area CRC may be positioned further away from the display area DA or the gate driving panel circuit area GPCA than the sensing clock signal line area SEC.

Referring to FIG. 7, when the gate driving panel circuit GPC is of the first type, the gate driving panel circuit GPC disposed in the gate driving panel circuit area GPCA may include, e.g., a first gate driving panel circuit GPC #1 and a second gate driving panel circuit GPC #2. Each of the first gate driving panel circuit GPC #1 and the second gate driving panel circuit GPC #2 may have a separate Q node and a separate QB node.

The first gate driving panel circuit GPC #1 may include a first output buffer block BUF #1, a first logic block LOGIC #1, and a first real-time sensing control block RT #1.

The first output buffer block BUF #1 may be configured to output the first scan signal SC1 and the first sensing signal SE1 to the first scan signal line SCL1 and the first sensing signal line SENL1, respectively, connected to the first subpixel SP. For example, the first scan signal SC1 may be an nth scan signal SC(n), and the first sensing signal SE1 may be an nth sensing signal SE(n).

The first logic block LOGIC #1 may be configured to control the operation of the first output buffer block BUF #1 by controlling the voltage of each of the Q node and the QB node.

The second gate driving panel circuit GPC #2 may include only the second output buffer block BUF #2 and the second logic block LOGIC #2.

The second output buffer block BUF #2 may be configured to output the second scan signal SC2 and the second sensing signal SE2 to the second scan signal line SCL2 and the second sensing signal line SENL2, respectively, connected to the second subpixel SP. For example, the second scan signal SC2 may be an (n+1)th scan signal SC(n+1), and the second sensing signal SE2 may be an (n+1)th sensing signal SE(n+1).

The second logic block LOGIC #2 may be configured to control the operation of the second output buffer block BUF #2 by controlling the voltage of each of the Q node and the QB node.

The first real-time sensing control block RT #1 may be shared by the first gate driving panel circuit GPC #1 and the second gate driving panel circuit GPC #2. Accordingly, the size of the gate bezel area GBA may be significantly reduced.

The first real-time sensing control block RT #1 may be configured to control the voltage of each of the Q node and the QB node of the first gate driving panel circuit GPC #1 during a first real-time sensing driving period (first blank period) to control the operation of the first output buffer block BUF #1 such that the first output buffer block BUF #1 outputs the first scan signal SC1 and the first sensing signal SE1 for sensing driving to the first subpixel SP where real-time sensing driving is to be performed.

The first real-time sensing control block RT #1 may be configured to control the voltage of each of the Q node and the QB node of the second gate driving panel circuit GPC #2 during a second real-time sensing driving period (second blank period) different from the first real-time sensing driving period (first blank period) to control the operation of the second output buffer block BUF #2 such that the second output buffer block BUF #2 outputs the second scan signal SC2 and the second sensing signal SE2 for sensing driving to the second subpixel SP where real-time sensing driving is to be performed.

At least one specific node of the first logic block LOGIC #1 and at least one specific node of the second logic block LOGIC #2 may be electrically connected to each other.

Referring to FIG. 7, among the first output buffer block BUF #1, the first logic block LOGIC #1, and the first real-time sensing control block RT #1, the first real-time sensing control block RT #1 may be positioned farthest from the display area DA.

Referring to FIG. 7, the gate driving panel circuit area GPCA may be disposed between the first power line area PLA1 and the second power line area PLA2.

Accordingly, at least one gate high-potential voltage line disposed in the first power line area PLA1 and at least one gate low-potential voltage line disposed in the second power line area PLA2 may be separated by the gate driving panel circuit GPC disposed in the gate driving panel circuit area GPCA.

According to the above-described power supply arrangement, at least one high-potential voltage line and at least one low-potential voltage line do not overlap each other, and thus, the high-potential voltages (GVDD, GVDD2, GVDD_o/GVDD_e of FIG. 8) and the low-potential voltages (GVSS0, GVSS1, and GVSS2 of FIG. 8) may be stabilized.

Figure 8:
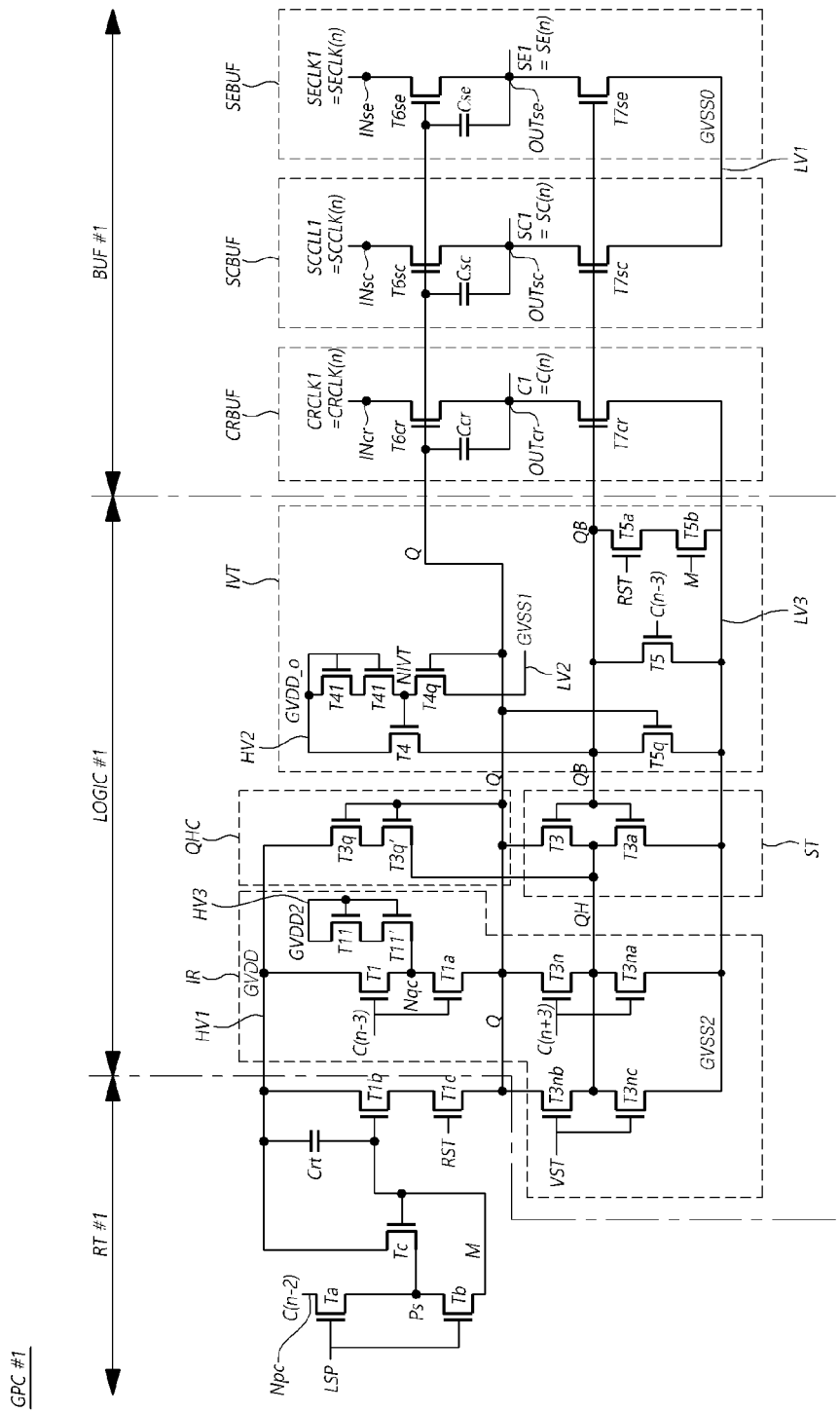
FIG. 8 illustrates a first gate driving panel circuit included in a gate driving panel circuit when the gate driving panel circuit is of a first type according to aspects of the disclosure.

FIG. 8 illustrates a first gate driving panel circuit GPC #1 included in a gate driving panel circuit GPC when the gate driving panel circuit GPC is of a first type according to aspects of the disclosure.

Here, the first gate driving panel circuit GPC #1 may be configured to output an odd-numbered nth scan signal SC(n) and nth sensing signal SE(n). The nth scan signal SC(n) may be supplied to an odd-numbered nth scan signal line SCL, and the nth sensing signal SE(n) may be supplied to an odd-numbered nth sensing signal line SENL. Hereinafter, for convenience of description, the nth scan signal SC(n) may also be referred to as the first scan signal SC1, and the nth sensing signal SE(n) may also be referred to as the first sensing signal SE1.

Referring to FIG. 8, the first gate driving panel circuit GPC #1 may include a first output buffer block BUF #1, a first logic block LOGIC #1, and a first real-time sensing control block RT #1.

Referring to FIG. 8, the first output buffer block BUF #1 may include a carry output buffer CRBUF, a scan output buffer SCBUF, and a sensing output buffer SEBUF.

Referring to FIG. 8, the carry output buffer CRBUF may include a carry pull-up transistor T6cr and a carry pull-down transistor T7cr.

The carry pull-up transistor T6cr may be turned on or off according to the voltage of the Q node, thereby controlling the connection between the carry clock node INcr to which the nth carry clock signal CRCLK(n) is input and the carry output node OUTcr where the nth carry signal C(n) is output. Here, the nth carry clock signal CRCLK(n) may also be referred to as the first carry clock signal CRCLK1, and the nth carry signal C(n) may also be referred to as the first carry signal C1.

The gate node of the carry pull-up transistor T6cr may be the Q node or may be electrically connected to the Q node. The source node (or drain node) of the carry pull-up transistor T6cr may be the carry output node OUTcr or may be electrically connected to the carry output node OUTcr. The drain node (or source node) of the carry pull-up transistor T6cr may be the carry clock node INcr or may be electrically connected to the carry clock node INcr.

The carry pull-up transistor T6cr may be turned on to output the first carry clock signal CRCLK1 as the first carry signal C1 having a high-level voltage.

The carry output buffer CRBUF may further include a carry bootstrapping capacitor Ccr connected between the gate node and the source node (or the drain node) of the carry pull-up transistor T6cr.

The carry-pull-down transistor T7cr may be turned on or off according to the voltage of the QB node, thereby controlling the connection between the third gate low-potential node LV3 to which the third gate low-potential voltage GVSS2 is input and the carry output node OUTcr where the nth carry signal C(n) is output.

The gate node of the carry pull-down transistor T7cr may be the QB node or may be electrically connected to the QB node. The drain node or the source node of the carry pull-down transistor T7cr may be the third gate low-potential node LV3 or may be electrically connected to the third gate low-potential node LV3, and the source node or the drain node of the carry pull-down transistor T7cr may be the carry output node OUTer or may be electrically connected to the carry output node OUTer.

The carry pull-down transistor T7cr may be turned on to output the third gate low-potential voltage GVSS2 as the first carry signal C1 having a low-level voltage.

Referring to FIG. 8, the scan output buffer SCBUF may be configured to output an nth scan clock signal SCCLK(n) having a turn-on level voltage or a turn-off level voltage to the scan output node OUTsc. The nth scan clock signal SCCLK(n) output to the scan output node OUTsc may be applied to the first scan signal line SCL1 electrically connected to the scan output node OUTsc.

Referring to FIG. 8, the scan output buffer SCBUF may include a scan pull-up transistor T6*sc* and a scan pull-down transistor T7*sc*.

The scan pull-up transistor T6*sc* may be turned on or off according to the voltage of the Q node, thereby controlling the connection between the scan clock node INsc to which the nth scan clock signal SCCLK(n) is input and the scan output node OUTsc where the nth scan signal SC(n) is output. Here, the nth scan clock signal SCCLK(n) may also be referred to as the first scan clock signal SCCLK1, and the nth scan signal SC(n) may also be referred to as the first scan signal SC1.

The gate node of the scan pull-up transistor T6*sc* may be the Q node or may be electrically connected to the Q node. The source node (or drain node) of the scan pull-up transistor T6*sc* may be the scan output node OUTsc or may be electrically connected to the scan output node OUTsc. The drain node (or source node) of the scan pull-up transistor T6*sc* may be the scan clock node INsc or may be electrically connected to the scan clock node INsc.

The scan pull-up transistor T6*sc* may be turned on to output the scan clock signal SCCLK, as the first scan signal SC1 having a turn-on level voltage (e.g., a high-level voltage), to the scan output node OUTsc. The first scan signal SC1 having a turn-on level voltage (e.g., a high-level voltage) output from the scan pull-up transistor T6*sc* may be applied to the first scan signal line SCL1.

The scan output buffer SCBUF may further include a scan bootstrapping capacitor Csc connected between the gate node and the source node (or the drain node) of the scan pull-up transistor T6*sc*.

The scan pull-down transistor T7*sc* may be turned on or off according to the voltage of the QB node, thereby controlling the connection between the first gate low-potential node LV1 to which the first gate low-potential voltage GVSS0 is input and the scan output node OUTsc where the nth scan signal SC(n) is output.

The gate node of the scan pull-down transistor T7*sc* may be the QB node or may be electrically connected to the QB node. The drain node or the source node of the scan pull-down transistor T7*sc* may be the first gate low-potential node LV1 or may be electrically connected to the first gate low-potential node LV1. The source node or drain node of the scan pull-down transistor T7*sc* may be the scan output node OUTsc or may be electrically connected to the scan output node OUTsc.

The scan pull-down transistor T7*sc* may be turned on to output the first gate low-potential voltage GVSS0, as the first scan signal SC1 having a turn-off level voltage (e.g., a low-level voltage), to the scan output node OUTsc. The first scan signal SC1 having a turn-off level voltage (e.g., a low-level voltage) in the scan pull-down transistor T7*sc* may be applied to the first scan signal line SCL1.

Referring to FIG. 8, the sensing output buffer SEBUF may be configured to output an nth sensing clock signal SECLK(n) having a turn-on level voltage or a turn-off level voltage to the sensing output node OUTse. The nth sensing clock signal SECLK(n) output to the sensing output node OUTse may be applied to the first sensing signal line SENL1 electrically connected to the sensing output node OUTse.

Referring to FIG. 8, the sensing output buffer SEBUF may include a sensing pull-up transistor T6*se* and a sensing pull-down transistor T7*se*.

The sensing pull-up transistor T6*se* may be turned on or off according to the voltage of the Q node, thereby controlling the connection between the sensing clock node INse to which the nth sensing clock signal SECLK(n) is input and the sensing output node OUTse where the nth sensing signal SE(n) is output. Here, the nth sensing clock signal SECLK(n) may also be referred to as the first sensing clock signal SECLK1, and the nth sensing signal SE(n) may also be referred to as the first sensing signal SEL.

The gate node of the sensing pull-up transistor T6*se* may be the Q node or may be electrically connected to the Q node. The source node (or drain node) of the sensing pull-up transistor T6*se* may be the sensing output node OUTse or may be electrically connected to the sensing output node OUTse. The drain node (or source node) of the sensing pull-up transistor T6*se* may be the sensing clock node INse or may be electrically connected to the sensing clock node INse.

The sensing pull-up transistor T6*se* may be turned on to output the sensing clock signal SECLK, as the first sensing signal SE1 having a turn-on level voltage (e.g., a high-level voltage), to the sensing output node OUTse. The first sensing signal SE1 having a turn-on level voltage (e.g., a high-level voltage) output from the sensing pull-up transistor T6*se* may be applied to the first sensing signal line SENL1.

The sensing output buffer SEBUF may further include a sensing bootstrapping capacitor Cse connected between the gate node and the source node (or the drain node) of the sensing pull-up transistor T6*se*.

The sensing pull-down transistor T7*se* may be turned on or off according to the voltage of the QB node, thereby controlling the connection between the first gate low-potential node LV1 to which the first gate low-potential voltage GVSS0 is input and the sensing output node OUTse where the nth sensing signal SE(n) is output.

The gate node of the sensing pull-down transistor T7*se* may be the QB node or may be electrically connected to the QB node. The drain node or the source node of the sensing pull-down transistor T7*se* may be the first gate low-potential node LV1 or may be electrically connected to the first gate low-potential node LV1. The source node or drain node of the sensing pull-down transistor T7*se* may be the sensing output node OUTse or may be electrically connected to the sensing output node OUTse.

The sensing pull-down transistor T7*se* may be turned on to output the first gate low-potential voltage GVSS0, as the first sensing signal SE1 having a turn-off level voltage (e.g., a low-level voltage), to the sensing output node OUTse. The first sensing signal SE1 having a turn-off level voltage (e.g., a low-level voltage) in the sensing pull-down transistor T7*se* may be applied to the first sensing signal line SENL1.

The respective gate nodes of the carry pull-up transistor T6*cr*, the scan pull-up transistor T6*sc*, and the sensing pull-up transistor T6*se* included in the first output buffer block BUF #1 may be electrically connected to each other.

The Q node may be shared by the carry output buffer CRBUF, the scan output buffer SCBUF, and the sensing output buffer SEBUF included in the first output buffer block BUF #1. The Q node may be electrically connected to the gate node of the carry pull-up transistor T6*cr*, the gate node of the scan pull-up transistor T6*sc*, and the gate node of the sensing pull-up transistor T6*se*. This structure may also be referred to as a "Q node sharing structure."

The respective gate nodes of the carry-pull-down transistor T7cr, the scan-pull-down transistor T7sc, and the sensing-pull-down transistor T7se included in the first output buffer block BUF #1 may be connected to each other.

The QB node may be shared by the carry output buffer CRBUF, the scan output buffer SCBUF, and the sensing output buffer SEBUF included in the first output buffer block BUF #1. The QB node may be electrically connected to the gate node of the carry pull-down transistor T5cr, the gate node of the scan pull-down transistor T5sc, and the gate node of the sensing pull-down transistor T5se.

Referring to FIG. 8, the first logic block LOGIC #1 is the circuit block for controlling the voltages of the Q node and the QB node to control the operation of the first output buffer block BUF #1, and may include an input/reset block IR, a stabilization block ST, and an inverter block IVT.

Referring to FIG. 8, the input/reset block IR is a circuit block for controlling charging and discharging of the Q node, and may include a Q node charging block connected between the first gate high-potential node HV1 and the Q node and a Q node discharging block connected between the Q node and the third gate low-potential node LV3. Here, the first gate high-potential voltage GVDD may be input to the first gate high-potential node HV1. The third gate low-potential voltage GVSS2 may be input to the third gate low-potential node LV3.

Referring to FIG. 8, the Q node charge block of the input/reset block IR may include at least one Q node charge transistor for controlling the connection between the first gate high-potential node HV1 and the Q node by being turned on or off according to the (n−3)th carry signal C(n−3) to charge the Q node.

For example, the Q node charge block of the input/reset block IR may include a first Q node charge transistor T1 and a second Q node charge transistor T1a connected in series between the first gate high-potential node HV1 and the Q node.

The gate node of the first Q node charge transistor T1 and the gate node of the second Q node charge transistor T1a may be electrically connected to each other to receive the (n−3)th carry signal C(n−3) together.

The first Q node charge transistor T1 may be connected between the first gate high-potential node HV1 and the Q node charge control node Nqc, and the second Q node charge transistor T1a may be connected between the Q node charge control node Nqc and the Q node.

Referring to FIG. 8, the Q node charge block of the input/reset block IR may further include a first Q node charge control transistor T11 and a second Q node charge control transistor T11' connected in series between the third gate high-potential node HV3 and the Q node charge control node Nqc to control the Q node charge control node Nqc. Here, the third gate high-potential voltage GVDD2 may be applied to the third gate high-potential node HV3.

The gate node of the first Q node charge control transistor T11 and the gate node of the second Q node charge control transistor T11' may be electrically connected to each other and may be connected to the third gate high-potential node HV3 together.

Referring to FIG. 8, the Q node discharge block of the input/reset block IR may include a first Q node discharge transistor T3n and a second Q node discharge transistor T3na connected in series between the Q node and the third gate low-potential node LV3 to discharge the Q node.

The first Q node discharge transistor T3n and the second Q node discharge transistor T3na may be turned on or off together according to the (n+3)th carry signal C(n+3) to control the connection between the Q node and the third gate low-potential node LV3.

The first Q node discharge transistor T3n may be connected between the Q node and the holding node QH node, and the second Q node discharge transistor T3na may be connected between the holding node QH node and the third gate low-potential node LV3.

The gate node of the first Q node discharge transistor T3n and the gate node of the second Q node discharge transistor T3na may be electrically connected to each other to receive the (n+3)th carry signal C(n+3) together.

Referring to FIG. 8, the Q node discharge block of the input/reset block IR may further include a third Q node discharge transistor T3nb and a fourth Q node discharge transistor T3nc connected in series between the Q node and the third gate low-potential node LV3 to discharge the Q node.

The third Q node discharge transistor T3nb and the fourth Q node discharge transistor T3nc may be turned on or off together according to the start signal VST to control the connection between the Q node and the third gate low-potential node LV3.

The third Q node discharge transistor T3nb may be connected between the Q node and the holding node QH node, and the fourth Q node discharge transistor T3nc may be connected between the holding node QH node and the third gate low-potential node LV3.

Referring to FIG. 8, the stabilization block ST may be a circuit block that stabilizes the Q node and the output according to the voltage of the QB node during a period when the output signal of the gate driving panel circuit GPC has a turn-off level voltage.

Referring to FIG. 8, the stabilization block ST may include a first stabilization transistor T3 and a second stabilization transistor T3a that are turned on or off according to the voltage of the QB node to control the connection between the Q node and the third gate low-potential node LV3.

The first stabilization transistor T3 may be connected between the Q node and the holding node QH node, and may be turned on or off according to the voltage of the QB node to control the connection between the Q node and the holding node QH node.

The second stabilization transistor T3a may be connected between the holding node QH node and the third gate low-potential node LV3, and may be turned on or off according to the voltage of the QB node to control the connection between the holding node QH node and the third gate low-potential node LV3.

Referring to FIG. 8, the inverter block IVT may be a circuit block that controls the inverted voltage level of the voltage level of the Q node to be the voltage level of the QB node according to the voltage of the Q node.

Referring to FIG. 8, the inverter block IVT may include a QB node charge transistor T4 for charging the QB node.

The QB node charge transistor T4 may be connected between the second gate high-potential node HV2 and the QB node, and may be turned on or off according to the voltage of the inverter control node NIVT to control the connection between the second gate high-potential node HV2 and the QB node. Here, the second gate high-potential voltage GVDD_o may be applied to the second gate high-potential node HV2.

Referring to FIG. 8, the inverter block IVT may further include a first inverter control transistor T4q for controlling the voltage of the inverter control node NIVT.

The first inverter control transistor T4q may be connected between the inverter control node NIVT and the second gate low-potential node LV2 and may be turned on or off according to the voltage of the Q node to control the connection between the inverter control node NIVT and the second gate low-potential node LV2. Here, the second gate low-potential voltage GVSS1 may be applied to the second gate low-potential node LV2.

As the Q node has a low-level voltage, the first inverter control transistor T4q may be turned off. Accordingly, the inverter control node NIVT is in a state in which the second gate high-potential voltage GVDD_o supplied by the second inverter control transistor T41 is applied. Accordingly, the QB node charge transistor T4 may be turned on, so that the second gate high-potential voltage GVDD_o may be supplied to the QB node (Q node charging).

As the Q node has a high-level voltage, the first inverter control transistor T4q may be turned on to supply the second gate low-potential voltage GVSS1 to the inverter control node NIVT. Accordingly, the QB node charge transistor T4 may be turned off to prevent the second gate high-potential voltage GVDD_o from being supplied to the QB node.

Referring to FIG. 8, the inverter block IVT may further include a second inverter control transistor T41 for controlling the voltage of the inverter control node NIVT.

The second inverter control transistor T41 may be connected between the second gate high-potential node HV2 and the inverter control node NIVT, and may be turned on or off according to the second gate high-potential voltage GVDD_o to control the connection between the second gate high-potential node HV2 and the inverter control node NIVT. As shown in FIG. 8, two second inverter control transistors T41 connected in series are disposed. The respective gate nodes of the two second inverter control transistors T41 are connected to the second gate high-potential node HV2 together.

The second inverter control transistor T41 may always maintain the turned-on state to supply the second gate high-potential voltage GVDD_o to the inverter control node NIVT.

Referring to FIG. 8, the inverter block IVT may include a first QB node discharge transistor T5 connected between the QB node and the third gate low-potential node LV3 to discharge the QB node.

The first QB node discharge transistor T5 may be turned on or off according to the (n−3)th carry signal C(n−3), and may control the connection between the QB node and the third gate low-potential node LV3. The first QB node discharge transistor T5 may be turned on, so that the third gate low-potential voltage GVSS2 may be applied to the QB node. Accordingly, the QB node may be discharged.

Referring to FIG. 8, the inverter block IVT may further include a second QB node discharge transistor T5q connected between the QB node and the third gate low-potential node LV3 to discharge the QB node.

The second QB node discharge transistor T5q may be turned on or off according to the voltage of the Q node to control the connection between the QB node and the third gate low-potential node LV3. The second QB node discharge transistor T5q may be turned on, so that the third gate low-potential voltage GVSS2 may be applied to the QB node. Accordingly, the QB node may be discharged.

Referring to FIG. 8, the inverter block IVT may further include a third QB node discharge transistor T5a and a fourth QB node discharge transistor T5b connected in series between the QB node and the third gate low-potential node LV3 to discharge the QB node.

The reset signal RST may be input to the gate node of the third QB node discharge transistor T5a. In other words, the third QB node discharge transistor T5a may be turned on or off according to the voltage of the reset signal RST.

The gate node of the fourth QB node discharge transistor T5b may be electrically connected to the intermediate node M. In other words, the fourth QB node discharge transistor T5b may be turned on or off according to the voltage of the intermediate node M. Here, the intermediate node M may be a node included in the first real-time sensing control block RT #1.

Referring to FIG. 8, among the plurality of QB node discharge transistors T5, T5q, T5a, and T5b included in the inverter block IVT, the first QB node discharge transistor T5 and the second QB node discharge transistor T5q may be configured to discharge the QB node for display driving during the active period ACT, and the third QB node discharge transistor T5a and the fourth QB node discharge transistor T5b may be configured to discharge the QB node for sensing driving during the blank period BLANK.

Referring to FIG. 8, the first logic block LOGIC #1 may further include a holding node control block QHC for controlling the voltage of the holding node QH node. The holding node control block QHC may be connected between the first gate high-potential node HV1 and the holding node QH node.

Referring to FIG. 8, the holding node control block QHC may include a first holding node control transistor T3q and a second holding node control transistor T3q' connected in series between the first gate high-potential node HV1 and the holding node QH node.

The respective gate nodes of the first holding node control transistor T3q and the second holding node control transistor T3q' may be connected to the Q node together.

When the Q node has a high-level voltage, both the first holding node control transistor T3q and the second holding node control transistor T3q' may be turned on, so that the first gate high-potential voltage GVDD may be applied to the holding node QH node. As the holding node QH node has the first gate high-potential voltage GVDD, the Q node may stably maintain the high-level voltage regardless of the on-off state of the third Q node discharge transistor T3nb, the first Q node discharge transistor T3n, and the first stabilization transistor T3.

Referring to FIG. 8, the first real-time sensing control block RT #1 may be a circuit block for controlling the operation of the first output buffer block BUF #1 for real-time sensing driving. The first real-time sensing control block RT #1 may be configured to control the voltage of the Q node such that the first scan signal SC1 and the first sensing signal SE1 are output at a predetermined timing by the first output buffer block BUF #1 during the blank period BLANK.

Referring to FIG. 8, the first real-time sensing control block RT #1 may control the first scan signal SC1 to be output to one of the plurality of scan signal lines SCL by the first output buffer block BUF #1 during the blank period BLANK, and may control the first sensing signal SE1 to be output to one of the plurality of sensing signal lines SENL. Accordingly, sensing may be performed on the subpixel SP included in any one of the plurality of subpixel lines.

Referring to FIG. 8, the first real-time sensing control block RT #1 may include a first sensing control transistor Ta, a second sensing control transistor Tb, a third sensing control transistor Tc, a fourth sensing control transistor T1b, and a fifth sensing control transistor T1c.

The first sensing control transistor Ta and the second sensing control transistor Tb may be connected in series between the previous carry input node Npc and the intermediate node M. Here, the (n−2)th carry signal C(n−2) may be input to the previous carry input node Npc.

To perform real-time sensing driving on the subpixel SP capable of receiving the first sensing signal SE1 and the first scan signal SC1 output from the first gate driving panel circuit GPC #1, the first gate driving panel circuit GPC #1 should output the first scan signal SC1 and the first sensing signal SE1 as gate signals for sensing driving during the real-time sensing driving period. Here, the real-time sensing driving period may be included in the blank period BLANK.

The first real-time sensing control block RT #1 may use the line selection signal LSP to control the first scan signal SC1 and the first sensing signal SE1 to be output as gate signals for sensing driving during the real-time sensing driving period.

During the real-time sensing driving period, the line selection signal LSP may be commonly input to the respective gate nodes of the first sensing control transistor Ta and the second sensing control transistor Tb. Here, the line selection signal LSP is a signal in the form of a pulse and may be commonly applied to the respective gate nodes of the first sensing control transistor Ta and the second sensing control transistor Tb in the middle of the frame.

The third sensing control transistor Tc may be turned on or off according to the voltage of the intermediate node M to control the connection between the connection point Ps and the first gate high-potential node HV1. Here, the connection point Ps may be a point where the first sensing control transistor Ta and the second sensing control transistor Tb are connected.

The fourth sensing control transistor T1b and the fifth sensing control transistor T1c may be connected in series between the first gate high-potential node HV1 and the Q node.

The gate node of the fourth sensing control transistor T1b may be connected to the intermediate node M. The reset signal RST may be input to the gate node of the fifth sensing control transistor T1c.

During the real-time sensing driving period, the fourth sensing control transistor T1b and the fifth sensing control transistor T1c may be turned on according to the voltage of the intermediate node M and the reset signal RST, respectively, to transfer the first gate high-potential voltage GVDD to the Q node. Accordingly, during the real-time sensing driving period, the Q node may be charged. Here, the real-time sensing driving period may be included in the blank period BLANK.

Referring to FIG. 8, the first real-time sensing control block RT #1 may include a sensing control capacitor Crt connected between the first gate high-potential node HV1 and the intermediate node M.

Figure 9:
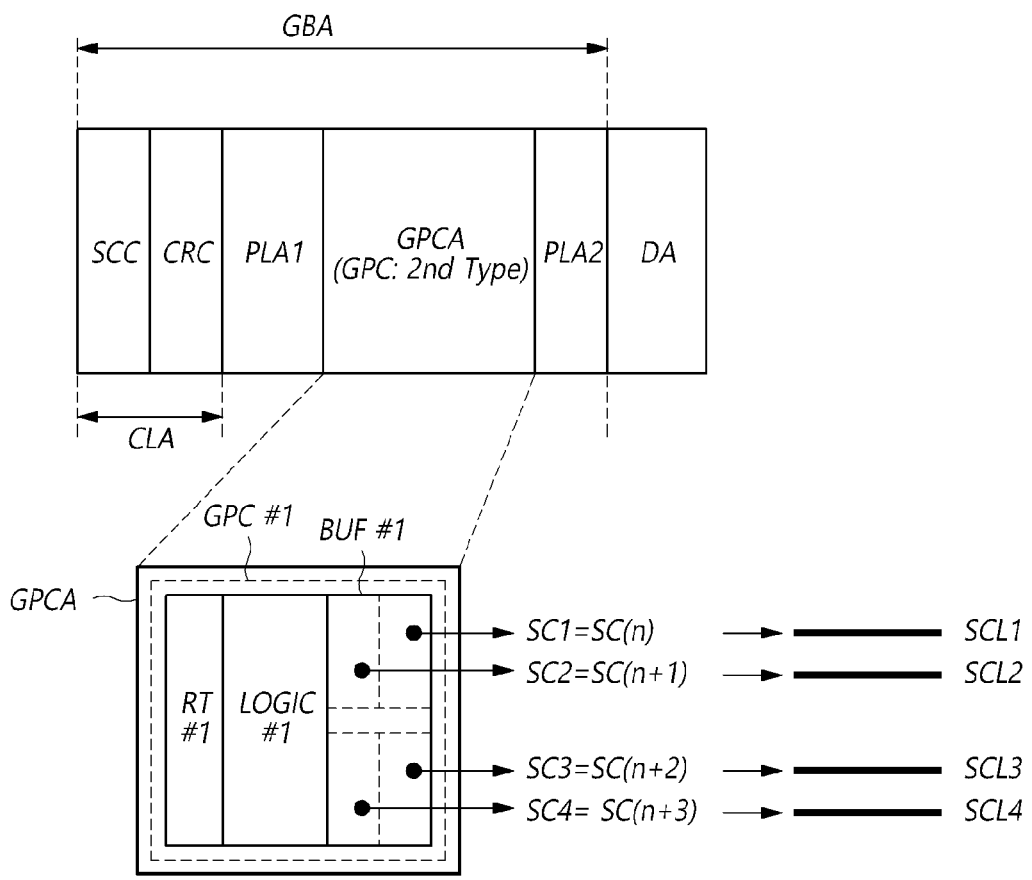
FIG. 9 is a layout view illustrating a gate bezel area in a display panel when a gate driving panel circuit is of a second type according to aspects of the disclosure.

FIG. 9 is a layout view illustrating a gate bezel area GBA in a display panel 110 when a gate driving panel circuit GPC is of a second type according to aspects of the disclosure.

Referring to FIG. 9, the gate bezel area GBA in the non-display area NDA of the display panel 110 may include a clock signal line area CLA, a first power line area PLA1, a gate driving panel circuit area GPCA, and a second power line area PLA2.

Referring to FIG. 9, the arrangement of the sub-areas in the gate bezel area GBA in which the gate driving panel circuit GPC of the second type is disposed is almost the same as the arrangement of the sub-areas in the gate bezel area GBA in which the first type of gate driving panel circuit GPC is disposed (see FIG. 7), except for the clock signal line area CLA and the gate driving panel circuit area GPCA. Accordingly, the following description focuses primarily on differences from the arrangement of sub-areas (see FIG. 7) in the gate bezel area GBA in which the first type of gate driving panel circuit GPC is disposed.

Referring to FIG. 9, the gate driving panel circuit area GPCA may be an area in which the second type of gate driving panel circuit GPC is disposed. The second type of gate driving panel circuit GPC may output scan signals SC to be supplied to the subpixel SP having the 1-gate driven structure.

In the gate bezel area GBA, the clock signal line area CLA, the first power line area PLA1, and the second power line area PLA2 may be disposed around the gate driving panel circuit area GPCA.

For example, the clock signal line area CLA and the first power line area PLA1 may be positioned on one side of the gate driving panel circuit area GPCA, and the first power line area PLA1 may be positioned between the clock signal line area CLA and the gate driving panel circuit area GPCA. The second power line area PLA2 may be positioned on the other side of the gate driving panel circuit area GPCA. The second power line area PLA2 may be positioned between the gate driving panel circuit area GPCA and the display area DA. The gate driving panel circuit area GPCA may be positioned on one side of the second power line area PLA2, and the display area DA may be positioned on the other side of the second power line area PLA2.

The clock signal line area CLA may be included in the gate bezel area GBA in the non-display area NDA, and may be an area in which a plurality of clock signal lines for supplying a plurality of clock signals to the gate driving panel circuit GPC are disposed.

The first power line area PLA1 may be included in the gate bezel area GBA in the non-display area NDA, and may be an area in which at least one gate high-potential voltage line for supplying at least one gate high-potential voltage to the gate driving panel circuit GPC is disposed.

For example, a plurality of gate high-potential voltage lines for supplying a plurality of gate high-potential voltages to the gate driving panel circuit GPC may be disposed in the first power line area PLA1. For example, the plurality of gate high-potential voltages may all have the same high-potential voltage value, or alternatively, some of the plurality of gate high-potential voltages may have different high-potential voltage values. The plurality of gate high-potential voltages may be high-potential voltages of different uses.

At least one control signal line for transferring at least one control signal to the gate driving panel circuit GPC may be further disposed in the first power line area PLA1. For example, the at least one control signal may include at least one of a start signal VST, a reset signal RST, and a line selection signal LSP.

The second power line area PLA2 may be included in the gate bezel area GBA in the non-display area NDA, and may be an area in which at least one gate low-potential voltage line for supplying at least one gate low-potential voltage to the gate driving panel circuit GPC is disposed.

For example, a plurality of gate low-potential voltage lines for supplying a plurality of gate low-potential voltages to the gate driving panel circuit GPC may be disposed in the first power line area PLA1. For example, the plurality of gate low-potential voltages may all have the same low-potential voltage value, or alternatively, some of the plurality of gate high-potential voltages may have different low-potential voltage values. The plurality of gate low-potential voltages may be low-potential voltages of different uses.

Referring to FIG. 9, when the gate driving panel circuit GPC is of the second type, the clock signal line area CLA may include a scan clock signal line area SCC and a carry clock signal line area CRC.

The scan clock signal line area SCC may be an area in which scan clock signal lines for transferring scan clock signals to the gate driving panel circuit GPC are disposed.

The carry clock signal line area CRC may be an area in which carry clock signal lines for transferring carry clock signals to the gate driving panel circuit GPC are disposed.

When the gate driving panel circuit GPC is of the second type, the clock signal line area CLA does not include the sensing clock signal line area.

Of the scan clock signal line area SCC and the carry clock signal line area CRC, the scan clock signal line area SCC may be positioned farther from the display area DA or the gate driving panel circuit area GPCA than the carry clock signal line area CRC, and the carry clock signal line area CRC may be positioned closer to the display area DA or the gate driving panel circuit area GPCA than the scan clock signal line area SCC.

Alternatively, the carry clock signal line area CRC may be positioned farther from the display area DA or the gate driving panel circuit area GPCA than the scan clock signal line area SCC. The scan clock signal line area SCC may be positioned closer to the display area DA or the gate driving panel circuit area GPCA than the carry clock signal line area CRC.

Referring to FIG. 9, when the gate driving panel circuit GPC is of the second type, the gate driving panel circuit GPC disposed in the gate driving panel circuit area GPCA may include the first gate driving panel circuit GPC #1 or the like.

The first gate driving panel circuit GPC #1 may include a first output buffer block BUF #1, a first logic block LOGIC #1, and a first real-time sensing control block RT #1.

The first output buffer block BUF #1 may be configured to output two or more scan signals SC to two or more scan signal lines SCL. For example, the first output buffer block BUF #1 may be configured to output the four scan signals SC1, SC2, SC3, and SC4 to the four scan signal lines SCL1, SCL2, SCL3, and SCL4, respectively.

The four scan signals SC1, SC2, SC3, and SC4 may include a first scan signal SC1 corresponding to an nth scan signal SC(n), a second scan signal SC2 corresponding to an (n+1)th scan signal SC(n+1), a third scan signal SC3 corresponding to an (n+2)th scan signal SC(n+2), and a fourth scan signal SC4 corresponding to an (n+3)th scan signal SC(n+3).

The first scan signal SC1 may be applied to the first scan signal line SCL1, the second scan signal SC2 may be applied to the second scan signal line SCL2, the third scan signal SC3 may be applied to the third scan signal line SCL3, and the fourth scan signal SC4 may be applied to the fourth scan signal line SCL4.

The first logic block LOGIC #1 may be configured to control the operation of the first output buffer block BUF #1 by controlling the voltage of each of the Q node and the QB node.

The first real-time sensing control block RT #1 may be configured to control the operation of the first output buffer block BUF #1 to output the first scan signal SC1 for sensing driving to the first subpixel SP where the real-time sensing driving is to be performed by controlling the voltage of each of the Q node and the QB node of the first gate driving panel circuit GPC #1 during the first real-time sensing driving period.

Referring to FIG. 9, as the gate driving panel circuit area GPCA is disposed between the first power line area PLA1 and the second power line area PLA2, the first power line area PLA1 and the second power line area PLA2 may be separated by the gate driving panel circuit area GPCA.

Accordingly, at least one gate high-potential voltage line disposed in the first power line area PLA1 and at least one gate low-potential voltage line disposed in the second power line area PLA2 may be separated by the gate driving panel circuit GPC disposed in the gate driving panel circuit area GPCA.

According to the above-described power supply arrangement, at least one high-potential voltage line and at least one low-potential voltage line do not overlap each other, and thus, the high-potential voltages (GVDD, GVDD2, GVDD_o/GVDD_e of FIG. 10) and the low-potential voltages (GVSS0, GVSS1, and GVSS2 of FIG. 10) may be stabilized.

Figure 10:
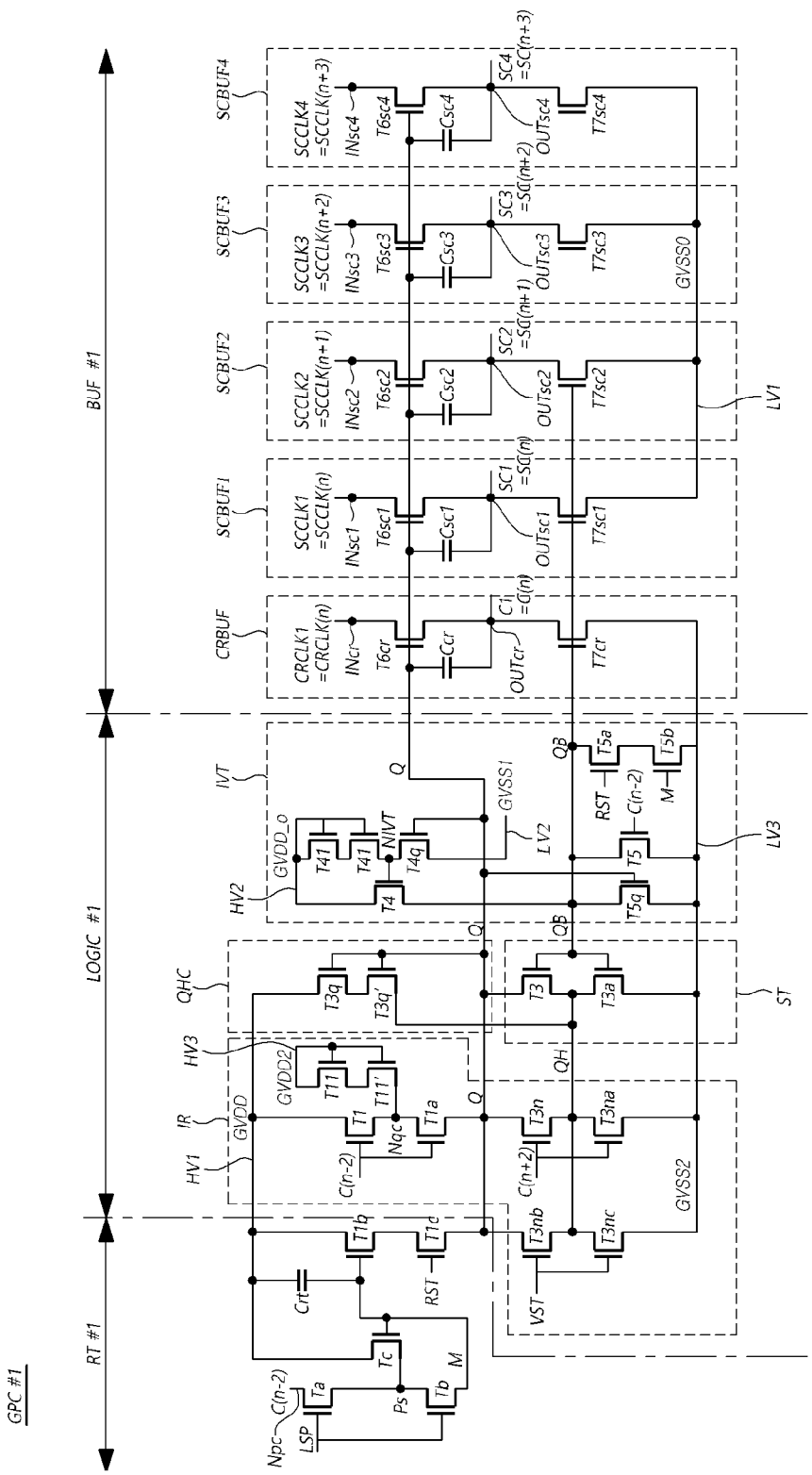
FIG. 10 illustrates a first gate driving panel circuit included in a gate driving panel circuit when the gate driving panel circuit is of a second type according to aspects of the disclosure.

FIG. 10 illustrates a first gate driving panel circuit GPC #1 included in a gate driving panel circuit GPC when the gate driving panel circuit GPC is of a second type according to aspects of the disclosure.

Hereinafter, for convenience of description, the nth scan signal SC(n) is referred to as the first scan signal SC1, the (n+1)th scan signal SC(n+1) is referred to as the second scan signal SC2, the (n+2)th scan signal SC(n+2) is referred to as the third scan signal SC3, and the (n+3)th scan signal SC(n+3) is referred to as the fourth scan signal SC4.

Hereinafter, for convenience of description, the nth scan clock signal SCCLK(n) is referred to as the first scan clock signal SCCLK1, the (n+1)th scan clock signal SCCLK(n+1) is referred to as the second scan clock signal SCCLK2, the (n+2)th scan clock signal SCCLK(n+2) is referred to as the third scan clock signal SCCLK3, and the (n+3)th scan clock signal SCCLK(n+3) is referred to as the fourth scan clock signal SCCLK4.

Hereinafter, for convenience of description, the nth carry signal C(n) is referred to as the first carry signal C1, and the nth carry clock signal CRCLK(n) is referred to as the first carry clock signal CRCLK1.

Referring to FIG. 10, the first gate driving panel circuit GPC #1 may include a first output buffer block BUF #1, a first logic block LOGIC #1, and a first real-time sensing control block RT #1.

As compared to the first type of first gate driving panel circuit GPC #1 illustrated in FIG. 8, the second type of first gate driving panel circuit GPC #1 illustrated in FIG. 10 has the same basic structure and configuration except that the input carry signals are somewhat different, and the first output buffer block BUF #1 is different. Accordingly, the following description of the second type of first gate driving panel circuit GPC #1 illustrated in FIG. 10 focuses primarily on differences from the first type of first gate driving panel circuit GPC #1 illustrated in FIG. 8.

Referring to FIG. 10, the first output buffer block BUF #1 may include a carry output buffer CRBUF and two or more scan output buffers. For example, the first output buffer block BUF #1 may include a carry output buffer CRBUF, a first scan output buffer SCBUF1, a second scan output buffer SCBUF2, a third scan output buffer SCBUF3, and a fourth scan output buffer SCBUF4.

Referring to FIG. 10, the carry output buffer CRBUF may include a carry pull-up transistor T6cr and a carry pull-down transistor T7cr.

The carry pull-up transistor T6cr may be turned on or off according to the voltage of the Q node, thereby controlling the connection between the carry clock node INcr to which the first carry clock signal CRCLK1 is input and the carry output node OUTcr where the first carry signal C1 is output.

The gate node of the carry pull-up transistor T6cr may be the Q node or may be electrically connected to the Q node. The source node (or drain node) of the carry pull-up transistor T6cr may be the carry output node OUTcr or may be electrically connected to the carry output node OUTcr. The drain node (or source node) of the carry pull-up transistor T6cr may be the carry clock node INcr or may be electrically connected to the carry clock node INcr.

The carry pull-up transistor T6cr may be turned on to output the first carry clock signal CRCLK1 as the first carry signal C1 having a high-level voltage.

The carry output buffer CRBUF may further include a carry bootstrapping capacitor Ccr connected between the gate node and the source node (or the drain node) of the carry pull-up transistor T6cr.

The carry-pull-down transistor T7cr may be turned on or off according to the voltage of the QB node, thereby controlling the connection between the third gate low-potential node LV3 to which the third gate low-potential voltage GVSS2 is input and the carry output node OUTcr where the first carry signal C1 is output.

The gate node of the carry pull-down transistor T7cr may be the QB node or may be electrically connected to the QB node. The drain node or the source node of the carry pull-down transistor T7cr may be the third gate low-potential node LV3 or may be electrically connected to the third gate low-potential node LV3, and the source node or the drain node of the carry pull-down transistor T7cr may be the carry output node OUTcr or may be electrically connected to the carry output node OUTcr. The carry pull-down transistor T7cr may be turned on to output the third gate low-potential voltage GVSS2 as the first carry signal C1 having a low-level voltage.

Referring to FIG. 10, the first scan output buffer SCBUF1 may be configured to output the first scan signal SC1 having a turn-on level voltage or a turn-off level voltage to the first scan output node OUTsc1. The first scan signal SC1 output to the first scan output node OUTsc1 may be applied to the first scan signal line SCL1 electrically connected to the first scan output node OUTsc1.

Referring to FIG. 10, the first scan output buffer SCBUF1 may include a first scan pull-up transistor T6sc1 and a first scan pull-down transistor T7sc1.

The first scan pull-up transistor T6sc1 may be turned on or off according to the voltage of the Q node, thereby controlling the connection between the first scan clock node INsc1 to which the first scan clock signal SCCLK1 is input and the first scan output node OUTsc1 where the first scan signal SC1 is output.

The gate node of the first scan pull-up transistor T6sc1 may be the Q node or may be electrically connected to the Q node. The source node (or drain node) of the first scan pull-up transistor T6sc1 may be the first scan output node OUTsc1 or may be electrically connected to the first scan output node OUTsc1. The drain node (or source node) of the first scan pull-up transistor T6sc1 may be the first scan clock node INsc1 or may be electrically connected to the first scan clock node INsc1.

The first scan pull-up transistor T6sc1 may be turned on to output the first scan clock signal SCCLK1, as the first scan signal SC1 having a turn-on level voltage (e.g., a high-level voltage), to the first scan output node OUTsc1.

The first scan output buffer SCBUF1 may further include a first scan bootstrapping capacitor Csc1 connected between the gate node and the source node (or the drain node) of the first scan pull-up transistor T6sc1.

The first scan pull-down transistor T7sc1 may be turned on or off according to the voltage of the QB node, thereby controlling the connection between the first gate low-potential node LV1 to which the first gate low-potential voltage GVSS0 is input and the first scan output node OUTsc1 where the first scan signal SC1 is output.

The gate node of the first scan pull-down transistor T7sc1 may be the QB node or may be electrically connected to the QB node. The drain node or the source node of the first scan pull-down transistor T7sc1 may be the first gate low-potential node LV1 or may be electrically connected to the first gate low-potential node LV1. The source node or the drain node of the first scan pull-down transistor T7sc1 may be the first scan output node OUTsc1 or may be electrically connected to the first scan output node OUTsc1.

The first scan pull-down transistor T7sc1 may be turned on to output the first gate low-potential voltage GVSS0, as the first scan signal SC1 having a turn-off level voltage (e.g., a low-level voltage), to the first scan output node OUTsc1.

Referring to FIG. 10, the second scan output buffer SCBUF2 may be configured to output the second scan signal SC2 having the turn-on level voltage or the turn-off level voltage to the second scan output node OUTsc2. The second scan signal SC2 output to the second scan output node OUTsc2 may be applied to the second scan signal line SCL2 electrically connected to the second scan output node OUTsc2.

Referring to FIG. 10, the second scan output buffer SCBUF2 may include a second scan pull-up transistor T6sc2 and a second scan pull-down transistor T7sc2.

The second scan pull-up transistor T6sc2 may be turned on or off according to the voltage of the Q node, thereby controlling the connection between the second scan clock node INsc2 to which the second scan clock signal SCCLK2 is input and the second scan output node OUTsc2 where the second scan signal SC2 is output.

The gate node of the second scan pull-up transistor T6sc2 may be the Q node or may be electrically connected to the Q node. The source node (or drain node) of the second scan pull-up transistor T6sc2 may be the second scan output node OUTsc2 or may be electrically connected to the second scan output node OUTsc2. The drain node (or source node) of the second scan pull-up transistor T6sc2 may be the second scan clock node INsc2 or may be electrically connected to the second scan clock node INsc2.

The second scan pull-up transistor T6sc2 may be turned on to output the second scan clock signal SCCLK2, as the second scan signal SC2 having a turn-on level voltage (e.g., a high-level voltage), to the second scan output node OUTsc2.

The second scan output buffer SCBUF2 may further include a second scan bootstrapping capacitor Csc2 connected between the gate node and the source node (or the drain node) of the second scan pull-up transistor T6sc2.

The second scan pull-down transistor T7sc2 may be turned on or off according to the voltage of the QB node, thereby controlling the connection between the first gate low-potential node LV1 to which the first gate low-potential voltage GVSS0 is input and the second scan output node OUTsc2 where the second scan signal SC2 is output.

The gate node of the second scan pull-down transistor T7sc2 may be the QB node or may be electrically connected to the QB node. The drain node or the source node of the second scan pull-down transistor T7$sc2$ may be the first gate low-potential node LV1 or may be electrically connected to the first gate low-potential node LV1. The source node or drain node of the second scan pull-down transistor T7$sc2$ may be the second scan output node OUTsc2 or may be electrically connected to the second scan output node OUTsc2.

The second scan pull-down transistor T7$sc2$ may be turned on to output the first gate low-potential voltage GVSS0, as the second scan signal SC2 having a turn-off level voltage (e.g., a low-level voltage), to the second scan output node OUTsc2.

Referring to FIG. 10, the third scan output buffer SCBUF3 may be configured to output the third scan signal SC3 having a turn-on level voltage or a turn-off level voltage to the third scan output node OUTsc3. The third scan signal SC3 output to the third scan output node OUTsc3 may be applied to the third scan signal line SCL3 electrically connected to the third scan output node OUTsc3.

Referring to FIG. 10, the third scan output buffer SCBUF3 may include a third scan pull-up transistor T6$sc3$ and a third scan pull-down transistor T7$sc3$.

The third scan pull-up transistor T6$sc3$ may be turned on or off according to the voltage of the Q node, thereby controlling the connection between the third scan clock node INsc3 to which the third scan clock signal SCCLK3 is input and the third scan output node OUTsc3 where the third scan signal SC3 is output.

The gate node of the third scan pull-up transistor T6$sc3$ may be the Q node or may be electrically connected to the Q node. The source node (or drain node) of the third scan pull-up transistor T6$sc3$ may be the third scan output node OUTsc3 or may be electrically connected to the third scan output node OUTsc3. The drain node (or source node) of the third scan pull-up transistor T6$sc3$ may be the third scan clock node INsc3 or may be electrically connected to the third scan clock node INsc3.

The third scan pull-up transistor T6$sc3$ may be turned on to output the third scan clock signal SCCLK3, as the third scan signal SC3 having a turn-on level voltage (e.g., a high-level voltage), to the third scan output node OUTsc3.

The third scan output buffer SCBUF3 may further include a third scan bootstrapping capacitor Csc3 connected between the gate node and the source node (or the drain node) of the third scan pull-up transistor T6$sc3$.

The third scan pull-down transistor T7$sc3$ may be turned on or off according to the voltage of the QB node, thereby controlling the connection between the first gate low-potential node LV1 to which the first gate low-potential voltage GVSS0 is input and the third scan output node OUTsc3 where the third scan signal SC3 is output.

The gate node of the third scan pull-down transistor T7$sc3$ may be the QB node or may be electrically connected to the QB node. The drain node or the source node of the third scan pull-down transistor T7$sc3$ may be the first gate low-potential node LV1 or may be electrically connected to the first gate low-potential node LV1. The source node or drain node of the third scan pull-down transistor T7$sc3$ may be the third scan output node OUTsc3 or may be electrically connected to the third scan output node OUTsc3.

The third scan pull-down transistor T7$sc3$ may be turned on to output the first gate low-potential voltage GVSS0, as the third scan signal SC3 having a turn-off level voltage (e.g., a low-level voltage), to the third scan output node OUTsc3.

Referring to FIG. 10, the fourth scan output buffer SCBUF4 may be configured to output the fourth scan signal SC4 having the turn-on level voltage or the turn-off level voltage to the fourth scan output node OUTsc4. The fourth scan signal SC4 output to the fourth scan output node OUTsc4 may be applied to the fourth scan signal line SCL4 electrically connected to the fourth scan output node OUTsc4.

Referring to FIG. 10, the fourth scan output buffer SCBUF4 may include a fourth scan pull-up transistor T6$sc4$ and a fourth scan pull-down transistor T7$sc4$.

The fourth scan pull-up transistor T6$sc4$ may be turned on or off according to the voltage of the Q node, thereby controlling the connection between the fourth scan clock node INsc4 to which the fourth scan clock signal SCCLK4 is input and the fourth scan output node OUTsc4 where the fourth scan signal SC4 is output.

The gate node of the fourth scan pull-up transistor T6$sc4$ may be the Q node or may be electrically connected to the Q node. The source node (or drain node) of the fourth scan pull-up transistor T6$sc4$ may be the fourth scan output node OUTsc4 or may be electrically connected to the fourth scan output node OUTsc4. The drain node (or source node) of the fourth scan pull-up transistor T6$sc4$ may be the fourth scan clock node INsc4 or may be electrically connected to the fourth scan clock node INsc4.

The fourth scan pull-up transistor T6$sc4$ may be turned on to output the fourth scan clock signal SCCLK4, as the fourth scan signal SC4 having a turn-on level voltage (e.g., a high-level voltage), to the fourth scan output node OUTsc4.

The fourth scan output buffer SCBUF4 may further include a fourth scan bootstrapping capacitor Csc4 connected between the gate node and the source node (or the drain node) of the fourth scan pull-up transistor T6$sc4$.

The fourth scan pull-down transistor T7$sc4$ may be turned on or off according to the voltage of the QB node, thereby controlling the connection between the first gate low-potential node LV1 to which the first gate low-potential voltage GVSS0 is input and the fourth scan output node OUTsc4 where the fourth scan signal SC4 is output.

The gate node of the fourth scan pull-down transistor T7$sc4$ may be the QB node or may be electrically connected to the QB node. The drain node or the source node of the fourth scan pull-down transistor T7$sc4$ may be the first gate low-potential node LV1 or may be electrically connected to the first gate low-potential node LV1. The source node or drain node of the fourth scan pull-down transistor T7$sc4$ may be the fourth scan output node OUTsc4 or may be electrically connected to the fourth scan output node OUTsc4.

The fourth scan pull-down transistor T7$sc4$ may be turned on to output the first gate low-potential voltage GVSS0, as the fourth scan signal SC4 having a turn-off level voltage (e.g., a low-level voltage), to the fourth scan output node OUTsc4.

The respective gate nodes of the carry pull-up transistor T6$cr$, the first scan pull-up transistor T6$sc1$, the second scan pull-up transistor T6$sc2$, the third scan pull-up transistor T6$sc3$, and the fourth scan pull-up transistor T6$sc4$ included in the first output buffer block BUF #1 may be electrically connected.

The Q node may be shared by the carry output buffer CRBUF, the first scan output buffer SCBUF1, the second scan output buffer SCBUF2, the third scan output buffer SCBUF3, and the fourth scan output buffer SCBUF4 included in the first output buffer block BUF #1. The Q node may be electrically connected to the respective gate nodes of the carry pull-up transistor T6$cr$, the first scan pull-up transistor T6$sc1$, the second scan pull-up transistor T6$sc2$, the third scan pull-up transistor T6sc3, and the fourth scan pull-up transistor T6sc4. This structure may also be referred to as a "Q node sharing structure."

The respective gate nodes of the carry-pull-down transistor T7cr, the first scan-pull-down transistor T7sc1, the second scan-pull-down transistor T7sc2, the third scan-pull-down transistor T7sc3, and the fourth scan-pull-down transistor T7sc4 included in the first output buffer block BUF #1 may be connected.

The QB node may be shared by the carry output buffer CRBUF, the first scan output buffer SCBUF1, the second scan output buffer SCBUF2, the third scan output buffer SCBUF3, and the fourth scan output buffer SCBUF4 included in the first output buffer block BUF #1. The QB node may be electrically connected to the respective gate nodes of the carry-pull-down transistor T7cr, the first scan-pull-down transistor T7sc1, the second scan-pull-down transistor T7sc2, the third scan-pull-down transistor T7sc3, and the fourth scan-pull-down transistor T7sc4 included in the first output buffer block BUF #1.

Referring to FIG. 10, the first logic block LOGIC #1 is the circuit block for controlling the voltages of the Q node and the QB node to control the operation of the first output buffer block BUF #1, and may include an input/reset block IR, a stabilization block ST, and an inverter block IVT.

Referring to FIG. 10, the first logic block LOGIC #1 may further include a holding node control block QHC for controlling the voltage of the holding node QH node. The holding node control block QHC may be connected between the first gate high-potential node HV1 and the holding node QH node.

The first logic block LOGIC #1 illustrated in FIG. 10 is the same as the circuit configuration of the first logic block LOGIC #1 illustrated in FIG. 8, except for the following matters.

As a first difference, in the input/reset block IR of the first logic block LOGIC #1 illustrated in FIG. 10, the gate node of the first Q node charge transistor T1 and the gate node of the second Q node charge transistor T1a may be electrically connected to each other to receive the (n−2)th carry signal C(n−2) together, and the gate node of the first Q node discharge transistor T3n and the gate node of the second Q node discharge transistor T3na may be electrically connected to each other to receive the (n+2)th carry signal C(n+2) together.

As a second difference, in the inverter block IVT of the first logic block LOGIC #1 illustrated in FIG. 10, the (n−2)th carry signal C(n−2) may be input to the gate node of the first QB node discharge transistor T5.

Hereinafter, the circuit configuration of the first logic block LOGIC #1 illustrated in FIG. 10 will be briefly described.

Referring to FIG. 10, the input/reset block IR is a circuit block for controlling charging and discharging of the Q node, and may include a Q node charging block connected between the first gate high-potential node HV1 and the Q node and a Q node discharging block connected between the Q node and the third gate low-potential node LV3. Here, the first gate high-potential voltage GVDD may be input to the first gate high-potential node HV1. The third gate low-potential voltage GVSS2 may be input to the third gate low-potential node LV3.

Referring to FIG. 10, the Q node charge block of the input/reset block IR may include at least one Q node charge transistor for controlling the connection between the first gate high-potential node HV1 and the Q node by being turned on or off according to the (n−2)th carry signal C(n−2) to charge the Q node.

For example, the Q node charge block of the input/reset block IR may include a first Q node charge transistor T1 and a second Q node charge transistor T1a connected in series between the first gate high-potential node HV1 and the Q node.

Referring to FIG. 10, the Q node charge block of the input/reset block IR may further include a first Q node charge control transistor T11 and a second Q node charge control transistor T11' connected in series between the third gate high-potential node HV3 and the Q node charge control node Nqc to control the Q node charge control node Nqc. Here, the third gate high-potential voltage GVDD2 may be applied to the third gate high-potential node HV3.

Referring to FIG. 10, the Q node discharge block of the input/reset block IR may include a first Q node discharge transistor T3n and a second Q node discharge transistor T3na connected in series between the Q node and the third gate low-potential node LV3 to discharge the Q node.

Referring to FIG. 10, the Q node discharge block of the input/resetblock IR may further include a third Q node discharge transistor T3nb and a fourth Q node discharge transistor T3nc connected in series between the Q node and the third gate low-potential node LV3 to discharge the Q node.

Referring to FIG. 10, the stabilization block ST may be a circuit block that stabilizes the Q node and the output according to the voltage of the QB node during a period when the output signal of the gate driving panel circuit GPC has a turn-off level voltage.

Referring to FIG. 10, the stabilization block ST may include a first stabilization transistor T3 and a second stabilization transistor T3a that are turned on or off according to the voltage of the QB node to control the connection between the Q node and the third gate low-potential node LV3.

Referring to FIG. 10, the inverter block IVT may be a circuit block that controls the inverted voltage level of the voltage level of the Q node to be the voltage level of the QB node according to the voltage of the Q node.

Referring to FIG. 10, the inverter block IVT may include a QB node charge transistor T4 for charging the QB node.

Referring to FIG. 10, the inverter block IVT may further include a first inverter control transistor T4q for controlling the voltage of the inverter control node NIVT corresponding to the gate node of the QB node charge transistor T4.

Referring to FIG. 10, the inverter block IVT may further include a second inverter control transistor T41 for controlling the voltage of the inverter control node NIVT.

Referring to FIG. 10, to discharge the QB node, the inverter block IVT may include a first QB node discharge transistor T5 connected between the QB node and the third gate low-potential node LV3 and turned on or off according to the (n−2)th carry signal C(n−2).

Referring to FIG. 10, to discharge the QB node, the inverter block IVT may further include a second QB node discharge transistor T5q connected between the QB node and the third gate low-potential node LV3 and turned on or off according to a voltage of the Q node.

Referring to FIG. 10, the inverter block IVT may further include a third QB node discharge transistor T5a and a fourth QB node discharge transistor T5b connected in series between the QB node and the third gate low-potential node LV3 to discharge the QB node.

Referring to FIG. 10, among the plurality of QB node discharge transistors T5, T5$q$, T5$a$, and T5$b$ included in the inverter block IVT, the first QB node discharge transistor T5 and the second QB node discharge transistor T5$q$ may be configured to discharge the QB node for display driving during the active period ACT, and the third QB node discharge transistor T5$a$ and the fourth QB node discharge transistor T5$b$ may be configured to discharge the QB node for sensing driving during the blank period BLANK.

Referring to FIG. 10, the holding node control block QHC may include a first holding node control transistor T3$q$ and a second holding node control transistor T3$q$' connected in series between the first gate high-potential node HV1 and the holding node QH node.

The respective gate nodes of the first holding node control transistor T3$q$ and the second holding node control transistor T3$q$' may be connected to the Q node together.

Referring to FIG. 10, the first real-time sensing control block RT #1 may be a circuit block for controlling the operation of the first output buffer block BUF #1 for real-time sensing driving. The first real-time sensing control block RT #1 may be configured to control the voltage of the Q node such that the first scan signal SC1 is output at a predetermined timing by the first output buffer block BUF #1 during the blank period BLANK.

Referring to FIG. 10, the first real-time sensing control block RT #1 may control the first scan signal SC1 to be output to one of the plurality of scan signal lines SCL by the first output buffer block BUF #1 during the blank period BLANK. Accordingly, sensing may be performed on the subpixel SP included in any one of the plurality of subpixel lines.

Referring to FIG. 10, the first real-time sensing control block RT #1 may include a first sensing control transistor Ta, a second sensing control transistor Tb, a third sensing control transistor Tc, a fourth sensing control transistor T1$b$, and a fifth sensing control transistor T1$c$.

Referring to FIG. 10, the first real-time sensing control block RT #1 may include a sensing control capacitor Crt connected between the first gate high-potential node HV1 and the intermediate node M.

Figure 11:
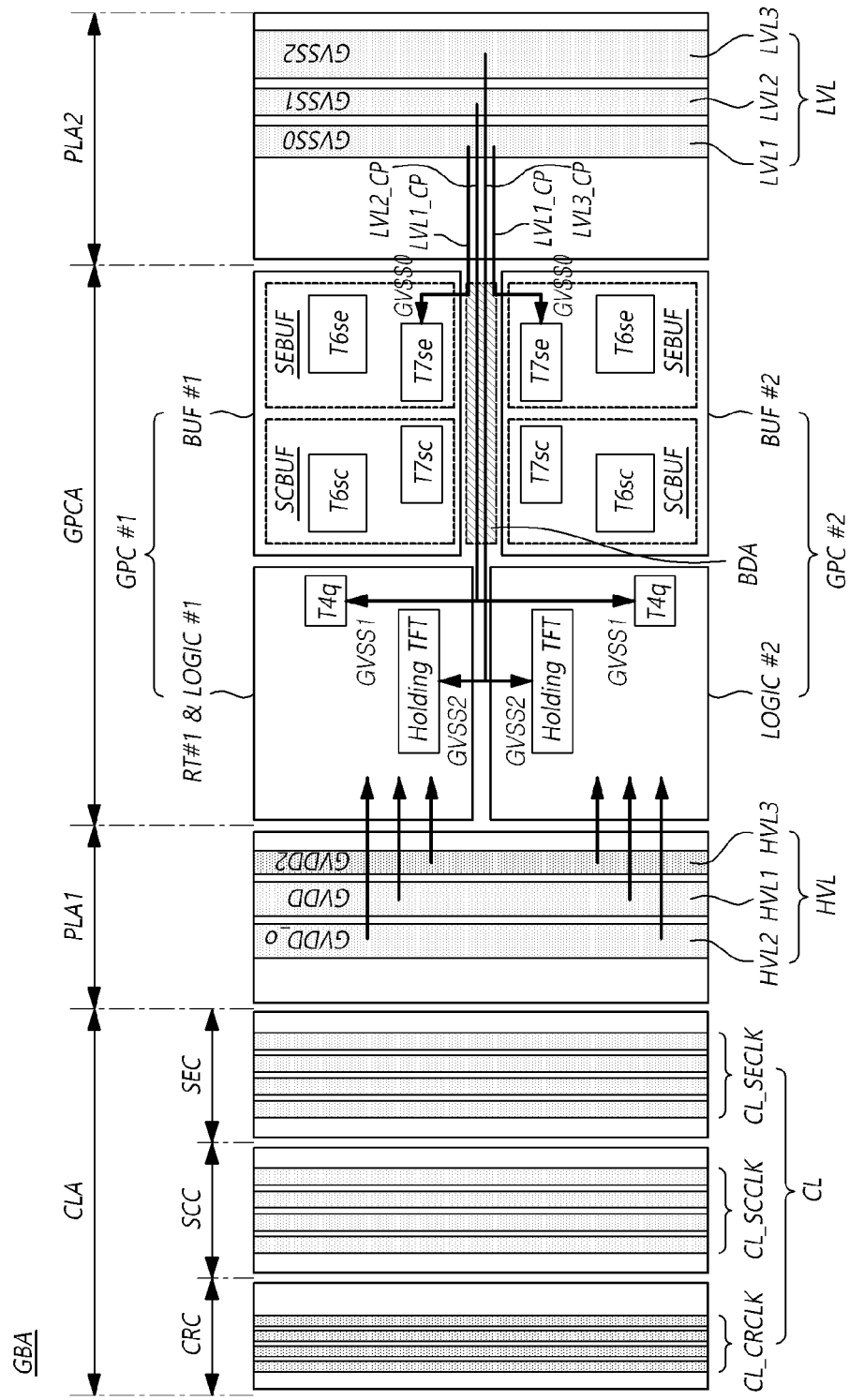
FIG. 11 is a plan view illustrating a gate bezel area in a display panel when a gate driving panel circuit is of a first type according to aspects of the disclosure.

FIG. 11 is a plan view illustrating a gate bezel area GBA in a display panel 110 when a first gate driving panel circuit GPC #1 and a second gate driving panel circuit GPC #2 are of a first type according to aspects of the disclosure.

Referring to FIG. 11, the first type of first gate driving panel circuit GPC #1 and the first type of second gate driving panel circuit GPC #2 may be disposed in the gate driving panel circuit area GPCA.

Referring to FIG. 11, the first gate driving panel circuit GPC #1 may include a first output buffer block BUF #1, a first logic block LOGIC #1, and a first real-time sensing control block RT #1. The second gate driving panel circuit GPC #2 may include a second output buffer block BUF #2, a second logic block LOGIC #2, and the first real-time sensing control block RT #1. The first real-time sensing control block RT #1 may be shared by the first gate driving panel circuit GPC #1 and the second gate driving panel circuit GPC #2.

Referring to FIG. 11, the first output buffer block BUF #1 of the first gate driving panel circuit GPC #1 may include a scan output buffer SCBUF for outputting the first scan signal SC1 and a sensing scan output buffer SEBUF for outputting the first sensing signal SE1.

The second output buffer block BUF #2 of the second gate driving panel circuit GPC #2 may include a scan output buffer SCBUF for outputting the second scan signal SC2 and a sensing scan output buffer SEBUF for outputting the second sensing signal SE2.

Referring to FIG. 11, the scan output buffer SCBUF included in each of the first output buffer block BUF #1 and the second output buffer block BUF #2 may include a scan pull-up transistor T6$sc$ and a scan pull-down transistor T7$sc$.

The sensing output buffer SEBUF included in each of the first output buffer block BUF #1 and the second output buffer block BUF #2 may include a sensing pull-up transistor T6$se$ and a sensing pull-down transistor T7$se$.

The gate bezel area GBA in the non-display area NDA of the display panel 110 may include a central area BDA separating the first output buffer block BUF #1 and the second output buffer block BUF #2.

The display panel 110 may further include a first gate low-potential voltage connection line LVL1_CP for connecting the first gate low-potential voltage line LVL1 disposed in the second power line area PLA2 to the first output buffer block BUF #1 and the second output buffer block BUF #2.

The display panel 110 may further include a second gate low-potential voltage connection line LVL2_CP for connecting the second gate low-potential voltage line LVL2 disposed in the second power line area PLA2 to the first logic block LOGIC #1 and the second logic block LOGIC #2.

The display panel 110 may further include a third gate low-potential voltage connection line LVL3_CP for connecting the third gate low-potential voltage line LVL3 disposed in the second power line area PLA2 to the first logic block LOGIC #1 and the second logic block LOGIC #2.

The first gate low-potential voltage connection line LVL1_CP, the second gate low-potential voltage connection line LVL2_CP, and the third gate low-potential voltage connection line LVL3_CP may pass through the central area BDA.

Referring to FIG. 11, the scan output buffer SCBUF of the first output buffer block BUF #1 and the scan output buffer SCBUF of the second output buffer block BUF #2 may have a symmetrical structure with respect to the central area BDA.

For example, the positions or shapes of the elements included in the scan output buffer SCBUF of the first output buffer block BUF #1 and the positions or shapes of the elements included in the scan output buffer SCBUF of the second output buffer block BUF #2 may be symmetrical with respect to the central area BDA. Here, elements included in the scan output buffer SCBUF may include transistors T6$sc$ and T7$sc$ and capacitors Csc.

Referring to FIG. 11, the sensing output buffer SEBUF of the first output buffer block BUF #1 and the sensing output buffer SEBUF of the second output buffer block BUF #2 may have a symmetrical structure with respect to the central area BDA.

For example, the positions or shapes of the elements included in the sensing output buffer SEBUF of the first output buffer block BUF #1 and the positions or shapes of the elements included in the sensing output buffer SEBUF of the second output buffer block BUF #2 may be symmetrical with respect to the central area BDA. Here, elements included in the sensing output buffer SEBUF may include transistors T6$se$ and T7$se$ and capacitors Cse.

Referring to FIG. 11, the clock signal line area CLA may be positioned on one side of the gate driving panel circuit area GPCA, and may be an area in which a plurality of clock signal lines CL are disposed.

For example, the clock signal line area CLA may include a carry clock signal line area CRC, a scan clock signal line area SCC, and a sensing clock signal line area SEC.

The plurality of clock signal lines CL may include a plurality of carry clock signal lines CL_CRCLK disposed in the carry clock signal line area CRC, a plurality of scan clock signal lines CL_SCCLK disposed in the scan clock signal line area SCC, and a plurality of sensing clock signal lines CL_SECLK disposed in the sensing clock signal line area SEC.

Each of the plurality of carry clock signal lines CL_CRCLK, the plurality of scan clock signal lines CL_SCCLK, and the plurality of sensing clock signal lines CL_SECLK requires load reduction for gate driving, and thus may have a multi-layer line structure.

The scan clock signal SCCLK and the sensing clock signal SECLK may be more sensitive to signal delay or signal waveform change in terms of driving than the carry clock signal CRCLK. Accordingly, to reduce the load of the plurality of scan clock signal lines CL_SCCLK and the plurality of sensing clock signal lines CL_SECLK, the line width of each of the plurality of scan clock signal lines CL_SCCLK and the plurality of sensing clock signal lines CL_SECLK may be designed to be larger than the line width of each of the plurality of carry clock signal lines CL_CRCLK.

Referring to FIG. 11, the plurality of scan clock signal lines CL_SCCLK may be disposed between the plurality of carry clock signal lines CL_CRCLK and the plurality of sensing clock signal lines CL_SECLK. The plurality of carry clock signal lines CL_CRCLK may be positioned farther from the gate driving panel circuit area GPCA than the plurality of sensing clock signal lines CL_SECLK.

Referring to FIG. 11, the first power line area PLA1 may include a gate high-potential voltage line HVL positioned on one side of the gate driving panel circuit area GPCA and disposed in the column direction.

For example, the gate high-potential voltage line HVL may include a first gate high-potential voltage line HVL1 for transferring the first gate high-potential voltage GVDD to the first gate driving panel circuit GPC #1 and the second gate driving panel circuit GPC #2, a second gate high-potential voltage line HVL2 for transferring the second gate high-potential voltage GVDD_o to the first gate driving panel circuit GPC #1 and the second gate driving panel circuit GPC #2, and a third gate high-potential voltage line HVL3 for transferring the third gate high-potential voltage GVDD2 to the first gate driving panel circuit GPC #1 and the second gate driving panel circuit GPC #2.

The first gate high-potential voltage line HVL1 may be the first gate high-potential node HV1 or may be electrically connected to the first gate high-potential node HV1. The second gate high-potential voltage line HVL2 may be the second gate high-potential node HV2 or may be electrically connected to the second gate high-potential node HV2. The third gate high-potential voltage line HVL3 may be the third gate high-potential node HV3 or may be electrically connected to the third gate high-potential node HV3.

The first gate high-potential voltage GVDD, the second gate high-potential voltage GVDD_o, and the third gate high-potential voltage GVDD2 may be supplied to the first logic block LOGIC #1 included in the first gate driving panel circuit GPC #1 and the second logic block LOGIC #2 included in the second gate driving panel circuit GPC #2.

Among the first gate high-potential voltage GVDD, the second gate high-potential voltage GVDD_o, and the third gate high-potential voltage GVDD2, the first gate high-potential voltage GVDD may also be supplied to the first real-time sensing control block RT #1 included in the first gate driving panel circuit GPC #1.

Referring to FIG. 11, the second power line area PLA2 may include a gate low-potential voltage line LVL positioned on the other side of the gate driving panel circuit area GPCA and disposed in the column direction.

For example, the gate low-potential voltage line LVL may include a first gate low-potential voltage line LVL1 for transferring the first gate low-potential voltage GVSS0 to the first gate driving panel circuit GPC #1 and the second gate driving panel circuit GPC #2, a second gate low-potential voltage line LVL2 for transferring the second gate low-potential voltage GVSS1 to the first gate driving panel circuit GPC #1 and the second gate driving panel circuit GPC #2, and a third gate low-potential voltage line LVL3 for transferring the third gate low-potential voltage GVSS2 to the first gate driving panel circuit GPC #1 and the second gate driving panel circuit GPC #2.

The first gate low-potential voltage line LVL1 may be the first gate low-potential node LV1 or may be electrically connected to the first gate low-potential node LV1. The second gate low-potential voltage line LVL2 may be the second gate low-potential node LV2 or may be electrically connected to the second gate low-potential node LV2. The third gate low-potential voltage line LVL3 may be the third gate low-potential node LV3 or may be electrically connected to the third gate low-potential node LV3.

Referring to FIG. 11, the first gate low-potential voltage GVSS0 may be supplied to the scan output buffer SCBUF and the sensing output buffer SEBUF included in the first output buffer block BUF #1 of the first gate driving panel circuit GPC #1, and may be supplied to the scan output buffer SCBUF and the sensing output buffer SEBUF included in the second output buffer block BUF #2 of the second gate driving panel circuit GPC #2.

The first gate low-potential voltage GVSS0 may be applied to the drain nodes or the source nodes of the scan pull-down transistor T7sc and the sensing pull-down transistor T7se included in the first output buffer block BUF #1, and may be applied to the drain nodes or the source nodes of the scan pull-down transistor T7sc and the sensing pull-down transistor T7se included in the second output buffer block BUF #2.

The first gate low-potential voltage connection line LVL1_CP may electrically connect the drain nodes or the source nodes of the scan pull-down transistor T7sc and the sensing pull-down transistor T7se included in the first output buffer block BUF #1 to the first gate low-potential voltage line LVL1.

Further, the first gate low-potential voltage connection line LVL1_CP may electrically connect the drain nodes or the source nodes of the scan pull-down transistor T7sc and the sensing pull-down transistor T7se included in the second output buffer block BUF #2 to the first gate low-potential voltage line LVL1.

The first gate low-potential voltage connection line LVL1_CP may be disposed in the row direction and may pass through the central area BDA.

Referring to FIG. 11, the second gate low-potential voltage GVSS1 may be supplied to the first logic block LOGIC

1 of the first gate driving panel circuit GPC #1 and the second logic block LOGIC #2 of the second gate driving panel circuit GPC #2.

The second gate low-potential voltage GVSS1 may be applied to the drain node or the source node of the first inverter control transistor T4q included in the first logic block LOGIC #1, and may be applied to the drain node or the source node of the first inverter control transistor T4q included in the second logic block LOGIC #2.

The second gate low-potential voltage connection line LVL2_CP may electrically connect the drain node or the source node of the first inverter control transistor T4q included in the first logic block LOGIC #1 to the second gate low-potential voltage line LVL2. Further, the second gate low-potential voltage connection line LVL2_CP may electrically connect the drain node or the source node of the first inverter control transistor T4q included in the second logic block LOGIC #2 to the second gate low-potential voltage line LVL2.

Referring to FIG. 11, the third gate low-potential voltage GVSS2 may be supplied to the first logic block LOGIC #1 of the first gate driving panel circuit GPC #1, and may be supplied to the second logic block LOGIC #2 of the second gate driving panel circuit GPC #2.

The third gate low-potential voltage GVSS2 may be included in each of the first logic block LOGIC #1 and the second logic block LOGIC #2 and may be applied to the drain nodes or source nodes of the holding transistors Holding TFT connected to the third gate low-potential node LV3. Here, the holding transistors Holding TFTs may include a second Q node discharge transistor T3na, a fourth Q node discharge transistor T3nc, a second stabilization transistor T3a, a second QB node discharge transistor T5q, a first QB node discharge transistor T5, and a fourth QB node discharge transistor T5b.

The third gate low-potential voltage connection line LVL3_CP may be included in each of the first logic block LOGIC #1 and the second logic block LOGIC #2, and may electrically connect the drain nodes or source nodes of holding transistors Holding TFT connected to the third gate low-potential node LV3 to the third gate low-potential voltage line LVL3.

Further, the third gate low-potential voltage GVSS2 may be applied to the drain node or source node of the carry-pull-down transistor T7cr included in the carry output buffer CRBUF of each of the first output buffer block BUF #1 and the second output buffer block BUF #2.

As described above, since the first output buffer block BUF #1 and the second output buffer block BUF #2 have a symmetric structure with respect to the central area BDA, efficient transfer (supply) of the gate low-potential voltages GVSS0, GVSS1, and GVSS2 may be possible.

The use and structure of the first to third gate high-potential voltage lines HVL1, HVL2, and HVL3 and the use and structure of the first to third gate low-potential voltage lines LVL1, LVL2, and LVL3 are described below.

The first gate high-potential voltage GVDD transferred through the first gate high-potential voltage line HVL1 may be a high-potential voltage supplied to the Q node charge block of the input/reset block IR of each of the first logic block LOGIC #1 and the second logic block LOGIC #2 and used when charging the Q node. For example, the first gate high-potential voltage GVDD transferred through the first gate high-potential voltage line HVL1 may be a high-potential voltage used to charge the Q node by being connected to the drain node or source node of the first Q node charge transistor T1.

Further, the first gate high-potential voltage GVDD transferred through the first gate high-potential voltage line HVL1 may be a high-potential voltage supplied to the first real-time sensing control block RT #1 and used to charge the Q node during the real-time sensing driving period.

The second gate high-potential voltage GVDD_o transferred through the second gate high-potential voltage line HVL2 may be a high-potential voltage supplied to the inverter block IVT of each of the first logic block LOGIC #1 and the second logic block LOGIC #2 and used to charge the QB node.

The third gate high-potential voltage GVDD2 transferred through the third gate high-potential voltage line HVL3 may be applied to the drain node (or source node) and the gate node of the first Q node charge control transistor T11 included in each of the first logic block LOGIC #1 and the second logic block LOGIC #2, and may be applied to the Q node charge control node Nqc through the first Q node charge control transistor T11. The first Q node charge control transistor T11 included in each of the first logic block LOGIC #1 and the second logic block LOGIC #2 may serve to compensate for the negative threshold voltage of the first Q node charge transistor T1.

The first gate low-potential voltage GVSS0 transferred through the first gate low-potential voltage line LVL1 may be supplied to the scan output buffer SCBUF and the sensing output buffer SEBUF of the first output buffer block BUF #1 to change the voltage levels of the first scan signal SC1 and the first sensing signal SE1 to the turn-off voltage level. Accordingly, driving of the first scan signal line SCL1 and the first sensing signal line SENL1 may be turned off.

The first gate low-potential voltage GVSS0 transferred through the first gate low-potential voltage line LVL1 may be supplied to the scan output buffer SCBUF and the sensing output buffer SEBUF of the second output buffer block BUF #2 to change the voltage levels of the second scan signal SC2 and the second sensing signal SE2 to the turn-off voltage level. Accordingly, driving of the second scan signal line SCL2 and the second sensing signal line SENL2 may be turned off.

The second gate low-potential voltage GVSS1 transferred through the second gate low-potential voltage line LVL2 may be a low-potential voltage applied to the drain node or source node of the first inverter control transistor T4q included in the inverter block IVT of each of the first logic block LOGIC #1 and the second logic block LOGIC #2.

The second gate low-potential voltage GVSS1 may be configured as a separate low-potential voltage separated from the third gate low-potential voltage GVSS2.

The third gate low-potential voltage GVSS2 transferred through the third gate low-potential voltage line LVL3 may be a low-potential voltage supplied to each of the first logic block LOGIC #1 and the second logic block LOGIC #2 and used to discharge (or turn off) the Q node and to discharge (or turn off) the QB node.

The third gate low-potential voltage GVSS2 transferred through the third gate low-potential voltage line LVL3 may be a power voltage supplied to the largest number of transistors.

Since the first gate high-potential voltage GVDD, the second gate high-potential voltage GVDD_o, the first gate low-potential voltage GVSS0, the second gate low-potential voltage GVSS1, and the third gate low-potential voltage GVSS2 directly affect the outputs of the first gate driving panel circuit GPC #1 and the second gate driving panel circuit GPC #2, it may be better to reduce the line resistance of each of the first gate high-potential voltage line HVL1, the second gate high-potential voltage line HVL2, the first gate low-potential voltage line LVL1, the second gate low-potential voltage line LVL2, and the third gate low-potential voltage line LVL3.

Accordingly, the first gate high-potential voltage line HVL1, the second gate high-potential voltage line HVL2, the first gate low-potential voltage line LVL1, the second gate low-potential voltage line LVL2, and the third gate low-potential voltage line LVL3 may have a multi-layer line structure.

The first Q node charge control transistor T11 connected to the third gate high-potential voltage line HVL3 does not require a high voltage. Further, there are many lines crossing and overlapping the third gate high-potential voltage line HVL3. Thus, the third gate high-potential voltage line HVL3 may have a single-layer line structure.

Figure 12:
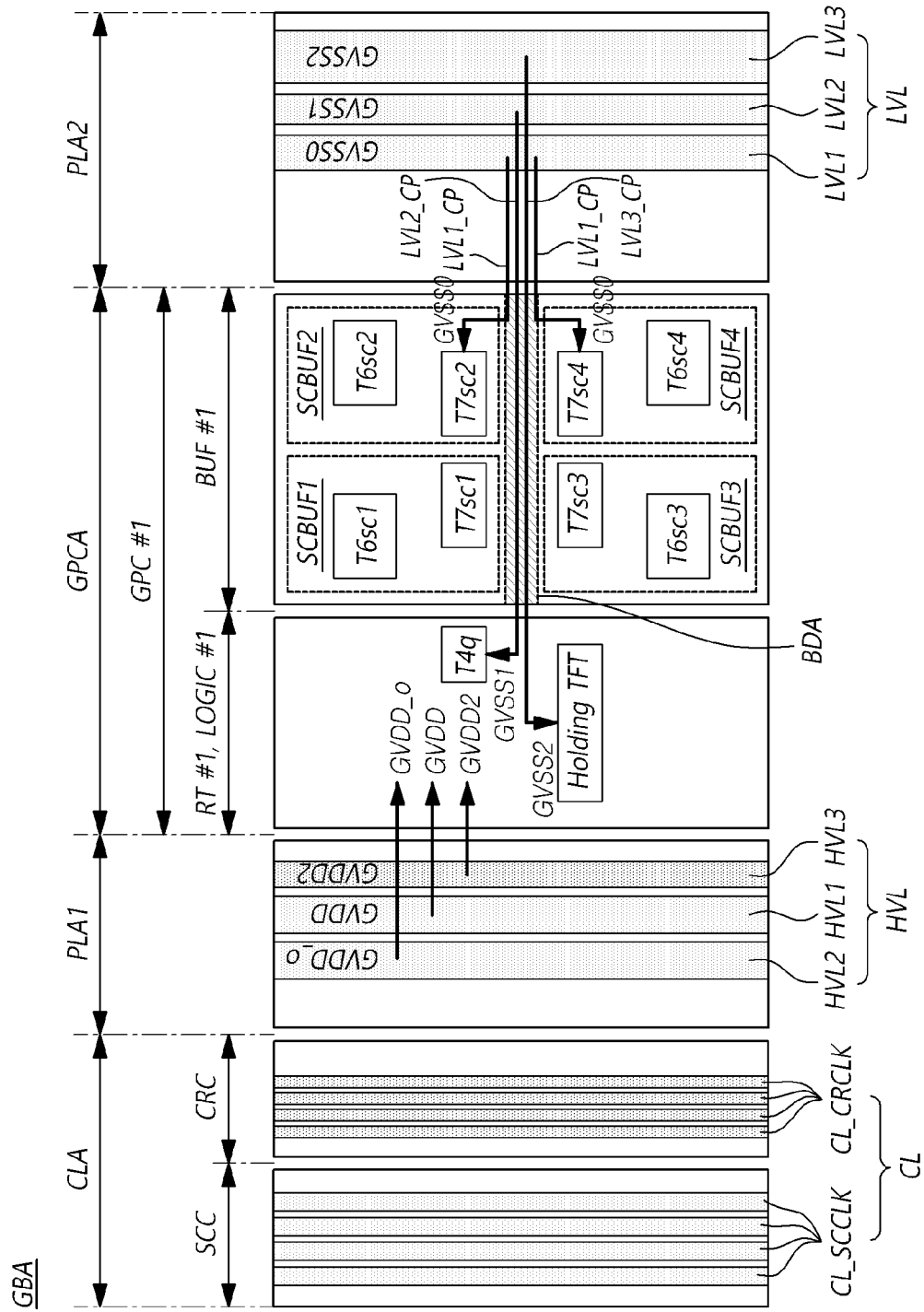
FIG. 12 is a plan view illustrating a gate bezel area in a display panel when a gate driving panel circuit is of a second type according to aspects of the disclosure.

FIG. 12 is a plan view illustrating a gate bezel area GBA in a display panel 110 when a first gate driving panel circuit GPC #1 is of a second type according to aspects of the disclosure.

Referring to FIG. 12, a first output buffer block BUF #1, a first logic block LOGIC #1, and a first real-time sensing control block RT #1 may be disposed in the gate driving panel circuit area GPCA.

Referring to FIG. 12, the first output buffer block BUF #1 may include a first scan output buffer SCBUF1 for outputting the first scan signal SC1, a second scan output buffer SCBUF2 for outputting the second scan signal SC2, a third scan output buffer SCBUF3 for outputting the third scan signal SC3, and a fourth scan output buffer SCBUF4 for outputting the fourth scan signal SC4.

Referring to FIG. 12, the four scan output buffers SCBUF1 to SCBUF4 may include two upper scan output buffers disposed above the central area BDA and two lower scan output buffers disposed below the central area BDA. For example, the two upper scan output buffers may be a first scan output buffer SCBUF1 and a second scan output buffer SCBUF2, and the two lower scan output buffers may be a third scan output buffer SCBUF3 and a fourth scan output buffer SCBUF4. Accordingly, the first scan output buffer SCBUF1 and the second scan output buffer SCBUF2 may be positioned in a first direction with respect to the central area BDA, and the third scan output buffer SCBUF3 and the fourth scan output buffer SCBUF4 may be positioned in a direction opposite to the first direction with respect to the central area BDA.

Referring to FIG. 12, the first scan output buffer SCBUF1 and the second scan output buffer SCBUF2, which are two upper scan output buffers, and the third scan output buffer SCBUF3 and the fourth scan output buffer SCBUF4, which are two lower scan output buffers, may have a symmetrical structure with respect to the central area BDA of the first output buffer block BUF #1.

The positions and/or shapes of the circuit components T7sc1, T7sc2, T6sc1, and T6sc2 included in each of the two upper scan output buffers and the circuit components T7sc3, T7sc4, T6sc3, and T6sc4 included in each of the two lower scan output buffers may be symmetrical with respect to the central area BDA.

Referring to FIG. 12, the two upper scan output buffers may have a left-right symmetric structure. The two lower scan output buffers may have a left-right symmetric structure.

For example, the first scan output buffer SCBUF1 and the second scan output buffer SCBUF2 may be two upper scan output buffers disposed above the central area BDA, and the third scan output buffer SCBUF3 and the fourth scan output buffer SCBUF4 may be two lower scan output buffers disposed below the central area BDA.

For example, the two upper scan output buffers SCBUF1 and SCBUF2 and the two lower scan output buffers SCBUF3 and SCBUF4 may have a symmetrical structure with respect to the central area BDA. In other words, the positions and shapes of circuit components included in each of the two upper scan output buffers SCBUF1 and SCBUF2 and the two lower scan output buffers SCBUF3 and SCBUF4 may be symmetrical to each other with respect to the central area BDA.

For example, the two upper scan output buffers SCBUF1 and SCBUF2 may have a left-right symmetric structure. The two lower scan output buffers SCBUF3 and SCBUF4 may have a left-right symmetric structure.

Referring to FIG. 12, the clock signal line area CLA may be positioned on one side of the gate driving panel circuit area GPCA, and may be an area in which a plurality of clock signal lines CL are disposed.

For example, the plurality of clock signal lines CL may include a plurality of scan clock signal lines CL_SCCLK and a plurality of carry clock signal lines CL_CRCLK.

Each of the plurality of scan clock signal lines CL_SCCLK and the plurality of carry clock signal lines CL_CRCLK may have a multi-layer line structure because load reduction is required for gate driving.

The scan clock signal SCCLK may be more sensitive to signal delay or signal waveform change in terms of driving than the carry clock signal CRCLK. Accordingly, to reduce the load of the plurality of scan clock signal lines CL_SCCLK, the line width of each of the plurality of scan clock signal lines CL_SCCLK may be designed to be larger than the line width of each of the plurality of carry clock signal lines CL_CRCLK.

Referring to FIG. 12, the plurality of scan clock signal lines CL_SCCLK may be positioned farther from the first gate driving panel circuit GPC #1 than the plurality of carry clock signal lines CL_CRCLK.

Referring to FIG. 12, the first power line area PLA1 may include a gate high-potential voltage line HVL positioned on one side of the gate driving panel circuit area GPCA and disposed in the column direction.

For example, the gate high-potential voltage line HVL may include a first gate high-potential voltage line HVL1 for transferring the first gate high-potential voltage GVDD to the first gate driving panel circuit GPC #1, a second gate high-potential voltage line HVL2 for transferring the second gate high-potential voltage GVDD_o to the first gate driving panel circuit GPC #1, and a third gate high-potential voltage line HVL3 for transferring the third gate high-potential voltage GVDD2 to the first gate driving panel circuit GPC #1.

The first gate high-potential voltage line HVL1 may be the first gate high-potential node HV1 or may be electrically connected to the first gate high-potential node HV1. The second gate high-potential voltage line HVL2 may be the second gate high-potential node HV2 or may be electrically connected to the second gate high-potential node HV2. The third gate high-potential voltage line HVL3 may be the third gate high-potential node HV3 or may be electrically connected to the third gate high-potential node HV3.

The first gate high-potential voltage GVDD, the second gate high-potential voltage GVDD_o, and the third gate high-potential voltage GVDD2 may be supplied to the first logic block LOGIC #1 included in the first gate driving panel circuit GPC #1.

Among the first gate high-potential voltage GVDD, the second gate high-potential voltage GVDD_o, and the third gate high-potential voltage GVDD2, the first gate high-potential voltage GVDD may also be supplied to the first real-time sensing control block RT #1 included in the first gate driving panel circuit GPC #1.

Referring to FIG. 12, the second power line area PLA2 may include a gate low-potential voltage line LVL positioned on the other side of the gate driving panel circuit area GPCA and disposed in the column direction.

For example, the gate low-potential voltage line LVL may include a first gate low-potential voltage line LVL1 for transferring the first gate low-potential voltage GVSS0 to the first gate driving panel circuit GPC #1, a second gate low-potential voltage line LVL2 for transferring the second gate low-potential voltage GVSS1 to the first gate driving panel circuit GPC #1, and a third gate low-potential voltage line LVL3 for transferring the third gate low-potential voltage GVSS2 to the first gate driving panel circuit GPC #1.

The first gate low-potential voltage line LVL1 may be the first gate low-potential node LV1 or may be electrically connected to the first gate low-potential node LV1. The second gate low-potential voltage line LVL2 may be the second gate low-potential node LV2 or may be electrically connected to the second gate low-potential node LV2. The third gate low-potential voltage line LVL3 may be the third gate low-potential node LV3 or may be electrically connected to the third gate low-potential node LV3.

Referring to FIG. 12, the first gate low-potential voltage GVSS0 may be supplied to the first to fourth scan output buffers SCBUF1, SCBUF2, SCBUF3, and SCBUF4 included in the first output buffer block BUF #1 of the first gate driving panel circuit GPC #1.

The first gate low-potential voltage GVSS0 may be applied to the drain nodes or source nodes of the first to fourth scan pull-down transistors T7sc1, T7sc2, T7sc3, and T7sc4 respectively included in the first to fourth scan output buffers SCBUF1, SCBUF2, SCBUF3, and SCBUF4.

To that end, referring to FIG. 12, the display panel 110 may further include a plurality of gate low-potential voltage connection lines LVL1_CP, LVL2_CP, and LVL3_CP for connecting the plurality of gate low-potential voltage lines LVL1, LVL2, and LVL3 disposed in the second power line area PLA2 and the first gate driving panel circuit GPC #1 disposed in the gate driving panel circuit area GPCA.

Referring to FIG. 12, the plurality of gate low-potential voltage connection lines LVL1_CP, LVL2_CP, and LVL3_CP may pass through the central area BDA in the area of the first output buffer block BUF #1.

Referring to FIG. 12, the first gate low-potential voltage connection line LVL1_CP for electrically connecting the drain nodes or the source nodes of the first and second scan pull-down transistors T7sc1 and T7sc2 included in the two upper scan output buffers SCBUF1 and SCBUF2 to the first gate low-potential voltage line LVL1 may be disposed while extending in the row direction. The first gate low-potential voltage connection line LVL1_CP for electrically connecting the drain nodes or the source nodes of the third and fourth scan pull-down transistors T7sc3 and T7sc4 included in the two lower scan output buffers SCBUF3 and SCBUF4 to the first gate low-potential voltage line LVL1 may be disposed while extending in the row direction.

The first gate low-potential voltage connection line LVL1_CP may pass through the central area BDA between the two upper scan output buffers SCBUF1 and SCBUF2 and the two lower scan output buffers SCBUF3 and SCBUF4.

Referring to FIG. 12, the second gate low-potential voltage GVSS1 may be supplied to the first logic block LOGIC #1 of the first gate driving panel circuit GPC #1.

The second gate low-potential voltage GVSS1 may be applied to the drain node or source node of the first inverter control transistor T4q included in the first logic block LOGIC #1.

To that end, the second gate low-potential voltage connection line LVL2_CP for connecting the drain node or the source node of the first inverter control transistor T4q included in the first logic block LOGIC #1 to the second gate low-potential voltage line LVL2 may be disposed while extending in the row direction.

The second gate low-potential voltage connection line LVL2_CP may pass through the central area BDA between the two upper scan output buffers SCBUF1 and SCBUF2 and the two lower scan output buffers SCBUF3 and SCBUF4.

Referring to FIG. 12, the third gate low-potential voltage GVSS2 may be supplied to the first logic block LOGIC #1 of the first gate driving panel circuit GPC #1.

The third gate low-potential voltage GVSS2 may be applied to the drain nodes or source nodes of the holding transistors Holding TFT included in the first logic block LOGIC #1 and connected to the third gate low-potential node LV3. Here, the holding transistors Holding TFTs may include a second Q node discharge transistor T3na, a fourth Q node discharge transistor T3nc, a second stabilization transistor T3a, a second QB node discharge transistor T5q, a first QB node discharge transistor T5, and a fourth QB node discharge transistor T5b.

Further, the third gate low-potential voltage GVSS2 may be applied to the drain node or source node of the carry pull-down transistor T7cr included in the carry output buffer CRBUF of the first output buffer block BUF #1.

To that end, the third gate low-potential voltage connection line LVL3_CP for connecting the drain nodes or the source nodes of the holding transistors Holding TFT included in the first logic block LOGIC #1 and connected to the third gate low-potential node LV3 to the third gate low-potential voltage line LVL3 may be disposed while extending in the row direction.

The third gate low-potential voltage connection line LVL3_CP may connect the drain node or source node of the carry pull-down transistor T7cr included in the carry output buffer CRBUF of the first output buffer block BUF #1 to the third gate low-potential voltage line LVL3.

The third gate low-potential voltage connection line LVL3_CP may pass through the central area BDA between the two upper scan output buffers SCBUF1 and SCBUF2 and the two lower scan output buffers SCBUF3 and SCBUF4.

As described above, since the two upper scan output buffers SCBUF1 and SCBUF2 and the two lower scan output buffers SCBUF3 and SCBUF4 included in the first output buffer block BUF #1 have a symmetric structure with respect to the central area BDA, efficient transfer (supply) of the gate low-potential voltages GVSS0, GVSS1, and GVSS2 may be possible.

The use and structure of the first to third gate high-potential voltage lines HVL1, HVL2, and HVL3 and the use and structure of the first to third gate low-potential voltage lines LVL1, LVL2, and LVL3 are described below.

The first gate high-potential voltage GVDD transferred through the first gate high-potential voltage line HVL1 may be a high-potential voltage supplied to the Q node charge block of the input/reset block IR and used to charge the Q node. For example, the first gate high-potential voltage GVDD transferred through the first gate high-potential voltage line HVL1 may be a high-potential voltage used to charge the Q node by being connected to the drain node or source node of the first Q node charge transistor T1.

Further, the first gate high-potential voltage GVDD transferred through the first gate high-potential voltage line HVL1 may be a high-potential voltage supplied to the real-time sensing control block RT #1 and used to charge the Q node during the real-time sensing driving period.

The second gate high-potential voltage GVDD_o transferred through the second gate high-potential voltage line HVL2 may be a high-potential voltage supplied to the inverter block IVT and used to charge the QB node.

The third gate high-potential voltage GVDD2 transferred through the third gate high-potential voltage line HVL3 may be applied to the drain node (or source node) and the gate node of the first Q node charge control transistor T11, and may be applied to the Q node charge control node Nqc through the first Q node charge control transistor T11. The first Q-node charge control transistor T11 may serve to compensate for the negative threshold voltage of the first Q-node charge transistor T1.

The first gate low-potential voltage GVSS0 transferred through the first gate low-potential voltage line LVL1 may be supplied to the first to fourth scan output buffers SCBUF1 to SCBUF4 of the first output buffer block BUF #1 to change the voltage levels of the first to fourth scan signals SC1 to SC4 to the turn-off voltage level, thereby turning off the driving of the first to fourth scan signal lines SCL1 to SCL4.

The second gate low-potential voltage GVSS1 transferred through the second gate low-potential voltage line LVL2 may be a low-potential voltage applied to the drain node or source node of the first inverter control transistor T4q included in the inverter block IVT.

The second gate low-potential voltage GVSS1 may be configured as a separate low-potential voltage separated from the third gate low-potential voltage GVSS2.

The third gate low-potential voltage GVSS2 transferred through the third gate low-potential voltage line LVL3 may be a low-potential voltage supplied to the first logic block LOGIC #1 and used to discharge (or turn off) the Q node and to discharge (or turn off) the QB node.

The third gate low-potential voltage GVSS2 transferred through the third gate low-potential voltage line LVL3 may be a power voltage supplied to the largest number of transistors.

Since the first gate high-potential voltage GVDD, the second gate high-potential voltage GVDD_o, the first gate low-potential voltage GVSS0, the second gate low-potential voltage GVSS1, and the third gate low-potential voltage GVSS2 directly affect the output of the first gate driving panel circuit GPC #1, it may be better to reduce the line resistance of each of the first gate high-potential voltage line HVL1, the second gate high-potential voltage line HVL2, the first gate low-potential voltage line LVL1, the second gate low-potential voltage line LVL2, and the third gate low-potential voltage line LVL3.

Accordingly, the first gate high-potential voltage line HVL1, the second gate high-potential voltage line HVL2, the first gate low-potential voltage line LVL1, the second gate low-potential voltage line LVL2, and the third gate low-potential voltage line LVL3 may have a multi-layer line structure.

The first Q node charge control transistor T11 connected to the third gate high-potential voltage line HVL3 does not require a high voltage. Further, there are many lines crossing and overlapping the third gate high-potential voltage line HVL3. Thus, the third gate high-potential voltage line HVL3 may have a single-layer line structure.

The structure of the gate bezel area GBA described with reference to FIG. 12 corresponds to the case in which the gate driving panel circuit GPC is of the second type. The structure of the gate bezel area GBA described with reference to FIG. 12 may be equally applied even when the gate driving panel circuit GPC is of the first type. For example, when the gate driving panel circuit GPC is of the first type, an area between the first gate driving panel circuit GPC #1 and the second gate driving panel circuit GPC #2 may be a central area BDA through which the first gate low-potential voltage connection line LVL1_CP, the second gate low-potential voltage connection line LVL2_CP, and the third gate low-potential voltage connection line LVL3_CP pass.

Hereinafter, a multi-layer line structure of the plurality of clock signal lines CL is described with reference to FIG. 13A, a multi-layer line structure of each of the first gate high-potential voltage line HVL1, the second gate high-potential voltage line HVL2, the first gate low-potential voltage line LVL1, the second gate low-potential voltage line LVL2, and the third gate low-potential voltage line LVL3 is described with reference to FIG. 13B, and a single-layer line structure of the third gate high-potential voltage line HVL3 is described with reference to FIG. 13C.

Figure 13A:
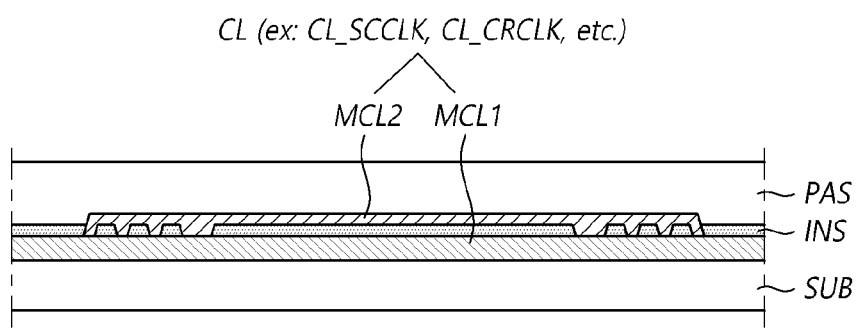
FIG. 13A illustrates a multi-layer line structure of a clock signal line in a gate bezel area in a display panel according to aspects of the disclosure.

FIG. 13A illustrates a multi-layer line structure of a clock signal line CL in a gate bezel area GBA in a display panel 110 according to aspects of the disclosure.

Referring to FIG. 13A, the plurality of clock signal lines CL disposed in the clock signal line area CLA may include a carry clock signal line CL_CRCLK and a scan clock signal line CL_SCCLK, or may further include a sensing clock signal line. All or some of the plurality of clock signal lines CL may be multi-layer lines.

Referring to FIG. 13A, the clock signal line CL having the multi-layer line structure may include a first metal clock signal line MCL1 and a second metal clock signal line MCL2 electrically connected to each other. The first metal clock signal line MCL1 and the second metal clock signal line MCL2 may be positioned on different layers and may be electrically connected to each other.

The first metal clock signal line MCL1 may be disposed in the first metal layer, which is a metal layer between the substrate SUB and the insulation layer INS on the substrate SUB.

The second metal clock signal line MCL2 may be disposed in the second metal layer, which is a metal layer between the insulation layer INS and a protection layer PAS on the insulation layer INS.

For example, the insulation layer INS may include a buffer layer and a gate insulation film.

The second metal clock signal line MCL2 may be connected to the first metal clock signal line MCL1 through a contact hole of the insulation layer INS.

For example, a light shield may be positioned under the active layer (channel) of the driving transistor DRT formed in the display area DA and may overlap the channel of the driving transistor DRT. An insulation layer (e.g., a buffer layer) may be disposed between the channel of the driving transistor DRT and the light shield. The light shield may be formed of a first metal (e.g., a light shield metal). In other words, the first metal layer may be a metal layer in which the light shield is disposed.

One of two or more capacitor electrodes constituting the storage capacitor Cst formed in the display area DA may be formed of the first metal (light shield metal). In other words, the first metal layer may be a metal layer where one of two or more capacitor electrodes constituting the storage capacitor Cst is disposed.

As another example, the source-drain electrode of the transistor may be formed of the first metal (e.g., source-drain metal). In other words, the first metal layer may be a metal layer where the source-drain electrode of the transistor is disposed.

For example, the scan signal line SCL and the sensing signal line SENL may be formed of a second metal (e.g., gate metal). In other words, the second metal layer may be a metal layer where the scan signal line SCL and the sensing signal line SENL are disposed. The second metal layer may be a metal layer where another one of the two or more capacitor electrodes constituting the storage capacitor Cst formed in the display area DA is disposed.

Figure 13B:
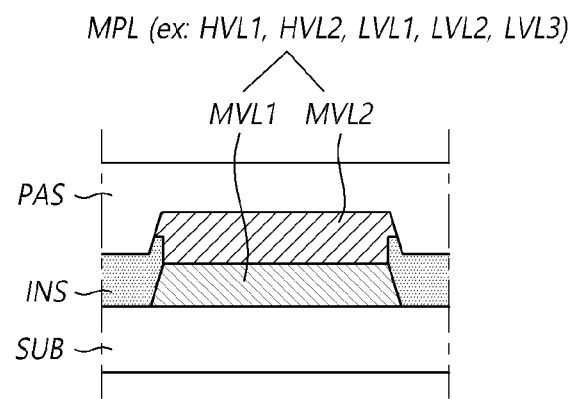
FIG. 13B illustrates a multi-layer structure of a multi-layer power line in a gate bezel area in a display panel according to aspects of the disclosure.

FIG. 13B illustrates a multi-layer line structure of a multi-layer power line MPL in a gate bezel area GBA in a display panel 110 according to aspects of the disclosure.

A multi-layer power line MPL having a multi-layer line structure may be disposed in the gate bezel area GBA.

The multi-layer power line MPL may include a first metal power line MVL1 and a second metal power line MVL2. The first metal power line MVL1 and the second metal power line MVL2 may be positioned on different layers and may be electrically connected to each other.

The first metal power line MVL1 may be disposed in the first metal layer between the substrate SUB and the insulation layer INS on the substrate SUB. The second metal power line MVL2 may be disposed in the second metal layer between the insulation layer INS and the protection layer PAS on the insulation layer INS. For example, the insulation layer INS may include a buffer layer and a gate insulation film.

The second metal power line MVL2 may be connected to the first metal power line MPL1 through a contact hole of the insulation layer INS.

For example, the first metal layer may be a metal layer where the light shield positioned under the channel of the driving transistor DRT formed in the display area DA is disposed. The first metal layer may be a metal layer where one of two or more capacitor electrodes constituting the storage capacitor Cst formed in the display area DA is disposed.

As another example, the first metal layer may be a metal layer constituting the source-drain electrode of the transistor.

For example, the second metal layer may be a metal layer constituting the scan signal line SCL and the sensing signal line SENL. The second metal layer may be a metal layer where another one of the two or more capacitor electrodes constituting the storage capacitor Cst formed in the display area DA is disposed.

For example, the multi-layer power line MPL having the multi-layer line structure may include a first gate high-potential voltage line HVL1, a second gate high-potential voltage line HVL2, a first gate low-potential voltage line LVL1, a second gate low-potential voltage line LVL2, and a third gate low-potential voltage line LVL3.

Figure 13C:
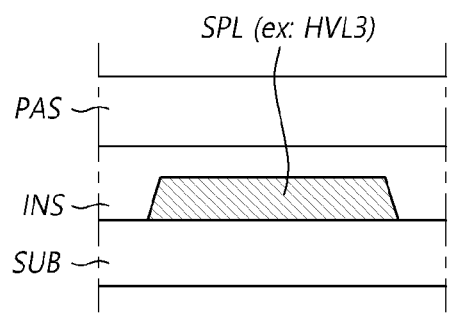
FIG. 13C illustrates a single-layer line structure of a single-layer power line in a gate bezel area in a display panel according to aspects of the disclosure.

FIG. 13C illustrates a single-layer line structure of a single-layer power line in a gate bezel area GBA in a display panel 110 according to aspects of the disclosure.

A single-layer power line SPL having a single-layer line structure may be disposed in the gate bezel area GBA.

The single-layer power line SPL may be disposed in the first metal layer between the substrate SUB and the insulation layer INS on the substrate SUB. For example, the insulation layer INS may include a buffer layer and a gate insulation film.

For example, the first metal layer may be a metal layer where the light shield positioned under the channel of the driving transistor DRT formed in the display area DA is disposed. The first metal layer may be a metal layer where one of two or more capacitor electrodes constituting the storage capacitor Cst formed in the display area DA is disposed.

As another example, the first metal layer may be a metal layer constituting the source-drain electrode of the transistor.

For example, the single-layer power supply line SPL having a single-layer line structure may include a third gate high-potential voltage line HVL3.

Referring to FIGS. 13A, 13B, and 13C, all or some of the plurality of clock signal lines CL may be multi-layer lines. Some of the plurality of gate high-potential voltage lines HVL may be single-layer lines and the others may be multi-layer lines. The plurality of gate low-potential voltage lines LVL may be multi-layer lines.

Figure 14:
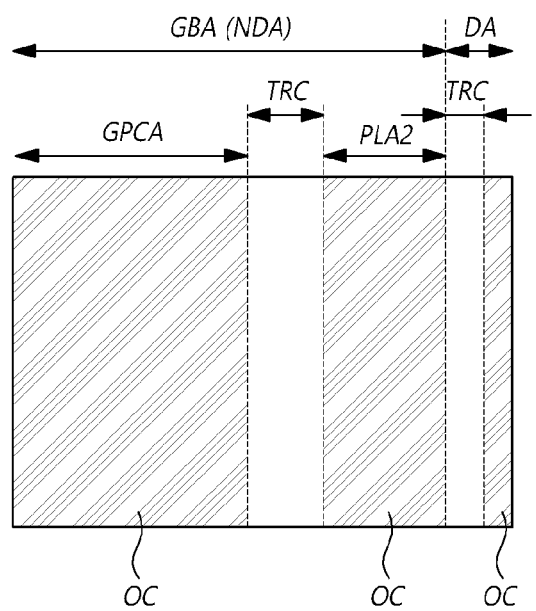
FIGS. 14 and 15 are a plan view and a cross-sectional view illustrating a partial area including a gate bezel area in a display panel according to aspects of the disclosure, respectively.

FIG. 14 is a plan view illustrating a partial area including a gate bezel area GBA in a display panel 110 according to aspects of the disclosure.

Referring to FIG. 14, the gate bezel area GBA in the non-display area NDA may include a gate driving panel circuit area GPCA and a second power line area PLA2.

Referring to FIG. 14, an overcoat layer OC may be disposed in the gate bezel area GBA in the non-display area NDA. At least one trench TRC where the overcoat layer OC has been removed may be present in the gate bezel area GBA.

For example, in the overcoat layer OC, a trench TRC may be formed in at least one of a first area between the gate driving panel circuit area GPCA and the second power line area PLA1 and a second area between the second power line area PLA2 and the display area DA.

For example, the trench TRC may be present in a first area between the gate driving panel circuit area GPCA and the second power line area PLA2. In other words, the overcoat layer OC may be disposed in each of the gate driving panel circuit area GPCA and the second power line area PLA1, and an area in which the overcoat layer OC is not present between the gate driving panel circuit area GPCA and the second power line area PLA1 may correspond to the trench TRC.

For example, a trench TRC may further be present in the second area between the second power line area PLA2 and the display area DA. In other words, an overcoat layer OC may be disposed in each of the second power line area PLA2 and the display area DA, and an area where the overcoat layer OC has been removed between the second power line area PLA2 and the display area DA may correspond to an additional trench TRC.

According to the above-described trench structure, moisture $H_2O$ may be prevented from penetrating into the light emitting layer EL.

Figure 15:
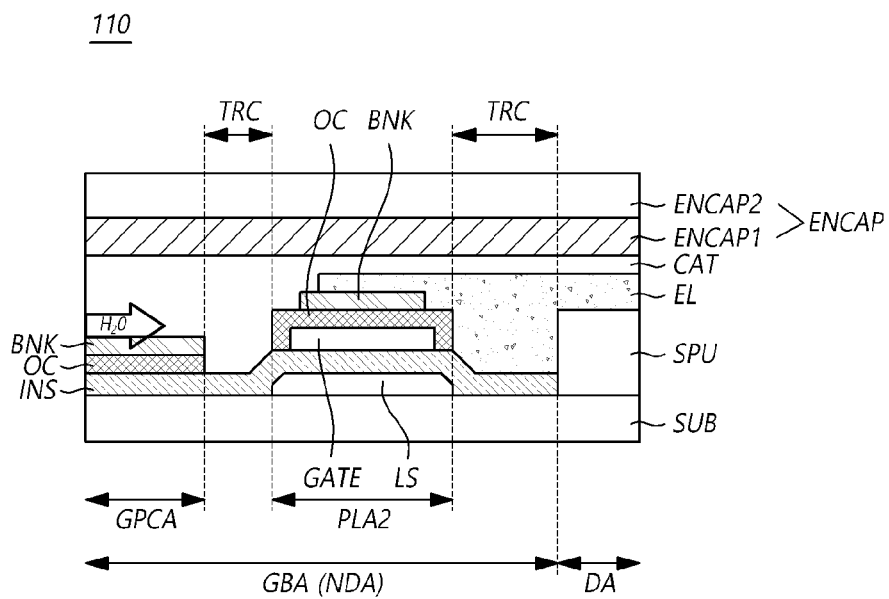

FIG. 15 is a cross-sectional view illustrating a partial area including a gate bezel area GBA in a display panel 110 according to aspects of the disclosure.

Referring to FIG. 15, in the second power line area PLA2 of the gate bezel area GBA, the light shield LS may be disposed on the substrate SUB.

In the gate bezel area GBA, the insulation layer INS may be disposed while covering the light shield LS.

In the second power line area PLA2 of the gate bezel area GBA, a gate material layer GATE may be disposed on the insulation layer INS and may overlap the light shield LS.

In the gate driving panel circuit area GPCA of the gate bezel area GBA, the overcoat layer OC may be disposed on the insulation layer INS.

In the second power line area PLA2 of the gate bezel area GBA, the overcoat layer OC may be disposed while covering the gate material layer GATE on the insulation layer INS.

In the gate driving panel circuit area GPCA and the second power line area PLA2 of the gate bezel area GBA, the bank BNK may be disposed on the overcoat layer OC.

In the gate bezel area GBA, a trench TRC where the overcoat layer OC and the bank BNK are absent may be formed between the gate driving panel circuit area GPCA and the second power line area PLA2.

In the gate bezel area GBA, an additional trench TRC where the overcoat layer OC and the bank BNK are absent may be formed between the second power line area PLA2 and the display area DA.

Meanwhile, in the display area DA, the light emitting layer EL may be disposed under the cathode electrode CAT, and a subpixel unit SPU may be disposed under the light emitting layer EL. The subpixel unit SPU may include an anode electrode AND, transistors (e.g., DRT, SCT, or SENT), and a storage capacitor Cst. The light emitting layer EL may extend to the gate bezel area GBA of the non-display area NDA.

For example, the light emitting layer EL may extend from the display area DA to the non-display area NDA and may extend to an upper portion of the bank BNK in the second power line area PLA2 via the trench TRC.

In the display area DA, the cathode electrode CAT may be disposed on the light emitting layer EL. The cathode electrode CAT may extend to the gate bezel area GBA of the non-display area NDA. Accordingly, the cathode electrode CAT may extend from the display area DA to the whole or part of the gate driving panel circuit area GPCA.

The cathode electrode CAT may also be present in the area in which the trench TRC between the gate driving panel circuit area GPCA and the second power line area PLA2 and the trench TRC between the second power line area PLA2 and the display area DA are present.

The encapsulation layer ENCAP may be disposed on the cathode electrode CAT. The encapsulation layer ENCAP may extend from the display area DA to a partial area of the non-display area NDA.

The encapsulation layer ENCAP may include a first encapsulation layer ENCAP1 on the cathode electrode CAT and a second encapsulation layer ENCAP2 on the first encapsulation layer ENCAP1.

Figure 16:
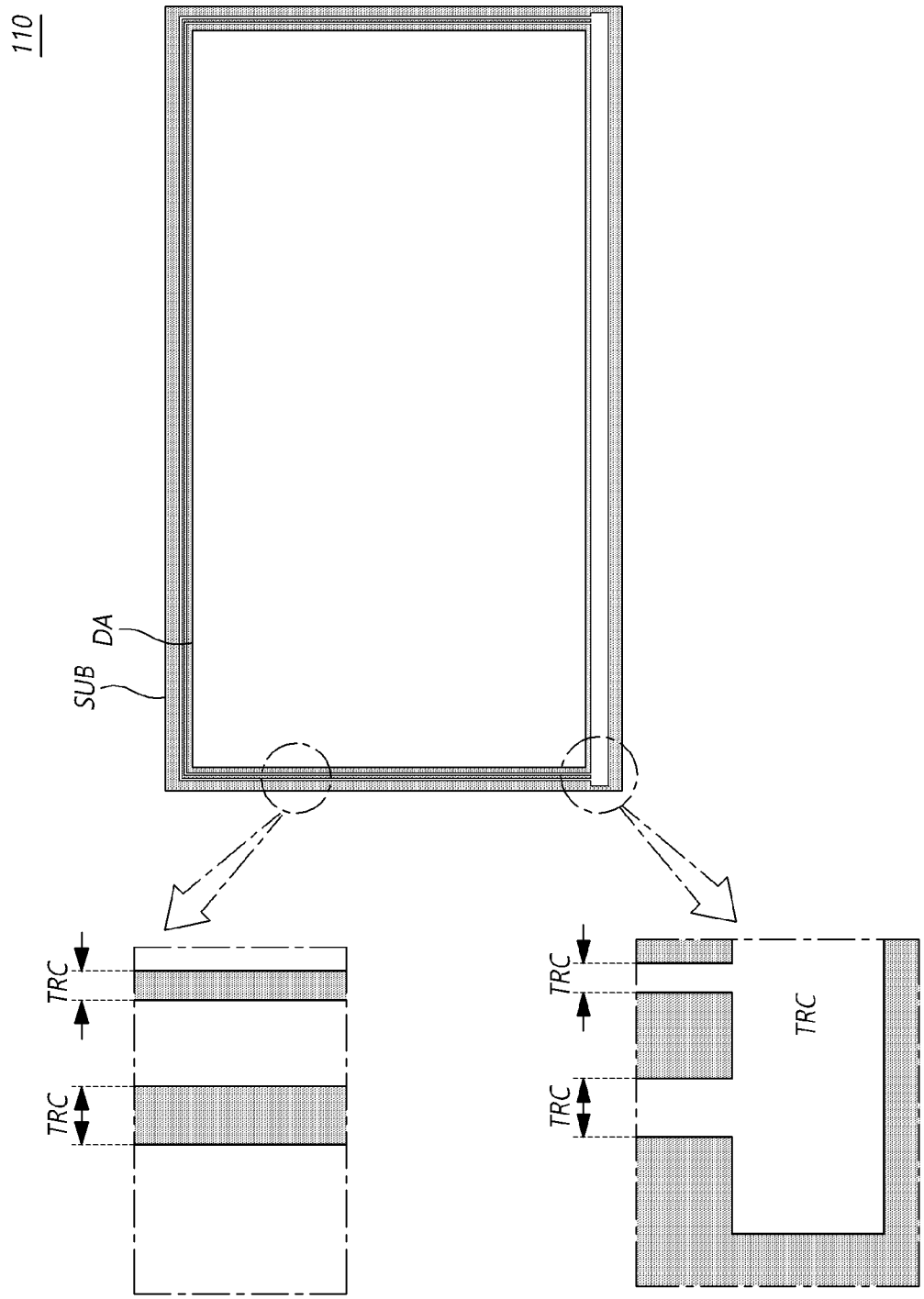
FIG. 16 is a plan view illustrating a display panel, in which a trench is formed in an entire periphery according to aspects of the disclosure.

FIG. 16 is a plan view illustrating a display panel 110, in which a trench TRC is formed in an entire outer periphery according to aspects of the disclosure.

Referring to FIG. 16, the trench TRC may be formed on the entire outer periphery of the display panel 110. In other words, the trench TRC may be present in the non-display area NDA while surrounding the display area DA.

Referring to FIG. 16, for example, two rows of trenches TRC as shown in FIGS. 14 and 15 may be formed in the three-sided outer area of the four-sided outer area of the display panel 110. For example, the width of the trenches TRC in one row may be greater than the width of each of the trenches TRC in two rows.

Referring to FIG. 16, for example, one row of trenches TRC may be formed in the one-sided outer area of the four-sided outer area of the display panel 110. The one-sided outer area in which one row of trenches TRC are formed may be an area connected with the circuit films CF on which the source driver integrated circuits SDIC are mounted.

Figure 17:
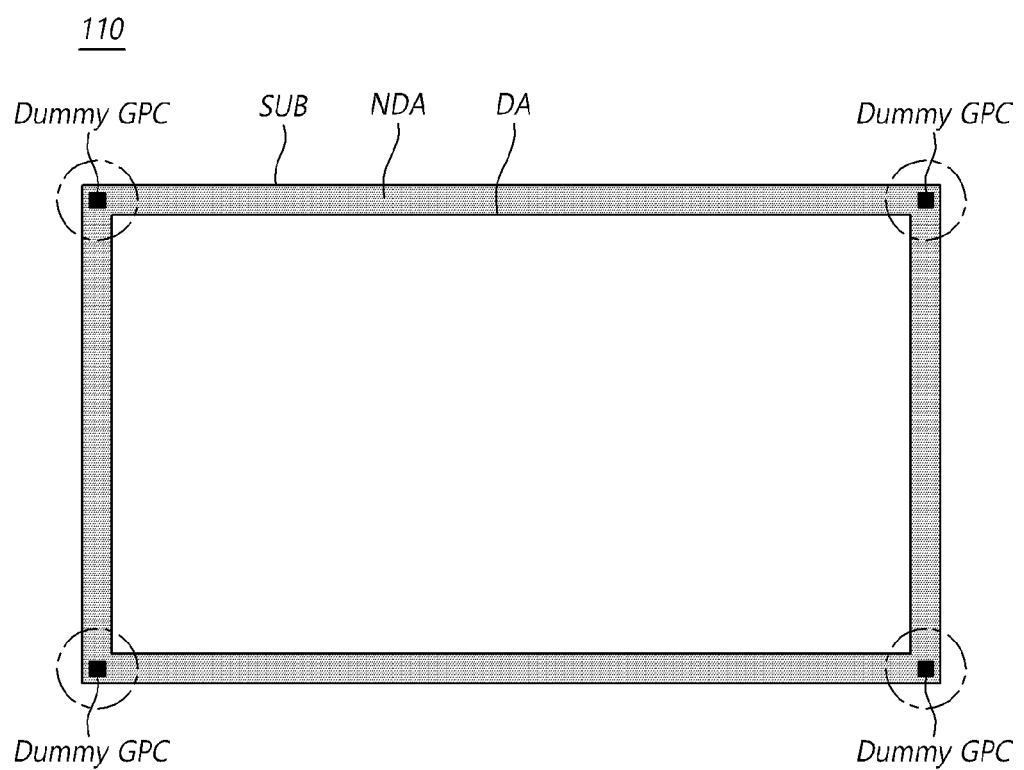
FIG. 17 is a plan view illustrating a display panel, in which a dummy gate driving panel circuit is formed at a corner point according to aspects of the disclosure.

FIG. 17 is a plan view of a display panel 110 according to aspects of the disclosure, and is a plan view of a display panel 110 in which a dummy gate driving panel circuit Dummy GPC is formed at a corner point.

Referring to FIG. 17, the display panel 110 according to aspects of the disclosure may include a dummy gate driving panel circuit Dummy GPC disposed at all or some of a plurality of corner points of the non-display area NDA.

The dummy gate driving panel circuit Dummy GPC has basically the same structure as the first type or second type of gate driving panel circuit GPC. However, the dummy gate driving panel circuit Dummy GPC is not connected to the gate line GL actually used for display driving. Here, each gate line GL may be a scan signal line SCL or a sensing signal line SENL.

Figure 18:
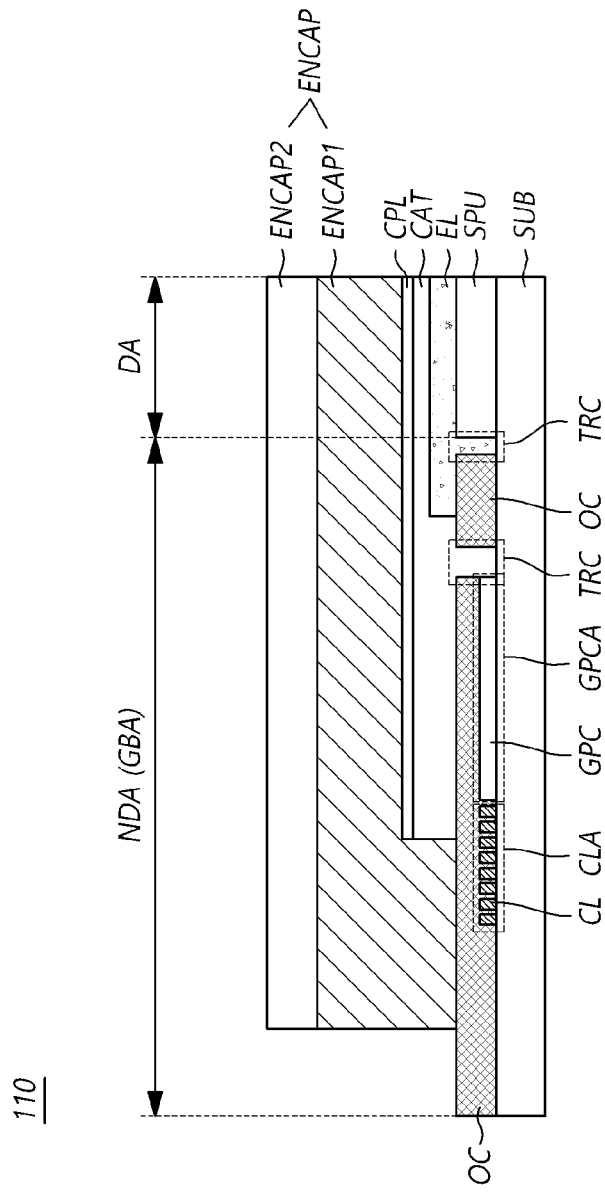
FIG. 18 is a cross-sectional view illustrating a partial area of a display panel according to aspects of the disclosure.

FIG. 18 is a cross-sectional view illustrating a partial area of a display panel 110 according to aspects of the disclosure. Here, the partial area may include a portion of the gate bezel area GBA and the display area DA.

The cross-sectional view illustrated in FIG. 18 is a cross-sectional view of an area including the gate bezel area GBA where the gate driving panel circuit GPC is disposed in the non-display area NDA of the display panel 110 and a portion of the display area DA near the gate bezel area GBA.

Referring to FIG. 18, the display panel 110 according to aspects of the disclosure may include a substrate SUB, a gate driving panel circuit GPC, a plurality of clock signal lines CL, an overcoat layer OC, a cathode electrode CAT, and the like.

The substrate SUB may be divided into a display area DA and a non-display area NDA.

The gate driving panel circuit GPC may be disposed on the substrate SUB, may be disposed in the gate driving panel circuit area GPCA included in the gate bezel area GBA of the non-display area NDA, and may be configured to output a gate signal to each of the plurality of gate lines GL disposed in the display area DA.

For example, when the gate driving panel circuit GPC is of the first type, the plurality of gate lines GL may include a plurality of scan signal lines SCL and a plurality of sensing signal lines SENL. As another example, when the gate driving panel circuit GPC is of the second type, the plurality of gate lines GL may include a plurality of scan signal lines SCL.

The plurality of clock signal lines CL may be disposed on the substrate SUB and may be disposed in the clock signal line area CLA positioned on one side of the gate driving panel circuit area GPCA in the non-display area NDA. Each of the plurality of clock signal lines CL may supply a corresponding clock signal to the gate driving panel circuit GPC.

For example, the clock signal line area CLA may be disposed to be farther from the display area DA than the gate driving panel circuit area GPCA.

For example, when the gate driving panel circuit GPC is of the first type, the plurality of clock signal lines CL may include a plurality of carry clock signal lines CL_CRCLK, a plurality of scan clock signal lines CL_SCCLK, and a plurality of sensing clock signal lines CL_SECLK. As another example, when the gate driving panel circuit GPC is of the second type, the plurality of clock signal lines CL may include a plurality of scan clock signal lines CL_SCCLK and a plurality of carry clock signal lines CL_CRCLK.

The overcoat layer OC may be disposed on the plurality of clock signal lines CL.

The overcoat layer OC may be disposed on the gate driving panel circuit GPC.

The cathode electrode CAT may be disposed in the display area DA and may extend to the non-display area NDA.

The cathode electrode CAT may extend to the gate bezel area GBA in the non-display area NDA, and may extend to an upper portion of the whole or part of the gate driving panel circuit GPC. Accordingly, the cathode electrode CAT may overlap the whole or part of the gate driving panel circuit GPC.

The cathode electrode CAT may extend to the gate bezel area GBA in the non-display area NDA, and may extend to an upper portion of the whole or part of the plurality of clock signal lines CL. Accordingly, the cathode electrode CAT may overlap the whole or part of the plurality of clock signal lines CL.

The first power line area PLA1 may be disposed between the clock signal line area CLA and the gate driving panel circuit area GPCA, and the second power line area PLA2 may be disposed between the gate driving panel circuit area GPCA and the display area DA. However, in FIG. 18, the first power line area PLA1 and the second power line area PLA2 are omitted.

Referring to FIG. 18, the light emitting layer EL positioned under the cathode electrode CAT may be disposed in the display area DA and may extend to a partial point of the non-display area NDA. The light emitting layer EL may overlap a portion of the overcoat layer OC.

A subpixel unit SPU may be positioned under the light emitting layer EL. The subpixel unit SPU may include an anode electrode AND, transistors (e.g., DRT, SCT, or SENT), and a storage capacitor Cst.

Referring to FIG. 18, in the non-display area NDA, there may be a hole in the overcoat layer OC or a trench TRC corresponding to an area where the overcoat layer OC has been removed. For example, when there are a plurality of trenches TRC, one of the plurality of trenches TRC may not overlap the light emitting layer EL and another trench may overlap the light emitting layer EL. The light emitting layer EL may extend to the non-display area NDA and be interposed inside the trench TRC of the overcoat layer OC.

Referring to FIG. 18, the display panel 110 according to aspects of the disclosure may include a capping layer CPL on the cathode electrode CAT and an encapsulation layer ENCAP on the capping layer CPL.

The encapsulation layer ENCAP may include a first encapsulation layer ENCAP1 and a second encapsulation layer ENCAP2. For example, the first encapsulation layer ENCAP1 may include an adhesive and/or a desiccant having an encapsulation function. The first encapsulation layer ENCAP1 may include an organic material. The second encapsulation layer ENCAP2 may include a metal or an inorganic material. The second encapsulation layer ENCAP2 may be disposed to cover the cathode electrode CAT, the capping layer CPL, and the first encapsulation layer ENCAP1.

The encapsulation layer ENCAP may overlap the plurality of clock signal lines CL and the gate driving panel circuit GPC.

When manufacturing the display panel 110, each of the light emitting layer EL, the cathode electrode CAT, and the capping layer CPL may have a slightly different size or edge position depending on a process error. For example, the cathode electrode CAT may overlap none of the plurality of clock signal lines CL disposed in the clock signal line area CLA. Depending on a process error, a portion of the cathode electrode CAT may overlap the whole or part of the plurality of clock signal lines CL disposed in the clock signal line area CLA.

Figure 19:
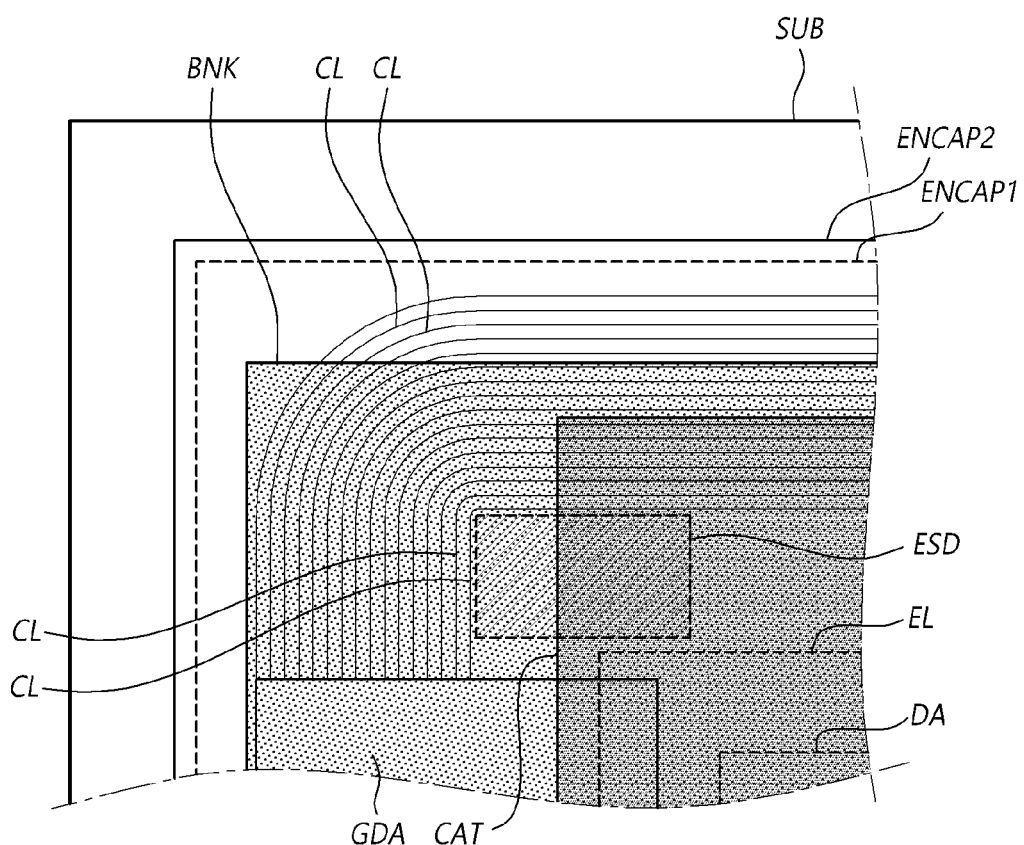
FIG. 19 is a plan view illustrating an outer corner area of a display panel according to aspects of the disclosure.

FIG. 19 is a plan view of an outer corner area of a substrate SUB of a display panel 110 according to aspects of the disclosure.

Referring to FIG. 19, the display panel 110 according to aspects of the disclosure may include a bank BNK extending from the display area DA to the non-display area NDA, a light emitting layer EL extending from the display area DA to the non-display area NDA, a cathode electrode CAT extending from the display area DA to the non-display area NDA and positioned on the light emitting layer EL, and an electrostatic discharge unit ESD disposed in an outer corner area of the non-display area NDA.

Referring to FIG. 19, a corner portion of the bank BNK, a corner portion of the cathode electrode CAT, a corner portion of the first encapsulation layer ENCAP1, and a corner portion of the second encapsulation layer ENCAP2 may be present in an outer corner area of the substrate SUB of the display panel 110.

Referring to FIG. 19, in the outer corner area of the display panel 110, among the bank BNK, the cathode electrode CAT, the first encapsulation layer ENCAP1, and the second encapsulation layer ENCAP2, the bank BNK may extend further outward from the display area DA than the cathode electrode CAT, and the first encapsulation layer ENCAP1 and the second encapsulation layer ENCAP2 may extend further outward from the display area DA than the bank BNK. The second encapsulation layer ENCAP2 may extend to a position similar to that of the first encapsulation layer ENCAP1 or may extend further outward from the display area DA than the first encapsulation layer ENCAP1.

Referring to FIG. 19, a portion of the gate driving area GDA may be disposed in an outer corner area of the substrate SUB of the display panel 110.

Referring to FIG. 19, the gate driving area GDA may include a gate driving panel circuit area GPCA in which the gate driving panel circuit GPC is disposed. The gate driving area GDA may further include a clock signal line area CLA, a first power line area PLA1, and a second power line area PLA2.

Referring to FIG. 19, the gate driving area GDA may overlap the bank BNK, the first encapsulation layer ENCAP1, and the second encapsulation layer ENCAP2. The whole or part of the gate driving area GDA may overlap the cathode electrode CAT.

Referring to FIG. 19, an electrostatic discharge unit ESD may be disposed in an outer corner area of the substrate SUB of the display panel 110. For example, the electrostatic discharge unit ESD may include an electrostatic discharge circuit or an electrostatic discharge pattern.

The electrostatic discharge unit ESD may not be disposed only in the outer corner area of the substrate SUB, but may be disposed at various positions requiring an electrostatic discharge function.

Referring to FIG. 19, the electrostatic discharge unit ESD may overlap the bank BNK. The whole or part of the electrostatic discharge unit ESD may overlap the cathode electrode CAT. The electrostatic discharge unit ESD may overlap each of the first encapsulation layer ENCAP1 and the second encapsulation layer ENCAP2.

For example, the bank BNK may be disposed above the entire electrostatic discharge unit ESD. The cathode electrode CAT may be disposed above a portion of the electrostatic discharge unit ESD.

Referring to FIG. 19, a plurality of clock signal lines CL may be disposed along edges of outer corners of the substrate SUB.

Referring to FIG. 19, the plurality of clock signal lines CL may overlap the bank BNK, the first encapsulation layer ENCAP1, and the second encapsulation layer ENCAP2. All or some of the plurality of clock signal lines CL may partially overlap the cathode electrode CAT. All or some of the plurality of clock signal lines CL may not overlap the electrostatic discharge unit ESD.

Referring to FIG. 19, the light emitting layer EL may be disposed to extend from the display area DA to the non-display area NDA. For example, the light emitting layer EL may be one of components for configuring one of an organic light emitting diode (OLED), a quantum dot organic light emitting diode (QD-OLED), and a light emitting diode (LED) chip.

Referring to FIG. 19, a portion of the gate driving area GDA may overlap the light emitting layer EL. The electrostatic discharge unit ESD may not overlap the light emitting layer EL. In some cases, the electrostatic discharge unit ESD may overlap the whole or part of the light emitting layer EL.

Figure 20:
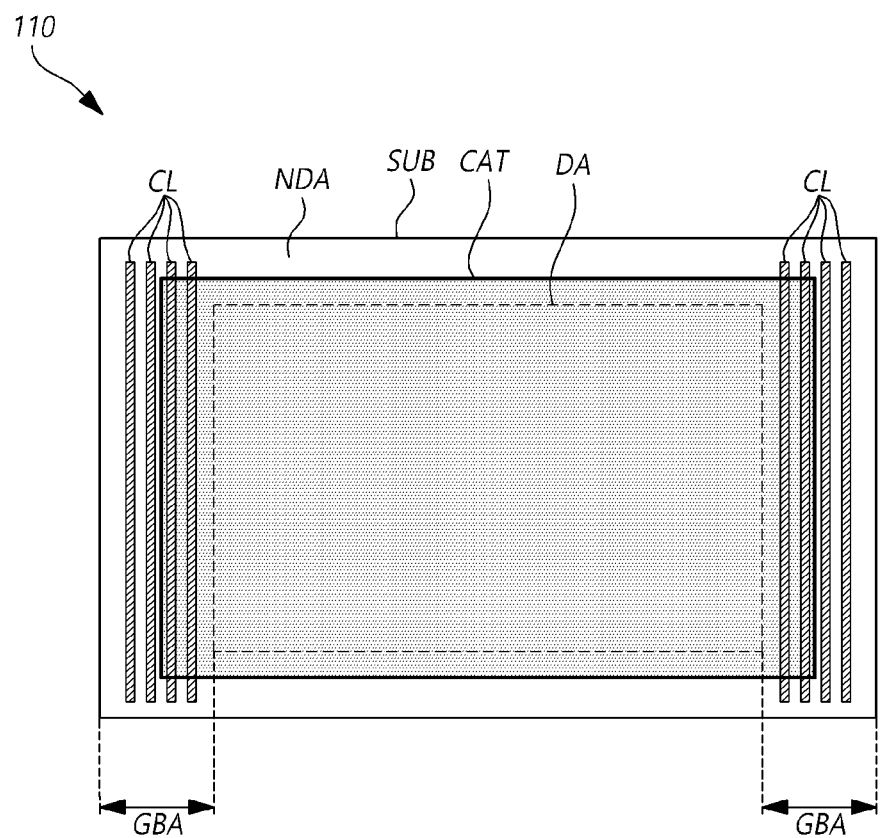
FIG. 20 is a plan view illustrating a plurality of clock signal lines and a cathode electrode included in a display panel according to aspects of the disclosure.

FIG. 20 is a plan view illustrating a plurality of clock signal lines CL and a cathode electrode CAT included in a display panel 110 according to aspects of the disclosure.

Referring to FIG. 20, a plurality of clock signal lines CL may be disposed in the non-display area NDA of the display panel 110. The cathode electrode CAT may be disposed in the display area DA and may extend from the display area DA to a portion of the non-display area NDA.

Referring to FIG. 20, a portion of the cathode electrode CAT, extending to the portion of the non-display area NDA, may overlap all or some of the plurality of clock signal lines CL. This may also be identified from the cross-sectional view of FIG. 18.

The gate bezel area GBA included in the non-display area NDA of the display panel 110 may include a clock signal line area CLA where a plurality of clock signal lines CL are disposed. The cathode electrode CAT may extend from the display area DA to the clock signal line area CLA included in the gate bezel area GBA of the non-display area NDA.

Figure 21:
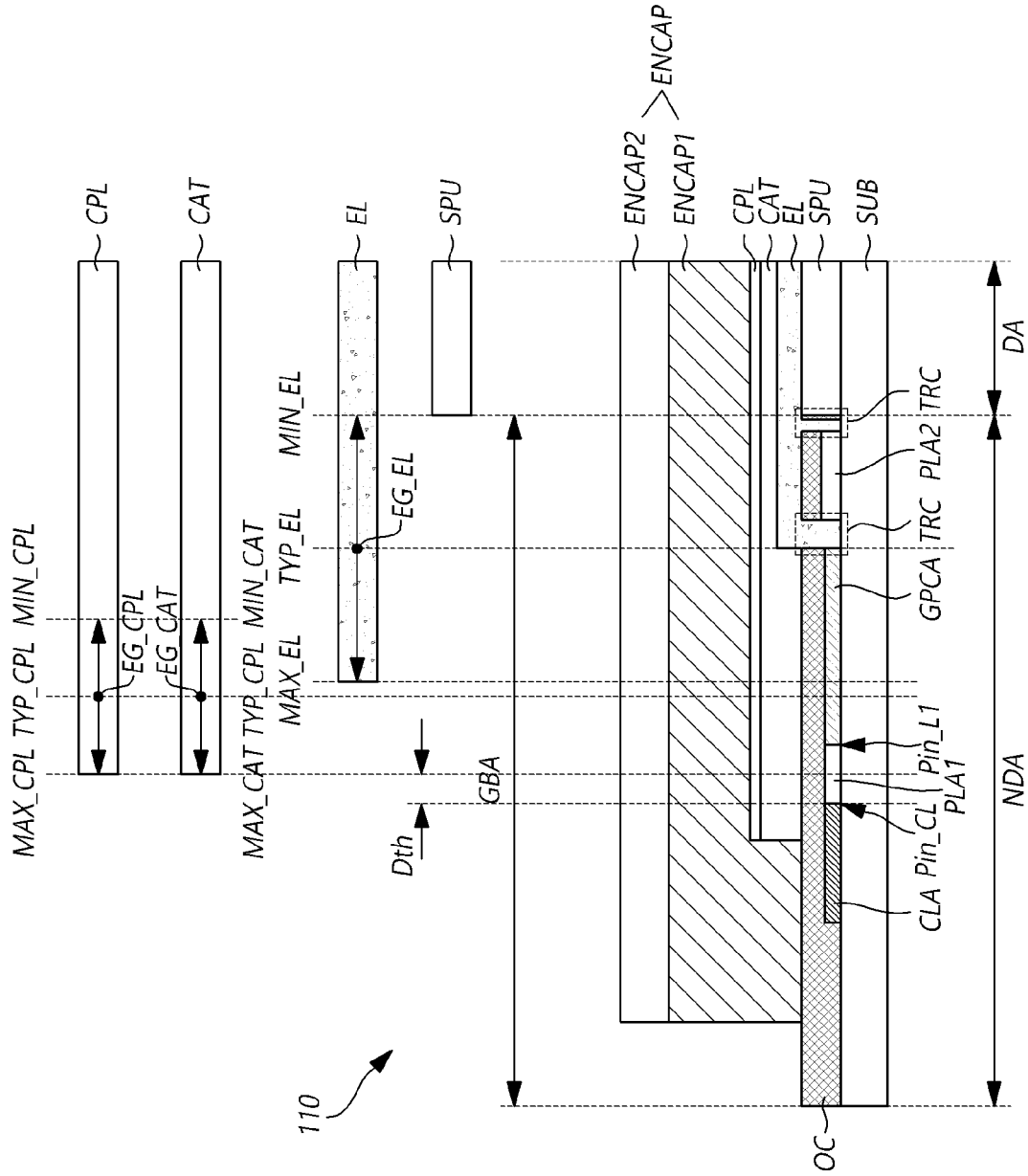
FIG. 21 is another cross-sectional view illustrating a partial area of a display panel according to aspects of the disclosure.

Referring to FIG. 21, when at least one clock signal line CL among the plurality of clock signal lines CL overlaps the cathode electrode CAT, an unwanted capacitor may be formed between the at least one clock signal line CL and the cathode electrode CAT that vertically overlaps each other.

Each of the plurality of clock signal lines CL may have a load Load. The load of each of the plurality of clock signal lines CL may correspond to a value obtained by multiplying the resistance and capacitance of each of the plurality of clock signal lines CL.

Some of the plurality of clock signal lines CL may overlap the cathode electrode CAT, and the others may not overlap the cathode electrode CAT. Accordingly, capacitance deviation may occur between the plurality of clock signal lines CL. Thus, load deviation may occur between the plurality of clock signal lines CL. An image abnormality may occur in a specific line of the screen due to the load deviation between the plurality of clock signal lines CL.

Further, due to process deviation between display panels 110, the degree to which the plurality of clock signal lines CL and the cathode electrode CAT overlap may differ for each display panel 110. As a result, an image abnormality due to load deviation between the plurality of clock signal lines CL may occur in only some of the display panels 110 of the same model.

Accordingly, the display panel 110 and the display device 100 according to aspects of the disclosure may have a load deviation removal structure that may remove the load deviation between the plurality of clock signal lines CL. Thus, the display panel 110 and the display device 100 according to aspects of the disclosure may prevent an image abnormality due to load deviation between the plurality of clock signal lines CL by removing load deviation between the plurality of clock signals lines CL regardless of whether process deviation occurs or the degree of occurrence.

Hereinafter, a structure for removing load deviation of the display panel 110 and the display device 100 according to aspects of the disclosure is described.

FIG. 21 is another cross-sectional view illustrating a partial area of a display panel 110 according to aspects of the disclosure.

Referring to FIG. 21, the display panel 110 according to aspects of the disclosure may include a substrate SUB, a gate driving panel circuit GPC, a plurality of clock signal lines CL, an overcoat layer OC, and a cathode electrode CAT.

The substrate SUB may include a display area DA capable of displaying an image and a non-display area NDA that is disposed around the display area DA.

The gate driving panel circuit GPC may be configured to output a gate signal to each of the plurality of gate lines GL.

For example, the plurality of gate lines GL may include a plurality of scan signal lines SCL, and the gate signal output to each of the plurality of gate lines GL may be a scan signal SC. As another example, the plurality of gate lines GL may include at least one scan signal line SCL and at least one sensing signal line SENL, and the gate signal output to each of the plurality of gate lines GL may be a scan signal SC or a sensing signal SE.

The gate driving panel circuit GPC may be disposed on the substrate SUB and may be positioned in the gate driving panel circuit area GPCA included in the gate bezel area GBA in the non-display area NDA.

The plurality of clock signal lines CL may be signal lines for supplying a plurality of clock signals to the gate driving panel circuit GPC.

The plurality of clock signal lines CL may be signal lines that are disposed on the substrate SUB and are disposed in the clock signal line area CLA included in the gate bezel area GBA in the non-display area NDA. Here, the clock signal line area CLA may be an area positioned to be farther from the display area DA than the gate driving panel circuit area GPCA.

The plurality of clock signal lines CL may be positioned to be farther from the display area DA than the gate driving panel circuit GPC in the non-display area NDA.

The overcoat layer OC may be disposed on the plurality of clock signal lines CL and the gate driving panel circuit GPC, and may be a type of insulation layer and protection layer.

The cathode electrode CAT may be disposed on the overcoat layer OC and may extend from the display area DA to the non-display area NDA.

Referring to FIG. 21, the portion of the cathode electrode CAT, extending to the non-display area NDA, may not overlap the plurality of clock signal lines CL, although it is shown that the cathode electrode extends to and overlaps the clock signal line area CLA.

Referring to FIG. 21, the portion of the cathode electrode CAT, extending to the non-display area NDA, may overlap the whole or part of the gate driving panel circuit GPC. In other words, the portion of the cathode electrode CAT, extending to the non-display area NDA, may overlap at least a portion of the gate driving panel circuit GPC.

Referring to FIG. 21, the display panel 110 according to aspects of the disclosure may further include a capping layer CPL disposed on the cathode electrode CAT and not overlapping the plurality of clock signal lines CL, although it is shown that the capping layer CPL overlaps the clock signal line area CLA.

Referring to FIG. 21, the display panel 110 according to aspects of the disclosure may further include an encapsulation layer ENCAP disposed while covering the cathode electrode CAT.

The encapsulation layer ENCAP may include a first encapsulation layer ENCAP1 disposed while covering the cathode electrode CAT and a second encapsulation layer ENCAP2 disposed on the first encapsulation layer ENCAP1.

For example, the first encapsulation layer ENCAP1 may include an adhesive and/or a desiccant having an encapsulation function. The first encapsulation layer ENCAP1 may include an organic material.

For example, the second encapsulation layer ENCAP2 may include a metal or an inorganic material.

The encapsulation layer ENCAP may overlap the plurality of clock signal lines CL and the gate driving panel circuit GPC.

Referring to FIG. 21, the gate bezel area GBA may include a first power line area PLA1 and a second power line area PLA2 separated by the gate driving panel circuit area GPCA.

For example, at least one gate high-potential voltage line HVL may be disposed in the first power line area PLA1. At least one gate low-potential voltage line LVL may be disposed in the second power line area PLA2.

For example, the first power line area PLA1 may be positioned to be farther from the display area than the gate driving panel circuit area GPCA, and the second power line area PLA2 may be positioned to be closer to the display area DA than the gate driving panel circuit area GPCA. In other words, the first power line area PLA1 may be positioned further away from the display area DA than the second power line area PLA2.

Referring to FIG. 21, the first power line area PLA1 may be positioned between the clock signal line area CLA and the gate driving panel circuit area GPCA. In other words, at least one gate high-potential voltage line HVL may be disposed between the plurality of clock signal lines CL and the gate driving panel circuit GPC.

At least one gate high-potential voltage line HVL may be a line for supplying at least one gate high-potential voltage to the gate driving panel circuit GPC.

At least one gate low-potential voltage line LVL may be a line for supplying at least one gate low-potential voltage to the gate driving panel circuit GPC.

The gate driving panel circuit GPC may be disposed between at least one gate high-potential voltage line HVL and at least one gate low-potential voltage line LVL. Accordingly, at least one gate high-potential voltage line HVL and at least one gate low-potential voltage line LVL may be separated by the gate driving panel circuit GPC.

Referring to FIG. 21, the at least one gate high-potential voltage line HVL disposed in the first power line area PLA1 may be positioned farther from the display area DA than the at least one gate low-potential voltage line LVL disposed in the second power line area PLA2.

Referring to FIG. 21, at least one gate low-potential voltage line LVL disposed in the second power line area PLA2 may overlap the cathode electrode CAT.

Referring to FIG. 21, according to a process deviation for forming the cathode electrode CAT, when the edge position EG_CAT of the cathode electrode CAT is positioned to be closer to the display area DA than the innermost point Pin_L1 of the first power line area PLA1, the at least one gate high-potential voltage line HVL may not overlap the cathode electrode CAT.

According to a process deviation for forming the cathode electrode CAT, when the edge position EG_CAT of the cathode electrode CAT is positioned to be farther from the display area DA than the innermost point Pin_L1 of the first power line area PLA1, the at least one gate high-potential voltage line HVL may overlap the cathode electrode CAT.

Referring to FIG. 21, in the non-display area NDA, at least one trench TRC may be formed in the overcoat layer OC.

For example, the at least one trench TRC may be positioned in at least one of a space between the gate driving panel circuit GPC and the at least one gate low-potential voltage line LVL and a space between the at least one gate low-potential voltage line LVL and the display area DA. In other words, the at least one trench TRC may be positioned between the gate driving panel circuit area GPCA and the second power line area PLA2 and between the second power line area PLA2 and the display area DA.

Referring to FIG. 21, the display panel 110 according to aspects of the disclosure may further include a light emitting layer EL disposed in the display area DA and having a portion extending to the non-display area NDA.

The portion of the light emitting layer EL extending to the non-display area NDA may overlap the gate driving panel circuit GPC or overlap a gate low-potential voltage line LVL supplying a gate low-potential voltage to the gate driving panel circuit GPC.

In contrast, the portion of the light emitting layer EL extending to the non-display area NDA may not overlap a gate high-potential voltage line HVL supplying a gate high-potential voltage to the gate driving panel circuit GPC.

Referring to FIG. 21, a portion of the light emitting layer EL extending to the non-display area NDA is not electrically connected to the gate driving panel circuit GPC or the gate low-potential voltage line LVL. Accordingly, an abnormal light emission phenomenon in the non-display area NDA may be prevented.

Referring to FIG. 21, the portion of the light emitting layer EL extending to the non-display area NDA may overlap at least one trench TRC formed in the overcoat layer OC.

As described above, in the first power line area PLA1, a plurality of gate high-potential voltage lines HVL1, HVL2, and HVL3 for supplying the plurality of gate high-potential voltages GVDD, GVDD_o, and GVDD2 to the gate driving panel circuit GPC may be disposed.

In the second power line area PLA2, a plurality of gate low-potential voltage lines LVL1, LVL2, and LVL3 for supplying the plurality of gate low-potential voltages GVSS0, GVSS1, and GVSS2 to the gate driving panel circuit GPC may be disposed.

The plurality of gate high-potential voltages GVDD, GVDD_o, and GVDD2 may be supplied to different positions in the gate driving panel circuit GPC.

The plurality of gate low-potential voltages GVSS0, GVSS1, and GVSS2 may be supplied to different positions in the gate driving panel circuit GPC.

As described above, some (e.g., the third gate high-potential voltage line HVL3 for supplying the third gate high-potential voltage GVDD2) of the plurality of gate high-potential voltage lines HVL1, HVL2, and HVL3 may be single-layer lines, and the others may be multi-layer lines. The plurality of gate low-potential voltage lines LVL1, LVL2, and LVL3 may be multi-layer lines.

At least some of the plurality of clock signal lines CL may be multi-layer lines.

The plurality of clock signal lines CL are important signal lines for supplying a plurality of clock signals, which are very important for gate driving, to the gate driving panel circuit GPC. Accordingly, to reduce signal transmission delay and prevent transmission signal distortion, the plurality of clock signal lines CL may be multi-layer lines.

Meanwhile, to reduce the signal transmission characteristic deviation, only some of the plurality of clock signal lines CL may be multi-layer lines.

As described above with reference to FIG. 13A, at least some of the plurality of clock signal lines CL may include a first metal clock signal line MCL1 and a second metal clock signal line MCL2.

The first metal clock signal line MCL1 and the second metal clock signal line MCL2 may be positioned on different layers, and may be electrically connected to each other through a contact hole of the insulation layer INS.

The first metal clock signal line MCL1 may be disposed in the same layer as the first metal layer under the driving transistor DRT in the display area DA. The first metal layer may be used as a light shield for preventing light transmission to the active layer of the driving transistor DRT. The second metal clock signal line MCL2 may be disposed in the same layer as the gate electrode of the driving transistor DRT in the display area DA or the second metal layer forming the gate line GL electrically connected thereto.

When manufacturing the display panel 110, each of the light emitting layer EL, the cathode electrode CAT, and the capping layer CPL may have a size corresponding to the design and may be precisely formed at a position corresponding to the design.

If a process error occurs when the display panel 110 is manufactured, at least one of the light emitting layer EL, the cathode electrode CAT, and the capping layer CPL may be formed in a size different from the size corresponding to the design, or may be formed at a position different from the position corresponding to the design.

Referring to FIG. 21, the edge position EG_EL of the light emitting layer EL may be present between the maximum edge position MAX_EL and the minimum edge position MIN_EL.

As the edge position EG_EL of the light emitting layer EL, the maximum edge position MAX_EL may be positioned further away from the display area DA than the general normal position TYP_EL corresponding to the design. The maximum edge position MAX_EL as the edge position EG_EL of the light emitting layer EL may be the edge position EG_EL of the light emitting layer EL when the light emitting layer EL is disposed to maximally extend toward the outer periphery of the display panel.

As the edge position EG_EL of the light emitting layer EL, the minimum edge position MIN_EL may be positioned further close to the display area DA than the general normal position TYP_EL corresponding to the design. The minimum edge position MIN_EL as the edge position EG_EL of the light emitting layer EL may be the edge position EG_EL of the light emitting layer EL when the light emitting layer EL is disposed to minimally extend toward the outer periphery of the display panel.

Referring to FIG. 21, the edge position EG_CAT of the cathode electrode CAT may be present between the maximum edge position MAX_CAT and the minimum edge position MIN_CAT.

The maximum edge position MAX_CAT as the edge position EG_CAT of the cathode electrode CAT may be positioned further away from the display area DA than the general normal position TYP_CAT corresponding to the design. The maximum edge position MAX_CAT as the edge position EG_CAT of the cathode electrode CAT may be the edge position EG_CAT of the cathode electrode CAT when the cathode electrode CAT is disposed to maximally extend toward the outer periphery of the display panel.

As the edge position EG_CAT of the cathode electrode CAT, the minimum edge position MIN_CAT may be positioned further close to the display area DA than the general normal position TYP_CAT corresponding to the design. The minimum edge position MIN_CAT as the edge position EG_CAT of the cathode electrode CAT may be the edge position EG_CAT of the cathode electrode CAT when the cathode electrode CAT is disposed to minimally extend toward the outer periphery of the display panel.

Referring to FIG. 21, the general normal position TYP_CAT corresponding to the design of the cathode electrode CAT may be positioned further away from the display area DA than the general normal position TYP_EL corresponding to the design of the light emitting layer EL.

Referring to FIG. 21, the maximum edge position MAX_CAT of the cathode electrode CAT may be positioned further away from the display area DA than the maximum edge position MAX_EL of the light emitting layer EL.

Referring to FIG. 21, the edge position EG_CPL of the capping layer CPL may be present between the maximum edge position MAX_CPL and the minimum edge position MIN_CPL.

As the edge position EG_CPL of the capping layer CPL, the maximum edge position MAX_CPL may be positioned further away from the display area DA than the general normal position TYP_CPL corresponding to the design. The maximum edge position MAX_CPL as the edge position EG_CPL of the capping layer CPL may be the edge position EG_CPL of the capping layer CPL when the capping layer CPL is disposed to maximally extend toward the outer periphery of the display panel.

As the edge position EG_CPL of the capping layer CPL, the minimum edge position MIN_CPL may be positioned further close to the display area DA than the general normal position TYP_CPL corresponding to the design. The minimum edge position MIN_CPL as the edge position EG_CPL of the capping layer CPL may be the edge position EG_CPL of the capping layer CPL when the capping layer CPL is disposed to minimally extend toward the outer periphery of the display panel.

Referring to FIG. 21, the edge position EG_CPL of the capping layer CPL may correspond to the edge position EG_CAT of the cathode electrode CAT.

Referring to FIG. 21, according to process deviation, even if the plurality of clock signal lines CL are formed maximally close to the display area DA as compared with the desired position and the cathode electrode CAT is maximally formed larger than the desired size, the innermost point Pin_CL of the plurality of clock signal lines CL may be further positioned away from the display area DA than the maximum edge position MAX_CAT of the cathode electrode CAT. To that end, the distance Dth between the innermost point Pin_CL of the plurality of clock signal lines CL and the maximum edge position MAX_CAT of the cathode electrode CAT should be designed to be greater than zero 0.

Accordingly, none of the plurality of clock signal lines CL may overlap the cathode electrode CAT. Image abnormality due to load deviation between a plurality of clock signal lines CL may be prevented.

Figure 22:
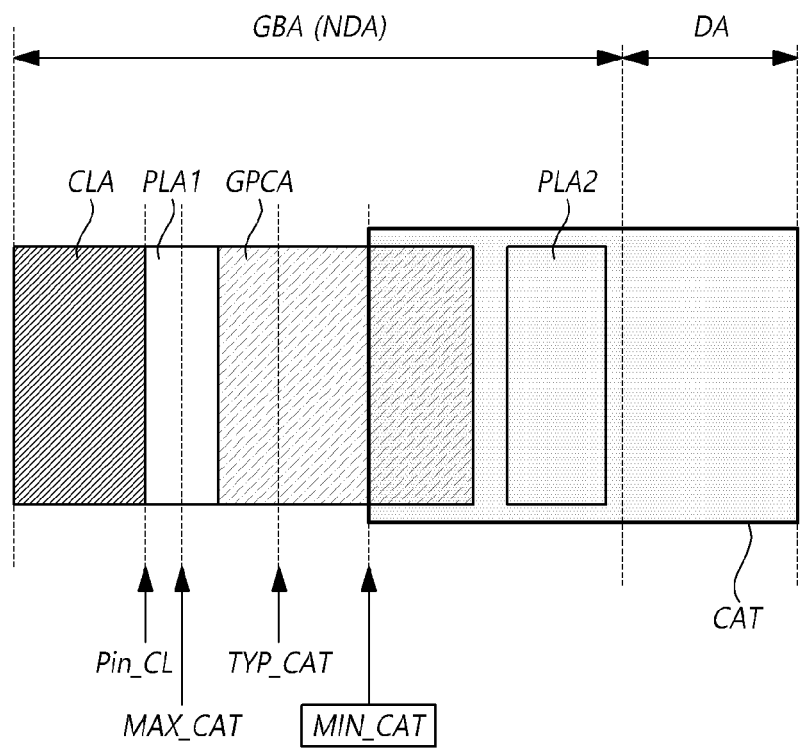
FIGS. 22, 23, and 24 are plan views illustrating a partial area of a display panel according to aspects of the disclosure.
Figure 23:
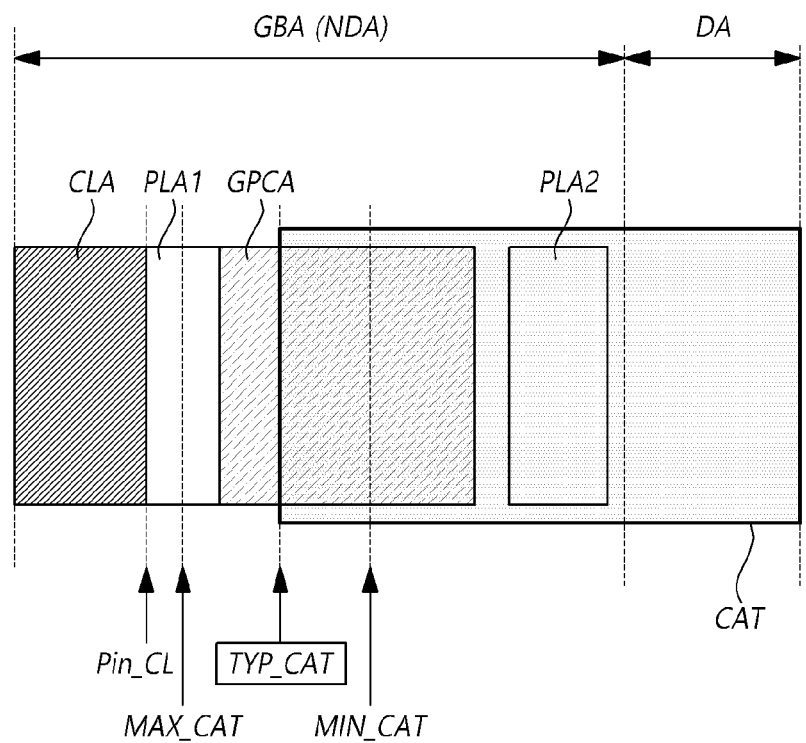
Figure 24:
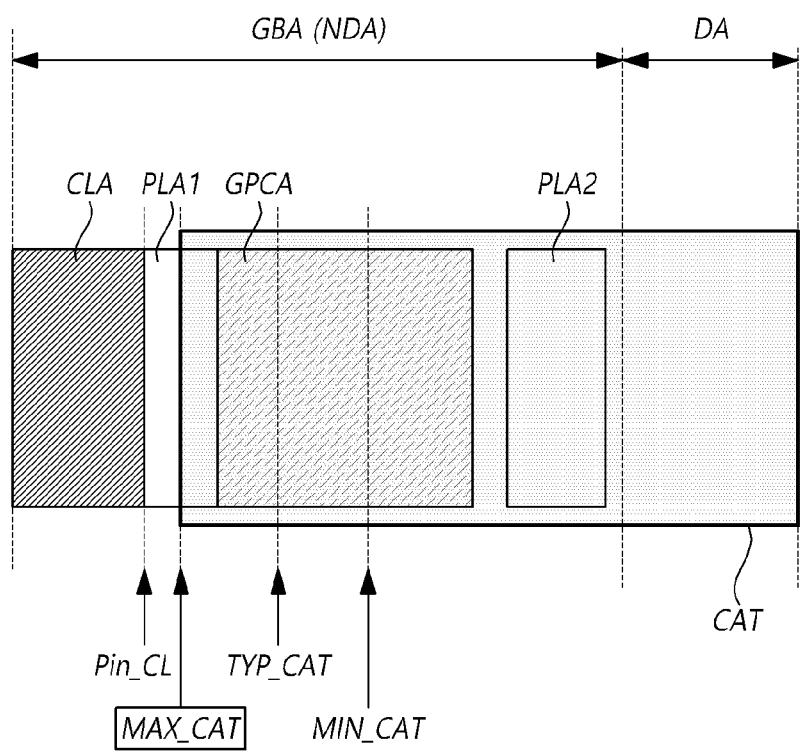

FIGS. 22, 23, and 24 are plan views illustrating a partial area of a display panel 110 according to aspects of the disclosure.

Referring to FIG. 22, according to process deviation, the cathode electrode CAT may be formed to be smaller than a desired size. When the cathode electrode CAT is formed to have the minimum size that may occur due to the process deviation, the edge position EG_CAT of the cathode electrode CAT may be the minimum edge position MIN_CAT further close to the display area DA than the normal position TYP_CAT.

In this case, the cathode electrode CAT may overlap the second power line area PLA2 and may overlap the gate driving panel circuit area GPCA. However, the cathode electrode CAT does not overlap the first power line area PLA1 and the clock signal line area CLA.

Referring to FIG. 23, the cathode electrode CAT may be accurately formed by the desired size. In this case, the edge position EG_CAT of the cathode electrode CAT may be the normal position TYP_CAT.

In this case, the cathode electrode CAT may overlap the second power line area PLA2 and may overlap the gate driving panel circuit area GPCA. However, the cathode electrode CAT does not overlap the first power line area PLA1 and the clock signal line area CLA.

Referring to FIG. 24, according to process deviation, the cathode electrode CAT may be formed to be larger than a desired size. When the cathode electrode CAT is formed to have the maximum size that may occur due to the process deviation, the edge position EG_CAT of the cathode electrode CAT may be the maximum edge position MAX_CAT further away from the display area DA than the normal position TYP_CAT.

In this case, the cathode electrode CAT may overlap the second power line area PLA2 and may overlap the gate driving panel circuit area GPCA.

The cathode electrode CAT may overlap the whole or part of the first power line area PLA1.

However, since the innermost point Pin_CL of the clock signal line area CLA is positioned further away from the display area DA than the maximum edge point MAX_CAT of the cathode electrode CAT that may occur due to process deviation, the cathode electrode CAT does not overlap the clock signal line area CLA.

Figure 25:
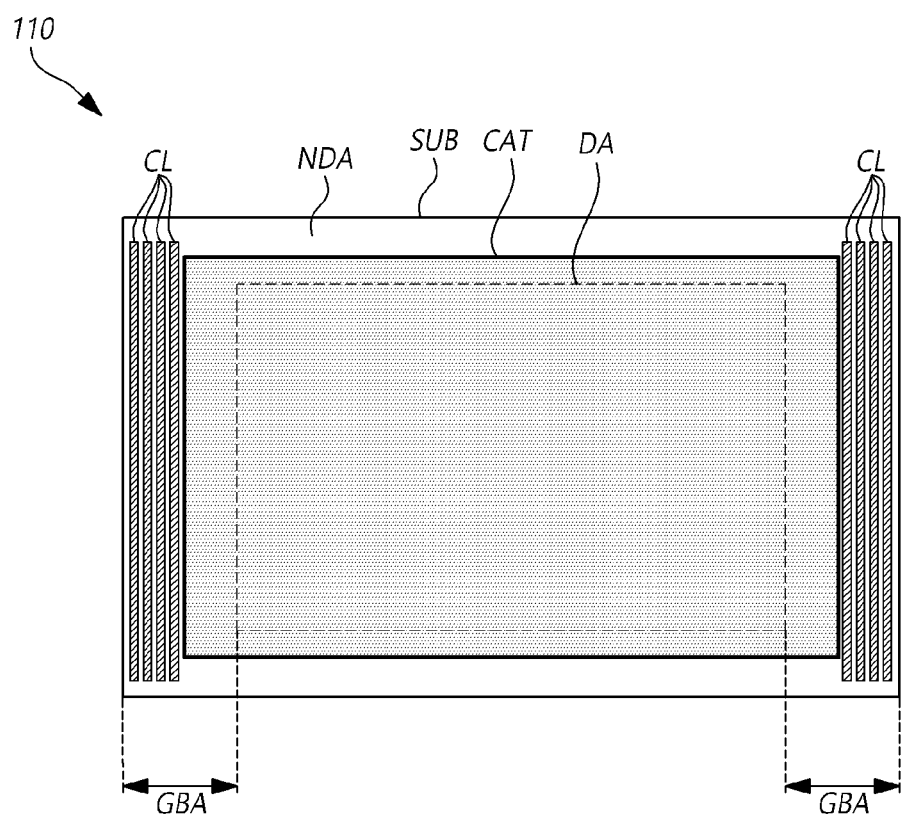
FIG. 25 is another plan view illustrating a plurality of clock signal lines and a cathode electrode included in a display panel according to aspects of the disclosure.

FIG. 25 is another plan view illustrating a plurality of clock signal lines CL and a cathode electrode CAT included in a display panel 110 according to aspects of the disclosure.

Referring to FIG. 25, according to aspects of the disclosure, the innermost point Pin_CL of the clock signal line area CLA may be positioned further away from the display area than the maximum edge point MAX_CAT of the cathode electrode CAT that may occur due to process deviation.

Referring to FIG. 25, the cathode electrode CAT may be disposed in the display area DA and may have a portion extending to a portion of the gate bezel area GBA of the non-display area NDA. Even if the cathode electrode CAT extends to the gate bezel area GBA of the non-display area NDA, the cathode electrode CAT does not overlap the plurality of clock signal lines CL positioned in the gate bezel area GBA.

The display panel 110 according to aspects of the disclosure described above is briefly described below.

The display panel 110 according to aspects of the disclosure may include a substrate SUB, a gate driving panel circuit GPC, a plurality of first signal lines, at least one second signal line, an overcoat layer OC, a cathode electrode CAT, and the like.

The substrate SUB may include a display area DA capable of displaying an image and a non-display area NDA disposed around the display area DA.

The gate driving panel circuit GPC may be disposed on the substrate SUB, may be positioned in the non-display area NDA, and may be configured to output a gate signal to the gate line GL.

The plurality of first signal lines may be disposed on the substrate SUB, may be positioned further away from the display area DA than the gate driving panel circuit GPC in the non-display area NDA, and may supply the plurality of first signals to the gate driving panel circuit GPC.

The at least one second signal line may be disposed on the substrate SUB, may be positioned further close to the display area DA than the gate driving panel circuit GPC in the non-display area NDA, and may supply a plurality of second signals to the gate driving panel circuit GPC.

For example, the plurality of first signal lines may include the plurality of clock signal lines CL. The at least one second signal line may include at least one gate low-potential voltage line LVL.

The overcoat layer OC may be positioned on the plurality of first signal lines, the gate driving panel circuit GPC, and the at least one second signal line.

The cathode electrode CAT may be disposed on the overcoat layer OC and may extend from the display area DA to the non-display area NDA.

The portion of the cathode electrode CAT, extending to the non-display area NDA, may overlap at least one second signal line positioned further close to the display area DA than the gate driving panel circuit GPC and may not overlap a plurality of first signal lines positioned further away from the display area DA than the gate driving panel circuit GPC.

The foregoing aspects are briefly described below.

A display device according to aspects of the disclosure comprises a substrate including a display area capable of displaying an image and a non-display area disposed around the display area, the display area including a subpixel and a gate line for driving the subpixel, a gate driving panel circuit disposed in the non-display area and configured to output a gate signal to the gate line, a plurality of clock signal lines disposed in the non-display area and positioned to be farther from the display area than the gate driving panel circuit to supply a plurality of clock signals to the gate driving panel circuit, an overcoat layer disposed on the plurality of clock signal lines and the gate driving panel circuit, and light emitting element included in the subpixel, comprising a cathode electrode disposed on the overcoat layer and extending from the display area to the non-display area.

In the display device according to aspects of the disclosure, the cathode electrode may be disposed not to overlap the plurality of clock signal lines.

In the display device according to aspects of the disclosure, a portion of the cathode electrode, extending to the non-display area, does not overlap the plurality of clock signal lines.

The display device according to aspects of the disclosure may further comprise an encapsulation layer disposed on the cathode electrode.

The encapsulation layer may overlap the plurality of clock signal lines and the gate driving panel circuit.

At least some of the plurality of clock signal lines each may have a multi-layer line structure.

At least some of the plurality of clock signal lines each may include a first metal clock signal line and a second metal clock signal line.

The first metal clock signal line and the second metal clock signal line may be positioned on different layers and electrically connected to each other through a contact hole of an insulation layer disposed on the substrate. The first metal clock signal line may be disposed in the same layer as a first metal layer under a driving transistor in the display area. The second metal clock signal line may be disposed in the same layer as a second metal layer of the driving transistor.

A portion of the cathode electrode extending from the display area to the non-display area may overlap at least a portion of the gate driving panel circuit.

The light emitting element may further comprise a light emitting layer disposed to overlap the cathode electrode and partially extending from the display area to the non-display area.

A portion of the light emitting layer extending to the non-display area may overlap the gate driving panel circuit or a gate low-potential voltage line disposed in the non-display area, and be disposed not to overlap a gate high-potential voltage line disposed in the non-display area.

In other words, a portion of the light emitting layer extending to the non-display area may overlap the gate driving panel circuit or overlap a gate low-potential voltage line supplying a gate low-potential voltage to the gate driving panel circuit. The portion of the light emitting layer extending to the non-display area may not overlap a gate high-potential voltage line supplying a gate high-potential voltage to the gate driving panel circuit.

The portion of the light emitting layer extending to the non-display area may be electrically insulated from the gate driving panel circuit or the gate low-potential voltage line. In other words, the portion of the light emitting layer extending to the non-display area may not be electrically connected to the gate driving panel circuit or the gate low-potential voltage line.

In the non-display area of the display device according to aspects of the disclosure, at least one trench may be formed in the overcoat layer. The portion of the light emitting layer extending to the non-display area may overlap at least one trench.

The display device according to aspects of the disclosure may further comprise a capping layer disposed on the cathode electrode and not overlapping the plurality of clock signal lines.

The display device according to aspects of the disclosure may further comprise at least one gate high-potential voltage line disposed in the non-display area for supplying at least one gate high-potential voltage to the gate driving panel circuit and at least one gate low-potential voltage line disposed in the non-display area for supplying at least one gate low-potential voltage to the gate driving panel circuit.

In the display device according to aspects of the disclosure, the gate driving panel circuit may be disposed between the at least one gate high-potential voltage line and the at least one gate low-potential voltage line.

In the display device according to aspects of the disclosure, the at least one gate high-potential voltage line may be positioned to be farther from the display area than the at least one gate low-potential voltage line.

By the arrangement structure of the gate high-potential voltage line and the gate low-potential voltage line, various circuit elements disposed on the display panel may be less affected by the gate high-potential voltage.

The at least one gate low-potential voltage line may overlap the cathode electrode.

The at least one gate high-potential voltage line may not overlap the cathode electrode. In other words, the at least one gate high-potential voltage line may be disposed not to overlap the cathode electrode. Or, the at least one gate high-potential voltage line may overlap the cathode electrode.

At least one trench may be formed in the overcoat layer in the non-display area. The at least one trench may be positioned in at least one of a space between the gate driving panel circuit and the at least one gate low-potential voltage line and a space between the at least one gate low-potential voltage line and the display area.

The display device according to aspects of the disclosure may comprise a plurality of gate high-potential voltage lines disposed in the non-display area for supplying a plurality of gate high-potential voltages to the gate driving panel circuit and a plurality of gate low-potential voltage lines disposed in the non-display area for supplying a plurality of gate low-potential voltages to the gate driving panel circuit.

The plurality of gate high-potential voltages may be supplied to different positions in the gate driving panel circuit, and the plurality of gate low-potential voltages may be supplied to different positions in the gate driving panel circuit.

Some of the plurality of gate high-potential voltage lines may be single-layer lines, and the others may be multi-layer lines, and the plurality of gate low-potential voltage lines may be multi-layer lines.

The display device according to aspects of the disclosure may further comprise a bank disposed on the overcoat layer and extending from the display area to the non-display area, and an electrostatic discharge unit disposed in an outer corner area of the non-display area.

In the display device according to aspects of the disclosure, the electrostatic discharge unit may not overlap the light emitting layer, a portion of the electrostatic discharge unit may overlap the cathode electrode, and the electrostatic discharge unit may overlap the bank. The electrostatic discharge unit may overlap the bank. The plurality of clock signal lines may be disposed along an outer corner edge of the substrate, and all or some of the plurality of clock signal lines may not overlap the electrostatic discharge unit. Some of the plurality of clock signal lines may overlap the electrostatic discharge unit, or the plurality of clock signal lines may be disposed not to be overlap the electrostatic discharge unit.

The plurality of clock signal lines may include a plurality of carry clock signal lines for transferring carry clock signals to the gate driving panel circuit, and a plurality of scan clock signal lines for transferring scan clock signals to the gate driving panel circuit.

The plurality of clock signal lines may further include a plurality of sensing clock signal lines for transferring sensing clock signals to the gate driving panel circuit.

The first metal clock signal line may be disposed in the same layer as a metal layer where a light shield is disposed, or one of two or more capacitor electrodes constituting a storage capacitor in the display area is disposed, or a source or drain electrode of the driving transistor is disposed, and the second metal clock signal line may be disposed in the same layer as a metal layer where another one of the two or more capacitor electrodes is disposed, or a gate electrode of the driving transistor is disposed.

At least one trench may be formed in the overcoat layer and the bank, and a light emitting layer of the light emitting element may extend to an upper portion of the bank via the at least one trench.

A display panel may comprise a substrate including a display area capable of displaying an image and a non-display area disposed around the display area, the display area including a subpixel and a gate line for driving the subpixel, a gate driving panel circuit positioned in the non-display area and configured to output a gate signal to a gate line, a plurality of first signal lines disposed in the non-display area and positioned to be farther from the display area than the gate driving panel circuit in the non-display area to supply a plurality of first signals to the gate driving panel circuit, at least one second signal line disposed in the non-display area and positioned to be closer to the display area than the gate driving panel circuit in the non-display area to supply a second signal to the gate driving panel circuit, an overcoat layer positioned on the plurality of first signal lines, the gate driving panel circuit, and the at least one second signal line, and a light emitting element disposed in the subpixel, comprising a cathode electrode disposed on the overcoat layer and extending from the display area to the non-display area.

In the display panel according to aspects of the disclosure, a portion of the cathode electrode, extending to the non-display area, may overlap the at least one second signal line and be disposed not to overlap the plurality of first signal lines. The portion of the cathode electrode, extending to the non-display area, does not overlap the plurality of first signal lines.

The plurality of first signal lines may include a plurality of clock signal lines for supplying a plurality of clock signals to the gate driving panel circuit.

The at least one second signal line may include a gate low-potential voltage line for supplying a plurality of gate low-potential voltages to the gate driving panel circuit.

According to aspects of the disclosure described above, there may be provided a display device in which a gate driving circuit is disposed in a display panel in a gate in panel (GIP) type.

According to aspects of the disclosure, there may be provided a display panel that does not cause a screen abnormality although a gate driving circuit is embedded therein and a display device including the display panel.

According to aspects of the disclosure, there may be provided a display panel capable of normal operation of a gate driving circuit although the gate driving circuit is embedded therein and a display device including the display panel.

According to aspects of the disclosure, there may be provided a display panel capable of reducing or removing load deviation between clock signal lines related to the gate driving operation and a display device including the display panel.

According to aspects of the disclosure, there may be provided a display panel having a line structure for stably supplying various signals or power to the gate driving circuit and a display device including the display panel.

According to aspects of the disclosure, it is possible to achieve process optimization for the display device by including a gate driving panel circuit disposed on the substrate of the display panel to be formed during the process of manufacturing the display panel.

The above-described aspects are merely examples, and it will be appreciated by one of ordinary skill in the art various changes may be made thereto without departing from the scope of the disclosure. Accordingly, the aspects set forth herein are provided for illustrative purposes, but not to limit the scope of the disclosure, and should be appreciated that the scope of the disclosure is not limited by the aspects. Thus, it is intended that the present disclosure covers the modifications and variations of the aspects provided they come within the scope of the appended claims and their equivalents.

What is claimed is:

1. A display device, comprising:
    a substrate including a display area displaying an image and a non-display area disposed around the display area, the display area including a subpixel and a gate line for driving the subpixel;
    a gate driving panel circuit disposed in the non-display area and configured to output a gate signal to the gate line;
    a plurality of clock signal lines disposed in the non-display area and positioned to be farther from the display area than the gate driving panel circuit to supply a plurality of clock signals to the gate driving panel circuit;
    an overcoat layer disposed on the plurality of clock signal lines and the gate driving panel circuit; and
    a light emitting element disposed in the subpixel and including a cathode electrode disposed on the overcoat layer and extending from the display area to the non-display area,
    wherein the cathode electrode does not overlap the plurality of clock signal lines,
    wherein the light emitting element further comprises a light emitting layer disposed to overlap the cathode electrode and partially extending from the display area to the non-display area, and
    wherein a portion of the light emitting layer extending to the non-display area overlaps the gate driving panel circuit or a gate low-potential voltage line disposed in the non-display area, and is disposed not to overlap a gate high-potential voltage line disposed in the non-display area.

2. The display device of claim 1, further comprising an encapsulation layer disposed on the cathode electrode,
    wherein the encapsulation layer overlaps the plurality of clock signal lines and the gate driving panel circuit.

3. The display device of claim 1, wherein at least some of the plurality of clock signal lines each have a multi-layer line structure.

4. The display device of claim 1, wherein at least some of the plurality of clock signal lines each include a first metal clock signal line and a second metal clock signal line, and
    wherein the first metal clock signal line and the second metal clock signal line are positioned on different layers and electrically connected to each other through a contact hole of an insulation layer disposed on the substrate,
    wherein the first metal clock signal line is disposed at a same layer as a first metal layer under a driving transistor in the display area, and
    wherein the second metal clock signal line is disposed at a same layer as a second metal layer of the driving transistor.

5. The display device of claim 4, wherein the first metal clock signal line is disposed in the same layer as a metal layer where a light shield is disposed, or one of two or more capacitor electrodes constituting a storage capacitor in the display area is disposed, or a source or drain electrode of the driving transistor is disposed; and
wherein the second metal clock signal line is disposed in the same layer as a metal layer where another one of the two or more capacitor electrodes is disposed, or a gate electrode of the driving transistor is disposed.

6. The display device of claim 1, wherein the cathode electrode extends to the non-display area to overlap at least a portion of the gate driving panel circuit.

7. The display device of claim 1, wherein the portion of the light emitting layer extending to the non-display area is electrically insulated from the gate driving panel circuit or the gate low-potential voltage line.

8. The display device of claim 1, wherein, in the non-display area, at least one trench is formed in the overcoat layer, and wherein the portion of the light emitting layer extending to the non-display area overlaps the at least one trench.

9. The display device of claim 1, further comprising:
at least one gate high-potential voltage line disposed in the non-display area; and
at least one gate low-potential voltage line disposed in the non-display area,
wherein the gate driving panel circuit is disposed between the at least one gate high-potential voltage line and the at least one gate low-potential voltage line.

10. The display device of claim 9, wherein the at least one gate high-potential voltage line is positioned to be farther from the display area than the at least one gate low-potential voltage line.

11. The display device of claim 10, wherein the at least one gate low-potential voltage line overlaps the cathode electrode.

12. The display device of claim 10, wherein the at least one gate high-potential voltage line is disposed not to overlap the cathode electrode.

13. The display device of claim 10, wherein the at least one gate high-potential voltage line overlaps the cathode electrode.

14. The display device of claim 9, wherein at least one trench is formed in the overcoat layer in the non-display area.

15. The display device of claim 14, wherein the at least one trench is positioned in at least one of a space between the gate driving panel circuit and the at least one gate low-potential voltage line and a space between the at least one gate low-potential voltage line and the display area.

16. The display device of claim 1, further comprising:
a plurality of gate high-potential voltage lines disposed in the non-display area for supplying a plurality of gate high-potential voltages to the gate driving panel circuit; and
a plurality of gate low-potential voltage lines disposed in the non-display area for supplying a plurality of gate low-potential voltages to the gate driving panel circuit,
wherein the plurality of gate high-potential voltages are supplied to different positions in the gate driving panel circuit, and
wherein the plurality of gate low-potential voltages are supplied to different positions in the gate driving panel circuit.

17. The display device of claim 16, wherein some of the plurality of gate high-potential voltage lines are single-layer lines, and the others are multi-layer lines, and the plurality of gate low-potential voltage lines are multi-layer lines.

18. The display device of claim 1, further comprising:
a bank disposed on the overcoat layer and extending from the display area to the non-display area; and
an electrostatic discharge unit disposed in an outer corner area of the non-display area,
wherein a portion of the electrostatic discharge unit overlaps the cathode electrode, and
wherein the electrostatic discharge unit overlaps the bank.

19. The display device of claim 18, wherein the plurality of clock signal lines are disposed along an outer corner edge of the substrate, and wherein some of the plurality of clock signal lines overlap the electrostatic discharge unit, or the plurality of clock signal lines are disposed not to overlap the electrostatic discharge unit.

20. The display device of claim 18, wherein at least one trench is formed in the overcoat layer and the bank, and a light emitting layer of the light emitting element extends to an upper portion of the bank via the at least one trench.

21. The display device of claim 1, wherein the plurality of clock signal lines includes a plurality of carry clock signal lines for transferring carry clock signals to the gate driving panel circuit, and a plurality of scan clock signal lines for transferring scan clock signals to the gate driving panel circuit.

22. The display device of claim 21, wherein the plurality of clock signal lines further includes a plurality of sensing clock signal lines for transferring sensing clock signals to the gate driving panel circuit.

23. The display device of claim 1, further comprising a capping layer disposed on the cathode electrode and not overlapping the plurality of clock signal lines.

24. A display panel, comprising:
a substrate including a display area displaying an image and a non-display area disposed around the display area, the display area including a subpixel and a gate line for driving the subpixel;
a gate driving panel circuit positioned in the non-display area and configured to output a gate signal to the gate line;
a plurality of first signal lines disposed in the non-display area and positioned to be farther from the display area than the gate driving panel circuit in the non-display area to supply a plurality of first signals to the gate driving panel circuit;
at least one second signal line disposed in the non-display area and positioned to be closer to the display area than the gate driving panel circuit in the non-display area to supply a second signal to the gate driving panel circuit;
an overcoat layer positioned on the plurality of first signal lines, the gate driving panel circuit, and the at least one second signal line;
at least one gate high-potential voltage line disposed in the non-display area;
at least one gate low-potential voltage line disposed in the non-display area, and
a light emitting element included in the subpixel, comprising a cathode electrode disposed on the overcoat layer and extending from the display area to the non-display area,
wherein a portion of the cathode electrode, extending to the non-display area, overlaps the at least one second signal line and is disposed not to overlap the plurality of first signal lines, wherein the gate driving panel circuit is disposed between the at least one gate high-potential voltage line and the at least one gate low-potential voltage line, wherein the at least one gate high-potential voltage line is positioned to be farther from the display area than the at least one gate low-potential voltage line, and wherein the at least one gate high-potential voltage line overlaps the cathode electrode.

25. The display panel of claim 24, wherein the plurality of first signal lines include a plurality of clock signal lines for supplying a plurality of clock signals to the gate driving panel circuit, and wherein the at least one second signal line includes a gate low-potential voltage line for supplying a plurality of gate low-potential voltages to the gate driving panel circuit.

* * * * *